(12) United States Patent
Lai et al.

(10) Patent No.: US 11,916,011 B2
(45) Date of Patent: Feb. 27, 2024

(54) 3D VIRTUAL GROUND MEMORY AND MANUFACTURING METHODS FOR SAME

(71) Applicant: MACRONIX INTERNATIONAL CO., LTD., Hsinchu (TW)

(72) Inventors: Erh-Kun Lai, Tarrytown, NY (US); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 251 days.

(21) Appl. No.: 17/230,114

(22) Filed: Apr. 14, 2021

(65) Prior Publication Data

US 2022/0336347 A1    Oct. 20, 2022

(51) Int. Cl.
| | |
|---|---|
| H01L 23/522 | (2006.01) |
| H10B 41/10 | (2023.01) |
| H10B 41/27 | (2023.01) |
| H10B 43/10 | (2023.01) |
| H10B 43/27 | (2023.01) |

(52) U.S. Cl.
CPC ......... *H01L 23/5226* (2013.01); *H10B 41/10* (2023.02); *H10B 41/27* (2023.02); *H10B 43/10* (2023.02); *H10B 43/27* (2023.02)

(58) Field of Classification Search
CPC ............ G11C 16/0491; G11C 16/0466; G11C 16/0483; H01L 23/5226; H10B 41/10; H10B 43/10; H10B 41/27; H10B 43/27
See application file for complete search history.

(56) References Cited

U.S. PATENT DOCUMENTS

| | | | |
|---|---|---|---|
| 4,219,829 | A | 8/1980 | Dorda et al. |
| 4,987,090 | A | 1/1991 | Hsu et al. |
| 5,586,073 | A | 12/1996 | Hiura et al. |
| 5,963,803 | A | 10/1999 | Dawson et al. |

(Continued)

FOREIGN PATENT DOCUMENTS

| | | |
|---|---|---|
| TW | 201807807 A | 3/2018 |
| TW | 201939717 A | 10/2019 |

OTHER PUBLICATIONS

Chen et al., "Eyeriss: An Energy-Efficient reconfigurable accelerator for deep convolutional neural networks," IEEE ISSCC, Jan. 31-Feb. 4, 2016, 3 pages.

(Continued)

*Primary Examiner* — Mary A Wilczewski
*Assistant Examiner* — Adin Hrnjic
(74) *Attorney, Agent, or Firm* — Andrew L. Dunlap; HAYNES BEFFEL & WOLFELD LLP

(57) ABSTRACT

Memory devices are implemented within a vertical memory structure, comprising a stack of alternating layers of insulator material and word line material, with a series of alternating conductive pillars and insulating pillars disposed through stack. Data storage structures are disposed on inside surfaces of the layers of word line material at cross-points of the insulating pillars and the layers of word line material. Semiconductor channel material is disposed between the insulating pillars and the data storage structures at cross-points of the insulating pillars with the layers of word line material. The semiconductor channel material extends around an outside surface of the insulating pillars, contacting the adjacent conductive pillars on both sides to provide source/drain terminals.

23 Claims, 47 Drawing Sheets

(56) References Cited

U.S. PATENT DOCUMENTS

| | | |
|---|---|---|
| 6,034,882 A | 3/2000 | Johnson et al. |
| 6,107,882 A | 8/2000 | Gabara et al. |
| 6,313,486 B1 | 11/2001 | Kencke et al. |
| 6,486,027 B1 | 11/2002 | Noble et al. |
| 6,593,624 B2 | 7/2003 | Walker |
| 6,829,598 B2 | 12/2004 | Milev |
| 6,906,940 B1 | 6/2005 | Lue |
| 6,960,499 B2 | 11/2005 | Nandakumar et al. |
| 7,081,377 B2 | 7/2006 | Cleeves |
| 7,129,538 B2 | 10/2006 | Lee et al. |
| 7,177,169 B2 | 2/2007 | Scheuerlein |
| 7,368,358 B2 | 5/2008 | Ouyang et al. |
| 7,646,041 B2 | 1/2010 | Chae et al. |
| 7,747,668 B2 | 6/2010 | Nomura et al. |
| 7,948,024 B2 | 5/2011 | Kim et al. |
| 8,154,128 B2 | 4/2012 | Lung |
| 8,203,187 B2 | 6/2012 | Lung et al. |
| 8,275,728 B2 | 9/2012 | Pino |
| 8,331,149 B2 | 12/2012 | Choi et al. |
| 8,432,719 B2 | 4/2013 | Lue |
| 8,564,045 B2 | 10/2013 | Liu |
| 8,589,320 B2 | 11/2013 | Breitwisch et al. |
| 8,630,114 B2 | 1/2014 | Lue |
| 8,860,124 B2 | 10/2014 | Lue et al. |
| 9,064,903 B2 | 6/2015 | Mitchell et al. |
| 9,111,617 B2 | 8/2015 | Shim et al. |
| 9,147,468 B1 | 9/2015 | Lue |
| 9,177,966 B1 | 11/2015 | Rabkin et al. |
| 9,379,129 B1 | 6/2016 | Lue et al. |
| 9,397,110 B2 | 7/2016 | Lue |
| 9,401,371 B1 | 7/2016 | Lee et al. |
| 9,430,735 B1 | 8/2016 | Vali et al. |
| 9,431,099 B2 | 8/2016 | Lee et al. |
| 9,520,485 B2 | 12/2016 | Lue |
| 9,524,980 B2 | 12/2016 | Lue |
| 9,536,969 B2 | 1/2017 | Yang et al. |
| 9,589,982 B1 | 3/2017 | Cheng et al. |
| 9,698,156 B2 | 7/2017 | Lue |
| 9,698,185 B2 | 7/2017 | Chen et al. |
| 9,710,747 B2 | 7/2017 | Kang et al. |
| 9,754,953 B2 | 9/2017 | Tang et al. |
| 10,043,819 B1 | 8/2018 | Lai et al. |
| 10,211,218 B2 | 2/2019 | Lue |
| 10,242,737 B1 | 3/2019 | Lin et al. |
| 10,381,376 B1 | 8/2019 | Nishikawa et al. |
| 10,403,637 B2 | 9/2019 | Lue |
| 10,777,566 B2 | 9/2020 | Lue |
| 10,790,023 B2 | 9/2020 | Harari |
| 10,910,393 B2 | 2/2021 | Lai et al. |
| 11,069,704 B2 | 7/2021 | Lai et al. |
| 2001/0055838 A1 | 12/2001 | Walker et al. |
| 2002/0028541 A1 | 3/2002 | Lee et al. |
| 2003/0122181 A1 | 7/2003 | Wu |
| 2005/0280061 A1 | 12/2005 | Lee |
| 2005/0287793 A1 | 12/2005 | Blanchet et al. |
| 2007/0158736 A1 | 7/2007 | Arai et al. |
| 2008/0101109 A1 | 5/2008 | Haring-Bolivar et al. |
| 2009/0097321 A1 | 4/2009 | Kim et al. |
| 2009/0184360 A1 | 7/2009 | Jin et al. |
| 2010/0182828 A1 | 7/2010 | Shima et al. |
| 2010/0202208 A1 | 8/2010 | Endo et al. |
| 2010/0270593 A1 | 10/2010 | Lung et al. |
| 2011/0018051 A1 | 1/2011 | Kim et al. |
| 2011/0063915 A1 | 3/2011 | Tanaka et al. |
| 2011/0106742 A1 | 5/2011 | Pino |
| 2011/0140070 A1 | 6/2011 | Kim |
| 2011/0286258 A1 | 11/2011 | Chen et al. |
| 2011/0297912 A1 | 12/2011 | Samachisa et al. |
| 2012/0044742 A1 | 2/2012 | Narayanan |
| 2012/0112264 A1 | 5/2012 | Lee et al. |
| 2012/0235111 A1 | 9/2012 | Osano et al. |
| 2013/0075684 A1 | 3/2013 | Kinoshita et al. |
| 2013/0119455 A1 | 5/2013 | Chen et al. |
| 2014/0063949 A1 | 3/2014 | Tokiwa |
| 2014/0119127 A1 | 5/2014 | Lung et al. |
| 2014/0149773 A1 | 5/2014 | Huang et al. |
| 2014/0268996 A1 | 9/2014 | Park |
| 2015/0008500 A1 | 1/2015 | Fukumoto et al. |
| 2015/0179661 A1 | 6/2015 | Huo et al. |
| 2015/0340369 A1 | 11/2015 | Lue |
| 2016/0043100 A1 | 2/2016 | Lee et al. |
| 2016/0141299 A1 | 5/2016 | Hong |
| 2016/0141337 A1 | 5/2016 | Shimabukuro et al. |
| 2016/0181315 A1 | 6/2016 | Lee et al. |
| 2016/0247579 A1 | 8/2016 | Ueda et al. |
| 2016/0308114 A1 | 10/2016 | Kim et al. |
| 2016/0329341 A1 | 11/2016 | Shimabukuro et al. |
| 2016/0336064 A1 | 11/2016 | Seo et al. |
| 2016/0358661 A1 | 12/2016 | Vali et al. |
| 2017/0084748 A1 | 3/2017 | Yang |
| 2017/0092370 A1 | 3/2017 | Harari |
| 2017/0148517 A1 | 5/2017 | Harari |
| 2017/0169887 A1 | 6/2017 | Widjaja |
| 2017/0243879 A1 | 8/2017 | Yu et al. |
| 2017/0270405 A1 | 9/2017 | Kurokawa |
| 2017/0287928 A1 | 10/2017 | Kanamori et al. |
| 2017/0309634 A1 | 10/2017 | Noguchi et al. |
| 2017/0316833 A1 | 11/2017 | Ihm et al. |
| 2017/0317096 A1 | 11/2017 | Shin et al. |
| 2018/0121790 A1 | 5/2018 | Kim et al. |
| 2018/0182776 A1 | 6/2018 | Kim |
| 2018/0286918 A1* | 10/2018 | Bandyopadhyay .... H10B 61/22 |
| 2018/0350823 A1 | 12/2018 | Or-Bach et al. |
| 2019/0148393 A1 | 5/2019 | Lue |
| 2019/0220249 A1 | 7/2019 | Lee et al. |
| 2019/0244662 A1 | 8/2019 | Lee et al. |
| 2019/0286419 A1 | 9/2019 | Lin et al. |
| 2020/0026993 A1 | 1/2020 | Otsuka |
| 2020/0098784 A1 | 3/2020 | Nagashima et al. |
| 2020/0098787 A1 | 3/2020 | Kaneko |
| 2020/0227432 A1 | 7/2020 | Lai et al. |
| 2020/0343252 A1 | 10/2020 | Lai et al. |
| 2020/0365611 A1 | 11/2020 | Hung et al. |
| 2020/0381450 A1 | 12/2020 | Lue et al. |
| 2020/0402997 A1 | 12/2020 | Ahn et al. |
| 2021/0391354 A1* | 12/2021 | Sun ........................ H10B 41/27 |
| 2021/0408036 A1* | 12/2021 | Lee ........................ H10B 63/34 |

OTHER PUBLICATIONS

Choi et al., "Performance Breakthrough in NOR Flash Memory with Dopant-Segregated Schottky-Barrier (DSSB) SONOS Device", 2009 Symposium onVLSI Technology Digest of Technical Papers, Jun. 16-18, 2009, pp. 1-2.

Gonugondla et al., "Energy-Efficient Deep In-memory Architecture for NAND Flash Memories," IEEE International Symposium on Circuits and Systems (ISCAS), May 27-30, 2018, 5 pages.

Hsu et al., "Study of Sub-30nm Thin Film Transistor (TFT) Charge-Trapping (CT) Devices for 3D NAND Flash Application", IEDM 2009 IEEE International, Dec. 7-9, 2009, p. 1-4.

Hubert et al., "A Stacked SONOS Technology, Up to 4 Levels and 6nm Crystalline Nanowires, With Gate-All-Around on Independent Gates (Flash), Suitable for Full 3D Integration," IEEE 2009, Dec. 7-9, 2009, pp. 27.6.1-27.6.4.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Katsumata et al., "Pipe-shaped BiCS flash memory with 16 stacked layers and multi-level-cell operation for ultra high density storage devices," 2009 Symp. on VLSI Technology, Jun. 16-18, 2009, 2 pages.

Kim et al. "Novel Vertical-Stacked-Array-Transistor (VSAT) for Ultra-High-Density and Cost-Effective NAND Flash Memory Devices

(56) References Cited

OTHER PUBLICATIONS and SSD (Solid State Drive)", Jun. 2009 Symposium on VLSI Technolgy Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al. "Highly Reliable MA BE-SONOS (Metal-Al2O3 Bandgap Engineered SONOS) Using a SiO2 Buffer Layer," VLSI Technology, Systems and Applications 2008, VLSI-TSA International Symposium on Apr. 21-23, 2008, pp. 58-59.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

Lue et al., "A Novel Buried-Channel FinFET BE-SONOS NAND Flash with Improved Memory Window and Cycling Endurance", 2009 Symposium on VLSI Technology Digest of Technical Papers, p. 224-225.

Meena, et al., "Overview of emerging nonvolatile memory technologies," Nanoscale Reearch Letters 9:526, Oct. 2, 2014, 34 pages.

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Paul et al., "Impact of a Process Variation on Nanowire and Nanotube Device Performance", IEEE Transactions on Electron Devices, vol. 54, No. 9, Sep. 2007, p. 2369-2376.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., "Neuromorphic Computing: From Materials to Systems Architecture," US Dept. of Energy, Oct. 29-30, 2015, Gaithersburg, MD, 40 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang et al., "Three-Dimensional NAND Flash for Vector-Matrix Multiplication," IEEE Trans. on Very Large Scale Integration Systems (VLSI), vol. 27, No. 4, Apr. 2019, 4 pages.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

U.S. Office Action from U.S. Appl. No. 17/170,542 dated Feb. 3, 2023, 14 pages.

\* cited by examiner

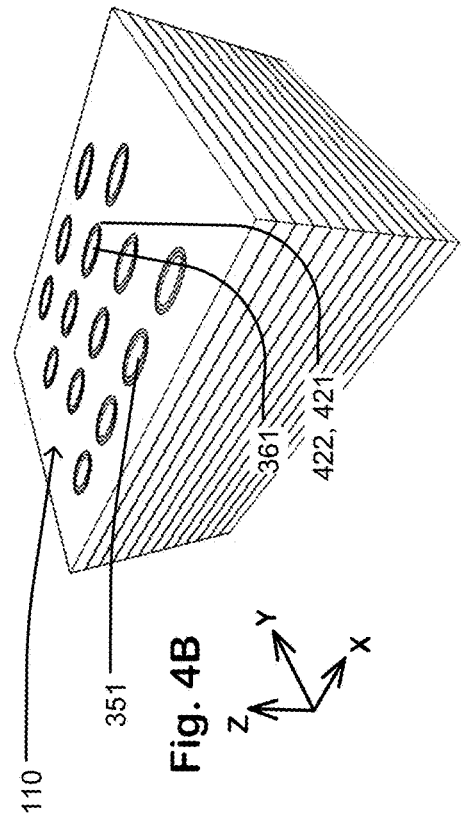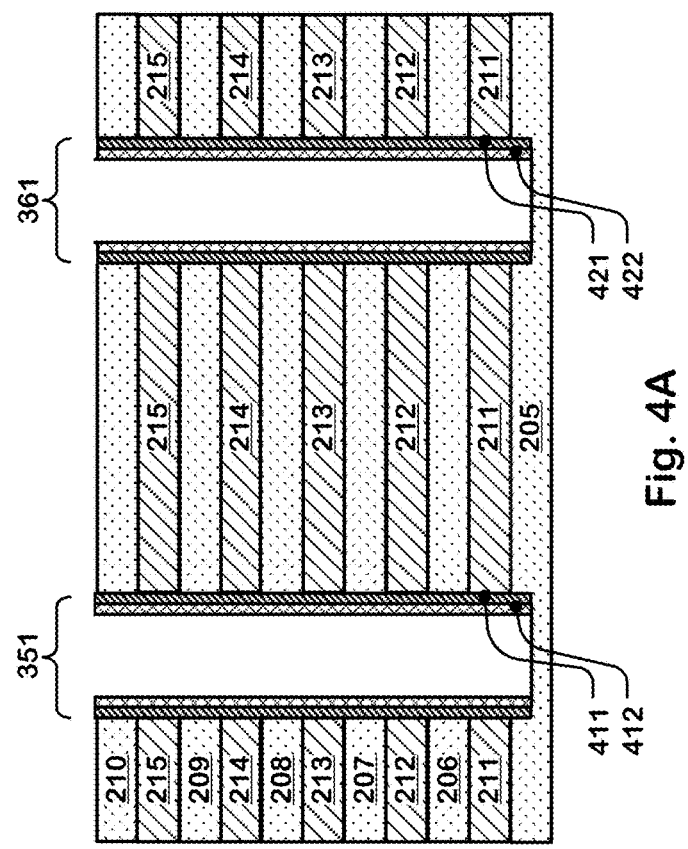

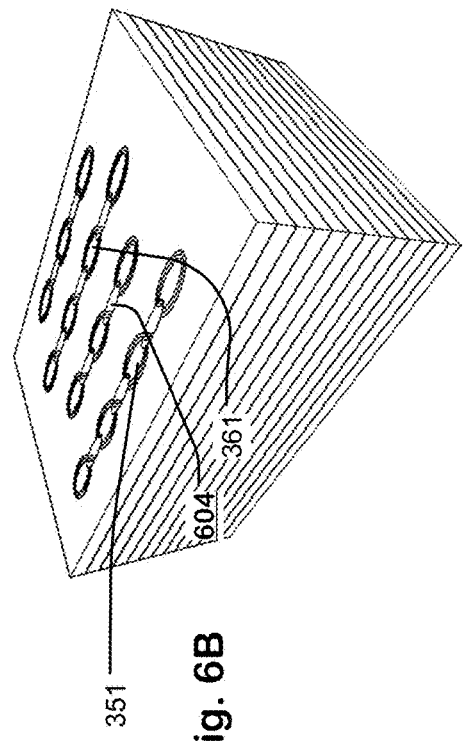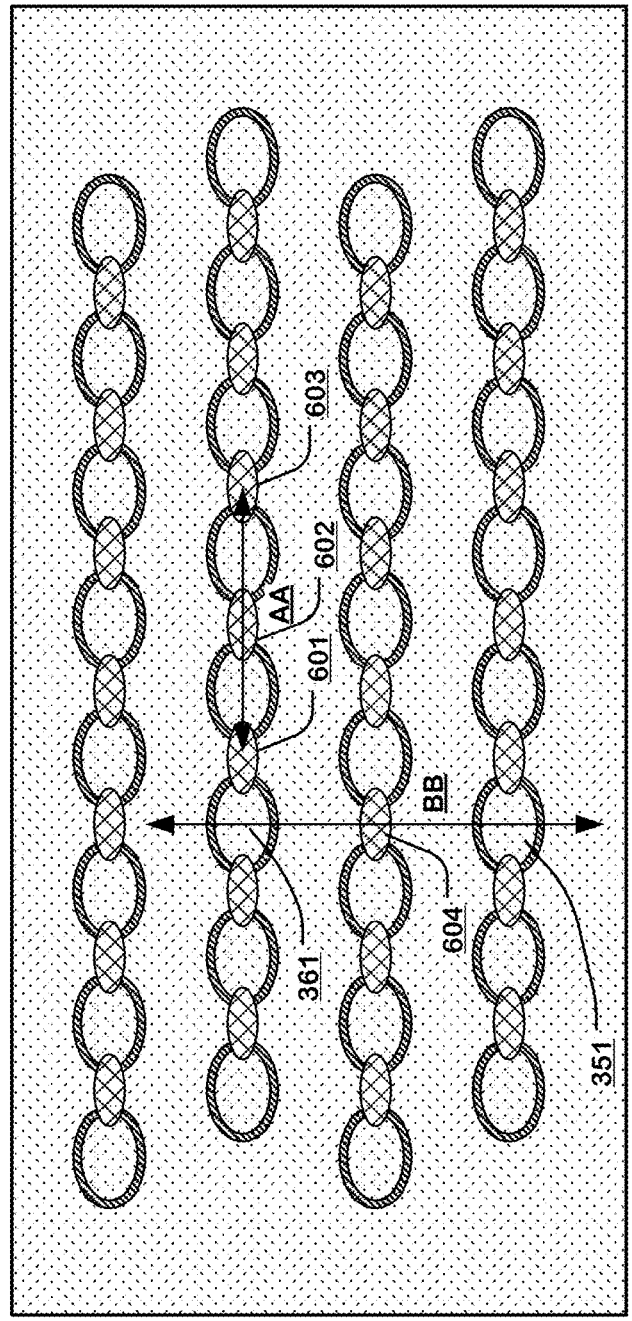

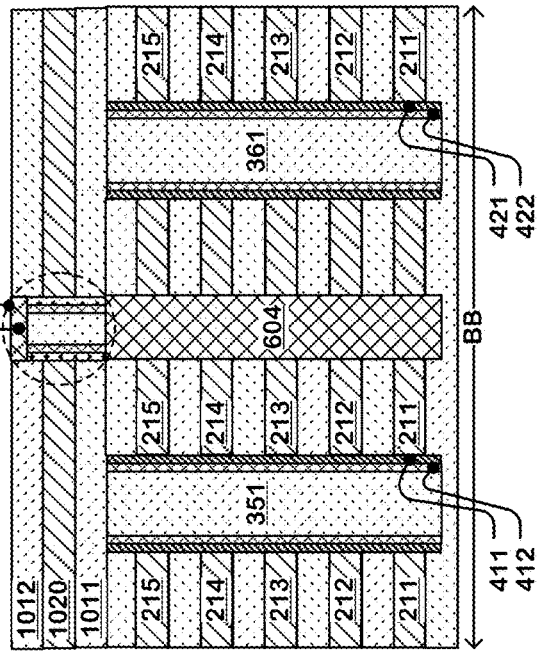
Fig. 13A
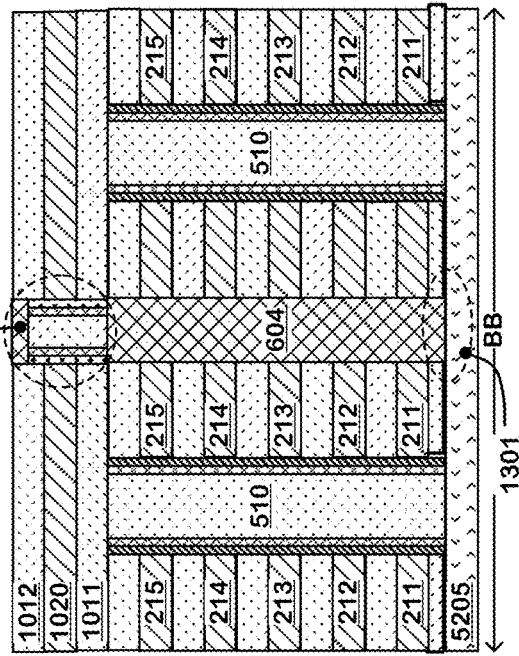
Fig. 13B
Fig. 12

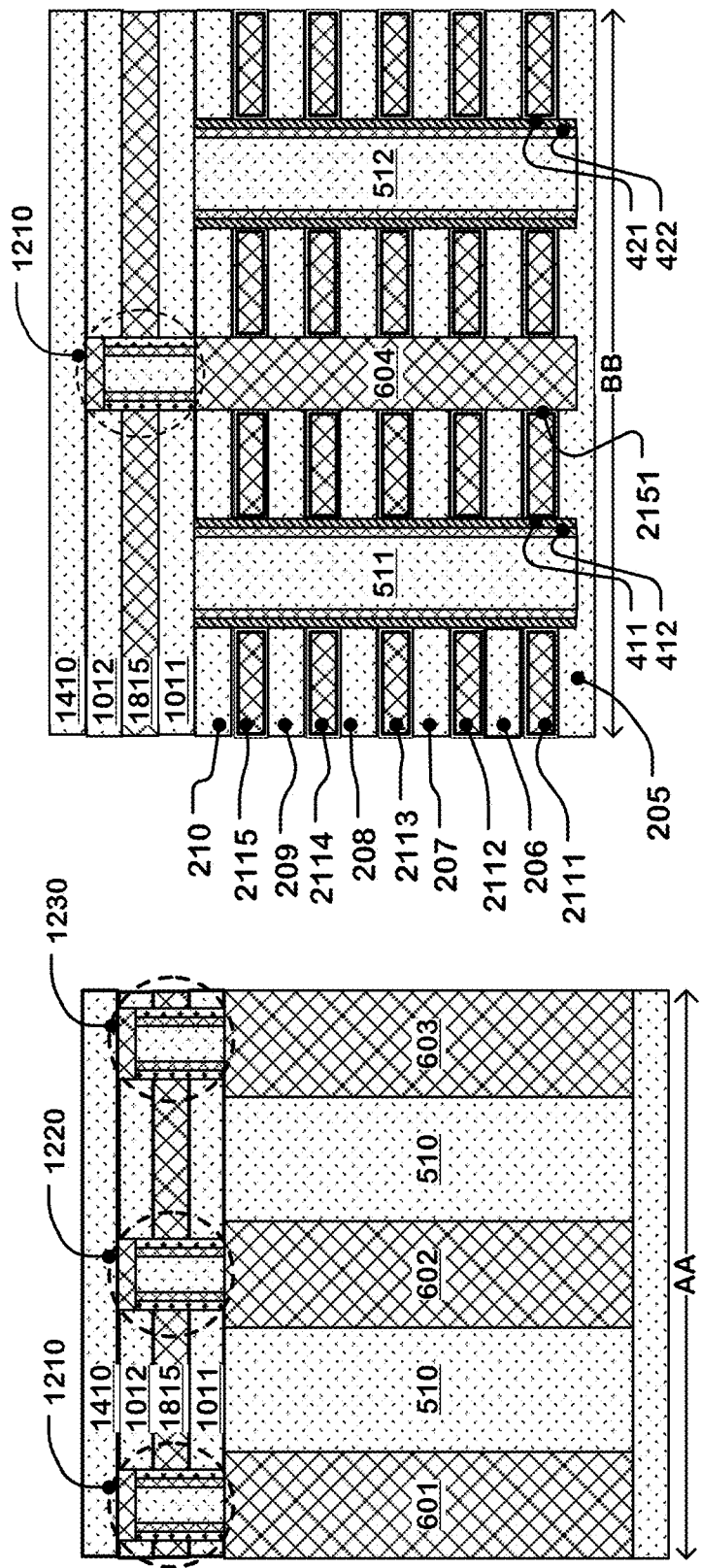

3D VIRTUAL GROUND MEMORY AND MANUFACTURING METHODS FOR SAME

BACKGROUND

Field

The present invention relates to 3D memory, including structures and manufacturing methods for implementation of 3D memory, including 3D AND architecture and 3D NOR architecture devices.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit.

AND architecture and NOR architecture flash memory are random access memory for high speed applications. However, the implementation of such devices have been limited in density. For NAND architecture, high density is achieved using three dimensionally stacked NAND flash memory. The lack of random access in NAND architecture memory, however, makes it unsuitable or undesirable for some applications.

It is desirable to provide technology for a three-dimensionally stacked integrated circuit memory having higher density, random access, and high operating speed.

SUMMARY 3D memory technology is described suitable for AND architecture and NOR architecture memory, including flash memory. Representative aspects of the technology are set forth in this "summary" section, for the purposes of introduction to the specification.

Memory devices are implemented using a vertical memory structure, comprising a stack of alternating layers of insulator material and word line material having a plurality of series of alternating conductive pillars and insulating pillars disposed through stack to form a memory block. A given series includes at least a first conductive pillar, a first insulating pillar adjacent to the first conductive pillar and a second conductive pillar adjacent to the first insulating pillar. Data storage structures are disposed on inside surfaces of the layers of word line material at cross-points of the first insulating pillar and the layers of word line material. Semiconductor channel material is disposed between the first insulating pillar and the data storage structures at cross-points of the first insulating pillar with the layers of word line material. The semiconductor channel material extends around an outside surface of the first insulating pillar and contacts the first conductive pillar and the second conductive pillar to provide source/drain terminals. In embodiments of the memory structures, the outside surface of the first insulating pillar is arcuate, in the sense that it is curved or bent as opposed to straight, in a plane parallel to the layers of word line material.

In some embodiments the semiconductor channel material can be discontinuous along the outside surface of the insulator pillars. Also, in some embodiments the inside surfaces of the layers of word line material adjacent to the first insulating pillar are recessed relative to inside surfaces of the layers insulating material adjacent to the first insulating pillar, forming recesses between the layers of insulating material; wherein the semiconductor channel material and the data storage structures are disposed in the recesses.

A conductive strip overlying the stack, can act as pillar select or bit line select line for a plurality of vertical channel transistors through the conductive strip. The vertical channel transistors contact respective conductive pillars in the series of alternating conductive pillars and insulating pillars. A plurality of bit line conductors can be disposed in a layer over the vertical channel transistors, with contacts to respective vertical channel transistors in the plurality of vertical channel transistors.

The conductive pillars in the plurality of series can be arranged in an array including a plurality of distinct subarrays of the array. Each distinct subarray can include at least one series in the plurality of series. The structure can further include a plurality of conductive strips disposed in a pillar select layer over the stack, including for each distinct subarray of the array, a corresponding conductive strip of the plurality of conductive strips, and including for each distinct subarray of the array a plurality of vertical channel structures for vertical transistors through the corresponding conductive strip contacting respective conductive pillars in the distinct subarray.

In some embodiments, the structure can include insulator filled slots disposed in intervals along the plurality of series of alternating conductive pillars and insulating pillars and extending through the pillar select layer including the plurality of conductive strips and through the stack. The slots can be utilized in manufacturing processes that use so-called gate replacement procedures, that access sacrificial material through the slots prior to filling. The filled slots can be elongated in a direction orthogonal to the plurality of series of alternating conductive pillars and insulating pillars.

The vertical memory structure can include a conductive layer beneath the stack, wherein the conductive pillars in the plurality of series of alternating conductive pillars and insulating pillars connect to the conductive layer, where the connection in some embodiments can include a PN junction. In some embodiments, conductor filled slots are disposed in intervals along the plurality of series of alternating conductive pillars and insulating pillars and extending through the stack to contact the conductive layer beneath the stack, the filled slots elongated in a direction orthogonal to the plurality of series of alternating conductive pillars and insulating pillars.

Also, a vertical memory structure is described, comprising a stack of alternating layers of insulator material and word line material; a plurality of distinct series of alternating conductive pillars and insulating pillars disposed through the stack, the conductive pillars in the plurality of distinct series being arranged in an array and in a plurality of distinct subarrays of the array, each distinct subarray including at least one distinct series in the plurality of series, each distinct series in the plurality of distinct series including at least a first conductive pillar, a first insulating pillar adjacent to the first conductive pillar and a second conductive pillar adjacent to the first insulating pillar; data storage structures disposed on inside surfaces of the layers of word line material at cross-points of the insulating pillars in the plurality of distinct series and the layers of word line material; semiconductor channel material between the insulating pillars in the plurality of distinct series and the data storage structures at cross-points of the insulating pillars in the plurality of distinct series with the layers of word line material, the semiconductor channel material extending around outside surfaces of the insulating pillars in the plurality of distinct series and contacting adjacent conductive pillars on both sides the plurality of distinct series; a plurality of conductive strips disposed in a pillar select layer over the stack, including for each distinct subarray of the array, a corresponding conductive strip of the plurality of conductive strips, and including for each distinct subarray of the array; a plurality of vertical channel structures through the corresponding conductive strip contacting respective conductive pillars in the distinct subarray; and a plurality of bit line conductors disposed over the pillar select layer over the stack, each bit line conductor having contacts to one vertical channel transistor in the plurality of vertical channel transistors in each of the distinct subarrays.

Manufacturing methods for embodiments of the 3D memory structures are also described.

An integrated circuit memory device including 3D memory structures as described herein is described.

A variety of unique integrated circuits structures are described, with manufacturing methods, usable in structures other than the memory structures described herein.

Other aspects and advantages of the present technology can be seen on review of the drawings, the detailed description and the claims, which follow.

BRIEF DESCRIPTION OF THE DRAWINGS

FIGS. 4A-4B are a cross-section and a 3D perspective, respectively, of a stack after forming memory material and channel liners in the first holes in the stack.

FIGS. 6A-6B are a cross-section and a 3D perspective, respectively, of a stack including an array of second holes disposed between the first holes, to form series of alternating first holes and second holes through the stack.

FIG. 12 is a cross-section on a line A-A of a structure like that of FIG. 11A after a later stage in manufacturing.

FIG. 13A is a cross-section of the stack on the line B-B of a structure like that of FIG. 11A.

FIG. 13B is a cross-section of the stack on the line B-B of a structure like that of FIG. 11A in an alternative embodiment, in which a bottom layer the stack is a conductor, such as a p-type semiconductor.

FIG. 17 is a cross-section of the stack on the line A-A of a structure like that of FIG. 16A after replacement of sacrificial material with word line material.

FIG. 18 is a cross-section of the stack on the line B-B of a structure like that of FIG. 16A after replacement of sacrificial material with word line material.

DETAILED DESCRIPTION

Figure 1:
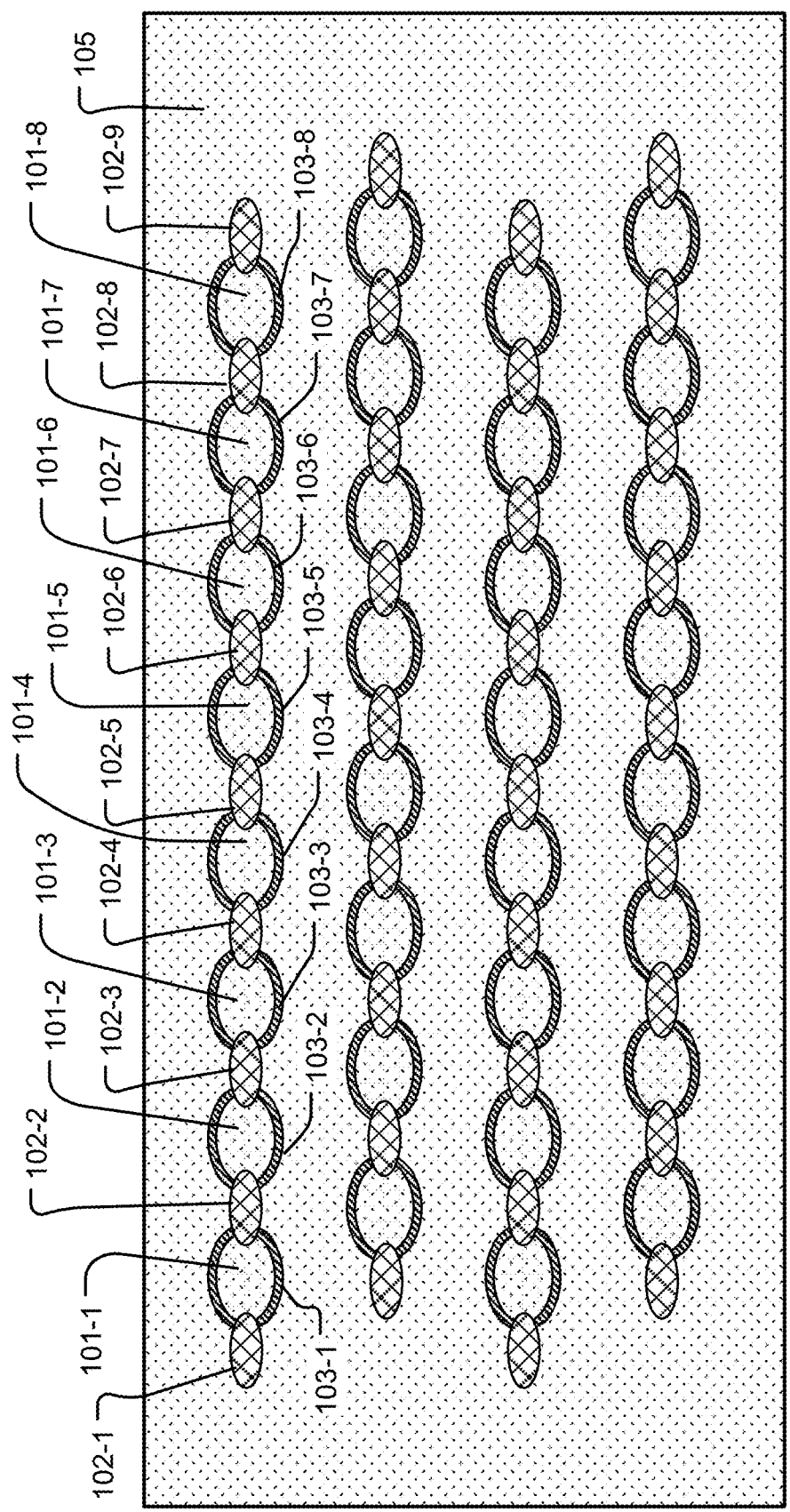
FIG. 1 is a top plan view of an embodiment of a 3D memory block comprising a plurality of series of alternating conductive pillars and insulating pillars as described herein.
Figure 57:
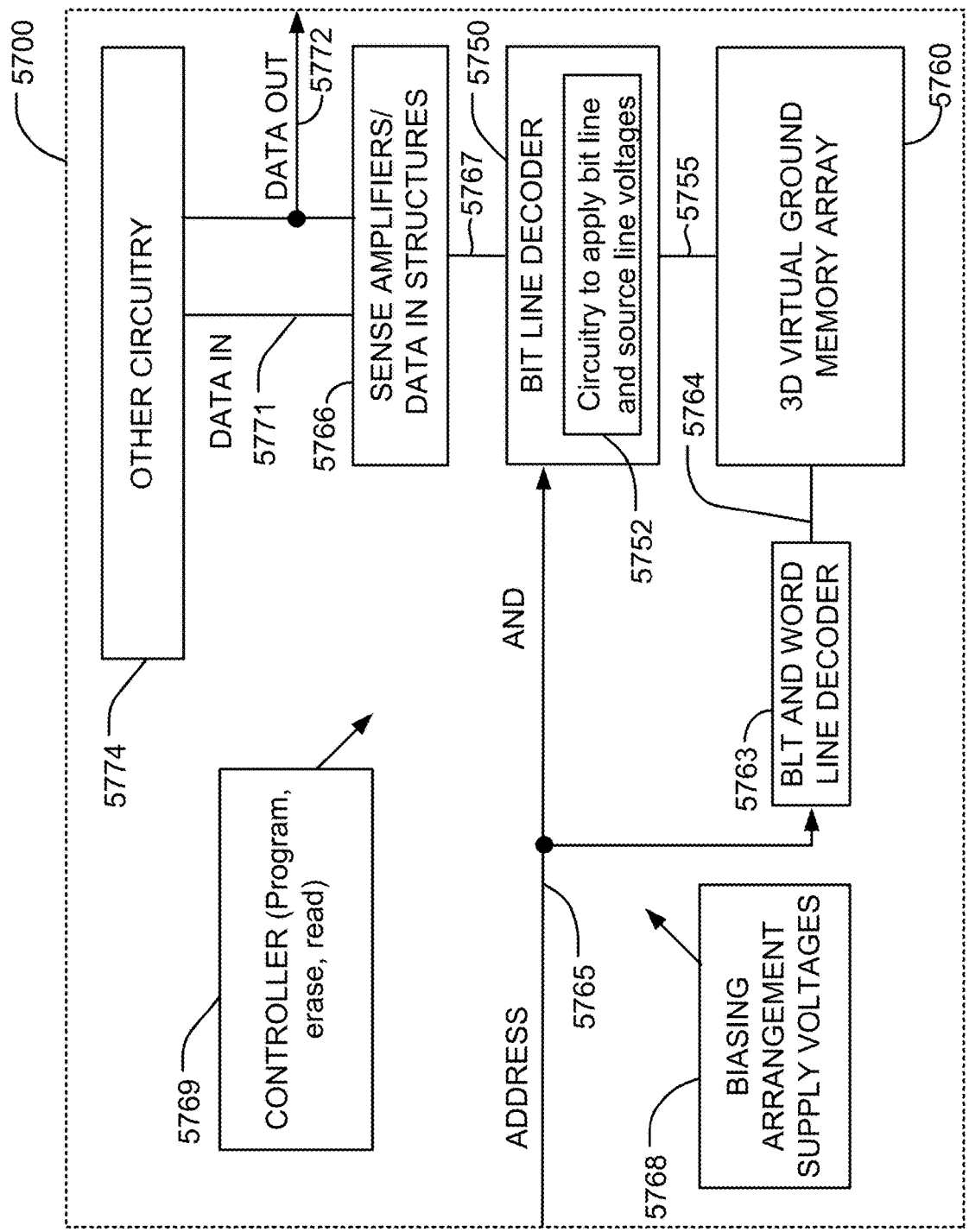
FIG. 57 is a simplified block diagram of an integrated circuit memory including a virtual ground 3D memory array, various embodiments of which are described herein.

A detailed description of embodiments of the present technology is provided with reference to the FIGS. 1-57.

Figure 55:
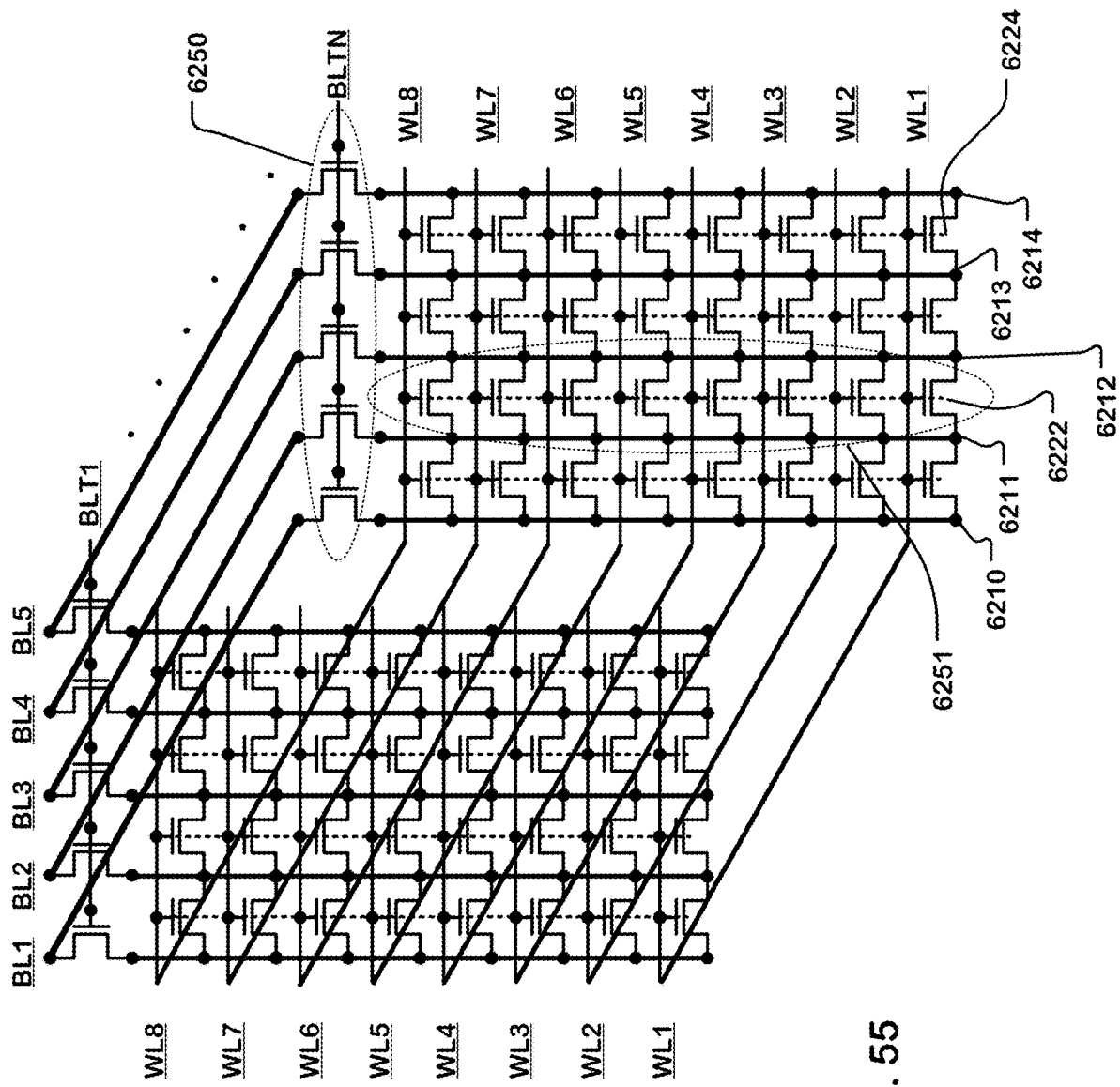
FIG. 55 is a schematic diagram of a 3D memory array such as can be manufactured as described above.
Figure 56:
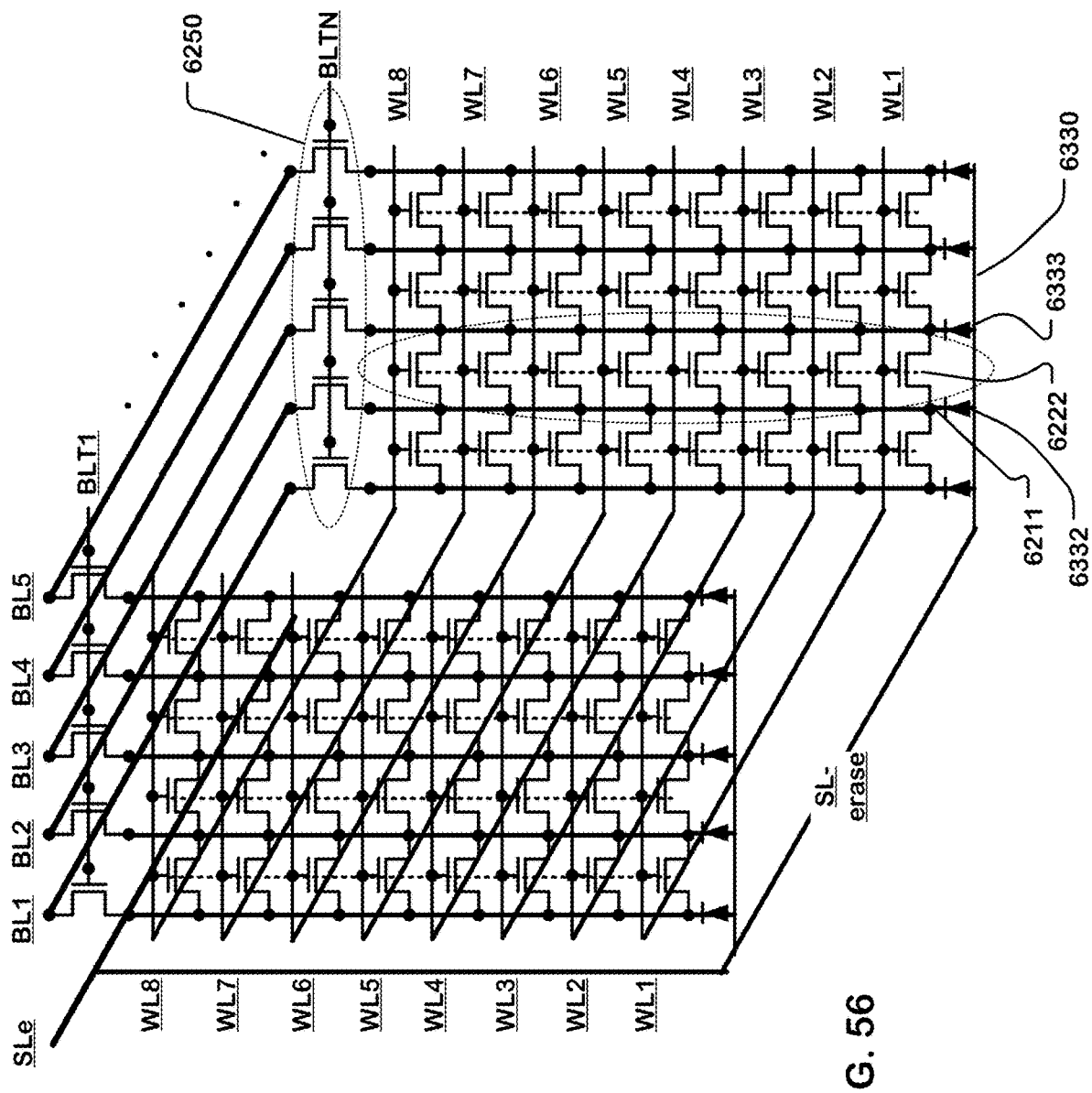
FIG. 56 is a schematic diagram of a 3D memory array such as can be manufactured as described above, including a lower source line conductor.

Technology described includes structures and manufacturing methods that can be used to implement 3D memory devices, including 3D memory devices which can have a circuit schematic form as shown in FIGS. 55 and 56.

Referring to FIG. 55, a 3D memory array is illustrated including a plurality of distinct subarrays in respective slices of the schematic. Each subarray is connected to a set of bit lines BL1 to BLS in this example, by means of bit line select transistors controlled by a common bit line select line. Thus, the schematic in FIG. 56 illustrates a number N of distinct subarrays which consist of vertical slices of the 3D block selected by the bit line select lines BLT1 to BLTN in this example.

In the schematic of FIG. 55, each distinct subarray is composed by a series of conductive pillars 6210, 6211, 6212, 6213, 6214 alternating with insulating/channel pillars, schematically indicated by the vertical dashed lines (e.g. 6222, 6224). As described in detail herein, semiconductor channels and memory elements are disposed around the outside surfaces of the insulating/channel pillars at cross points of word line layers (e.g. WL1 to WL8) and the insulating/channel pillars. The semiconductor channels contact the conductive pillars on opposing sides to form stacked memory cell transistors, such as the stack 6251. Conductive pillar select transistors 6250 controlled by the bit line select line BLTN connect vertical conductive pillars that form the distinct subarray to corresponding bit lines overlying the stack.

A memory array such as shown in FIG. 55 can be operated in a virtual ground configuration, in which the bit lines BL1 to BLS are utilized alternatively as source side conductors and drain side conductors for the memory cells in the stacks of memory cells. Thus, the bit line BL2 and conductive pillar 6211 which is coupled to bit line BL2, can be used as a source side conductor for memory cells in the stack 6251, between conductive pillar 6211 and 6212, and also as a drain side conductor for memory cells in the stack to the left between conductive pillars 6210 and 6211. The circuit of FIG. 55 can also be implemented as described in our related U.S. patent application Ser. No. 16/394,363, entitled 3D NOR MEMORY HAVING VERTICAL SOURCE AND DRAIN STRUCTURES, filed 25 Apr. 2019 (U.S. Pat. No. 10,910,393), by the same inventors and commonly owned at the time of invention and now, which is incorporated by reference as if fully set forth herein.

FIG. 56 illustrates a circuit schematic for another memory array structure, like that of FIG. 55 (like components which are not described again), but with the addition of an underlying source line conductor 6330. The source line conductor 6330 is connected to the conductive pillars (e.g. 6211) through a PN junction (e.g. 6332, 6333). In this way, the underlying source line conductor 6330 can be used to apply bias voltages to the conductive pillars in some memory operations, such as erase operations described herein, while it is isolated from the conductive pillars during other memory operations, such as read and program operations.

Figure 54A:
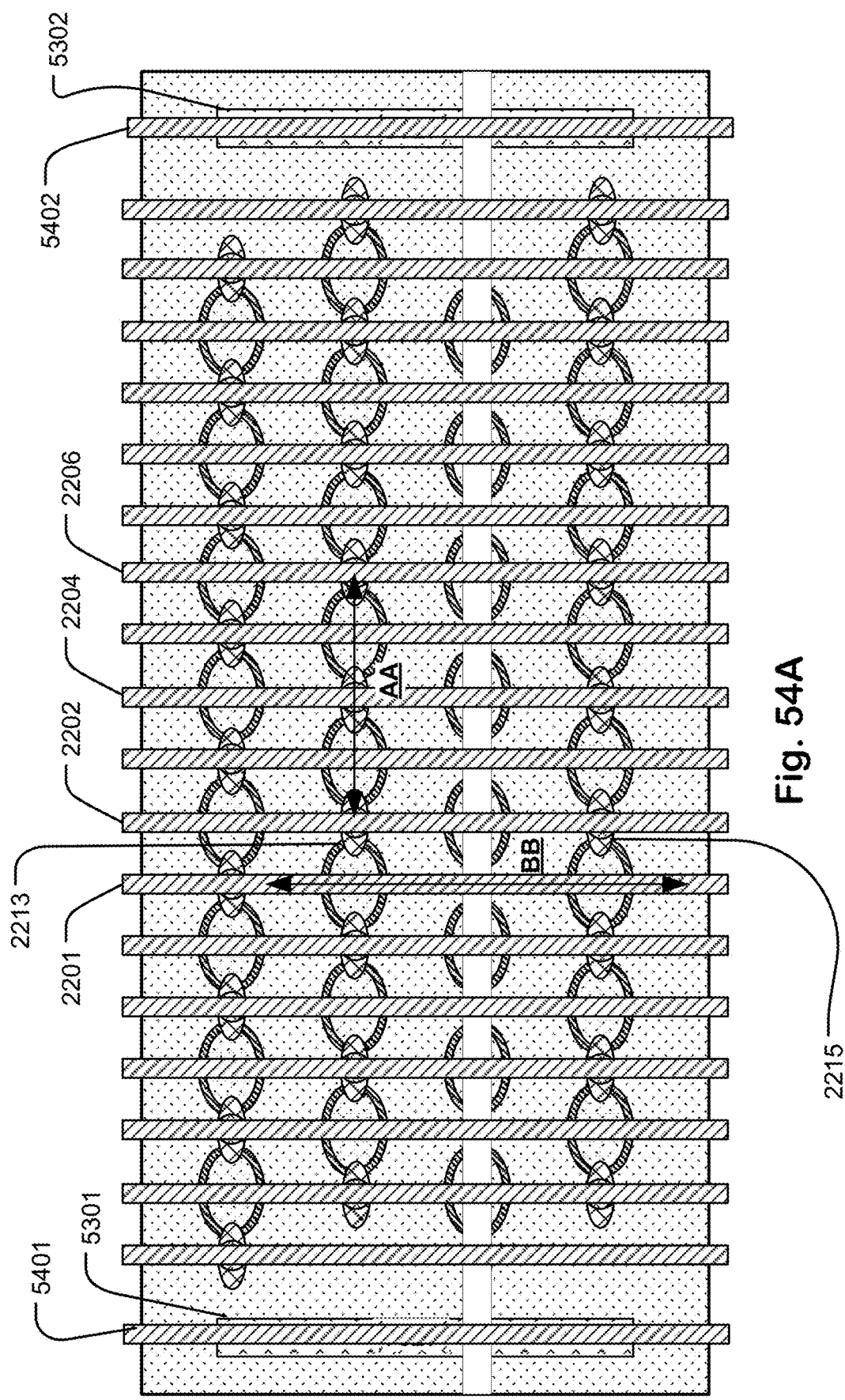
FIG. 54A is a top plan view of the structure of FIG. 53 after formation of overlying bit line structures.
Figure 54B:
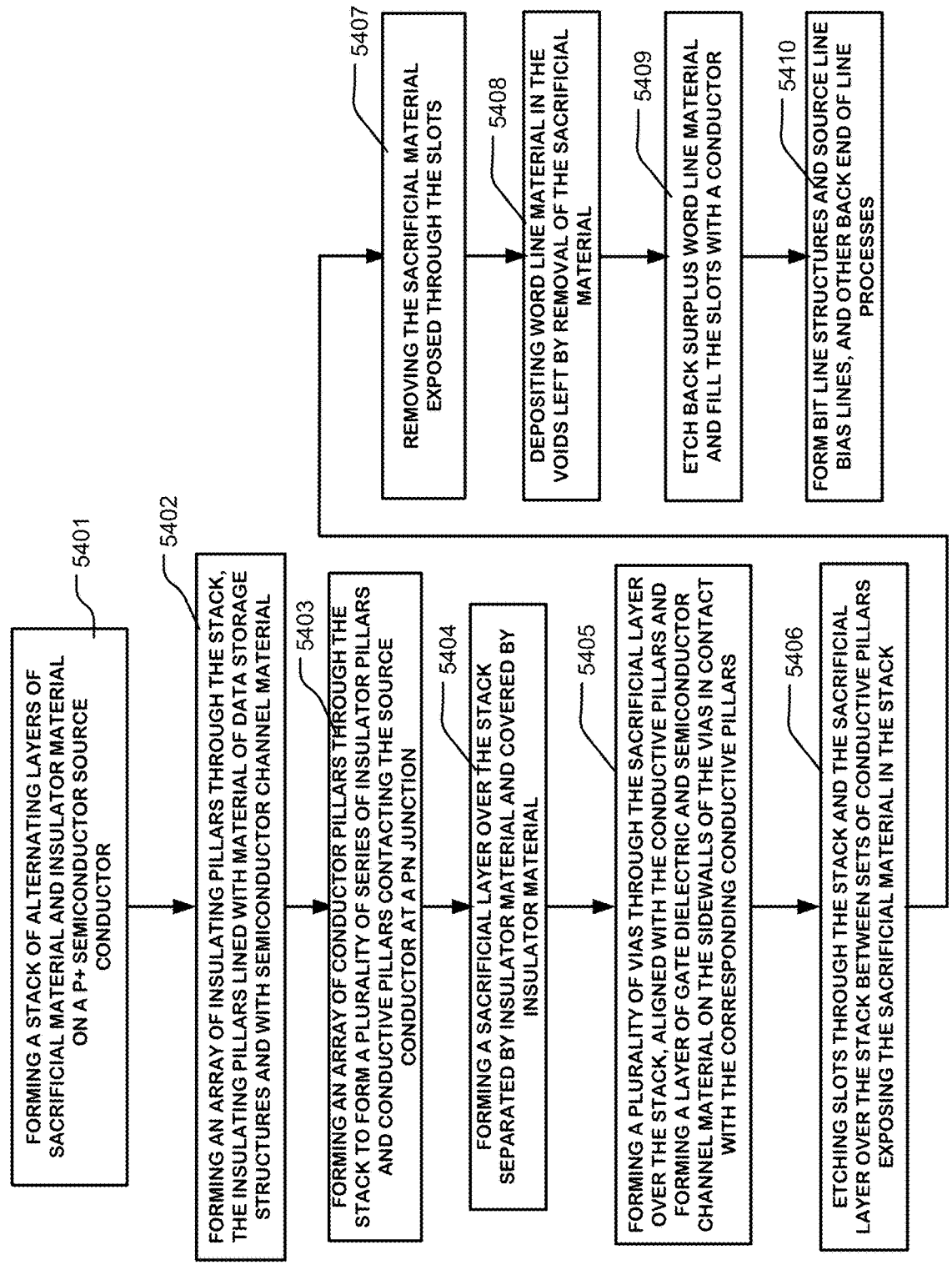
FIG. 54B is a flowchart of an alternative manufacturing method like that represented by FIGS. 51-54A.

Integrated circuit memory structures to implement memory arrays such as can be represented by the schematic diagrams in FIGS. 55 and 56 can be manufactured in a number of processes, some of such processes can be understood with reference FIG. 1 to FIG. 54B.

FIG. 1 is a top plan view of an embodiment of a subassembly of 3D memory block 105 in an intermediate manufacturing stage comprising a plurality of series of alternating conductive pillars and insulating pillars. The block 105 comprises a stack of alternating layers of insulator material and word line material. In the illustrated block 105, there are four series of alternating conductive pillars (102-1 through 102-9 in this example) and insulating pillars (101-1 through 101-8) disposed through the stack. The insulating pillars can have a cylindrical shape, having sidewalls which are vertical within limits of manufacturing processes used. The cylindrical shape can be a circular or oval cylinder, or other shape as suits the manufacturing method and layout patterns utilized. In embodiments described herein the insulating pillars in the series have an outside surface which is arcuate in a plane parallel to the layers of word line material. Likewise the conductive pillars can have a cylindrical shape having sidewalls which are vertical within limits of manufacturing processes used. The cylindrical shape can be a circular or oval cylinder, or other shape as suits the manufacturing method and layout patterns utilized. In the embodiments illustrated, the conductive pillars are oval cylindrical columns having long axes aligned with direction of the series, which is the row direction or X direction.

Of course, there can be very large numbers of alternating conductive pillars and insulating pillars in a given embodiment. A semiconductor channel material and memory element (103-1 through 103-8) is disposed around the outside surfaces of each of the insulating pillars (101-1 through 101-8), at least at the cross point of word line layers in the stack. This results in formation of memory cell structures crossing over the insulating pillars at the levels of the word lines which have source/drain terminals on the adjacent conductive pillars on each side.

As illustrated in FIG. 1, a given distinct series in the plurality of distinct series includes a number N+1 conductive pillars (102-1 through 102-9 in this example), where N equals 8 in this drawing, and the number N insulating pillars (101-1 through 101-8), whereby the given distinct series includes N stacks of memory cells.

Figure 2:
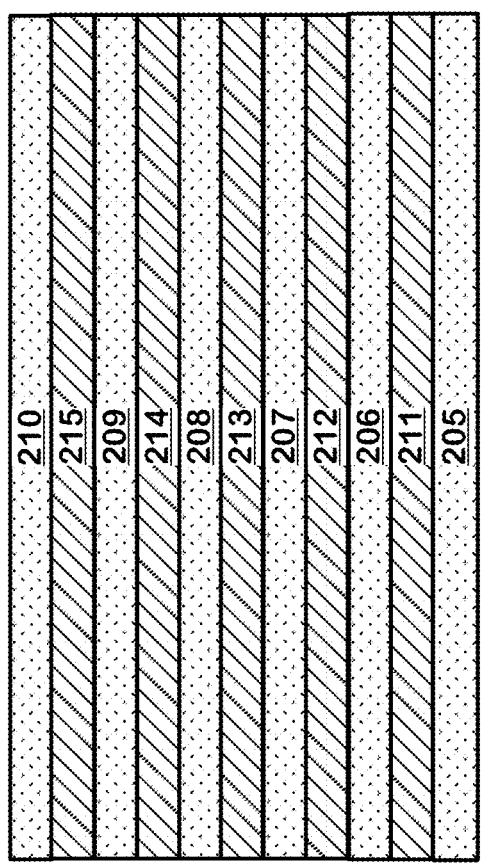
FIG. 2 is a cross-section of a stack of alternating layers of insulating material and sacrificial material at a stage of a manufacturing process.

FIG. 2 illustrates a subassembly in an earlier stage in a manufacturing process for a 3D memory block. FIG. 2 shows the results of forming a block that comprises a stack of alternating layers of insulator material and sacrificial material, which sacrificial material is to be replaced with word line material later in the manufacturing process. In this example, the alternating layers of insulator material identified by reference numerals 205 to 209 and the alternating layers of sacrificial material are identified by reference numerals 211 to 215. The insulator material can be implemented using a silicon oxide for example or other suitable insulator, while the sacrificial material can be implemented using a silicon nitride, a silicon germanium compound or other material that can be etched using a highly selective etching chemistry for the purposes of the replacement by word line material without removing the insulator material. In this example, a hard mask layer 210 is formed on top of the stack, used during later patterning stages.

Figure 3B:
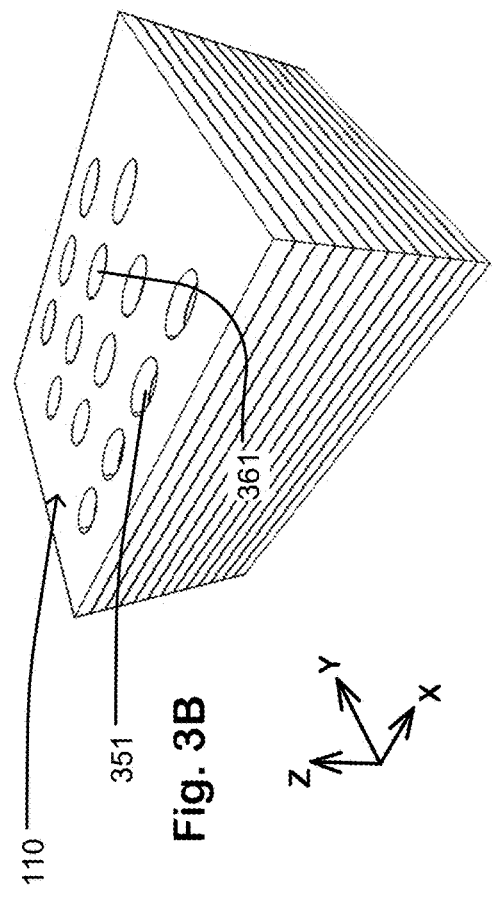
FIGS. 3A-3B are a cross-section and a 3D perspective, respectively, of a stack with an array of first holes at a stage of a manufacturing process.
Figure 3A:
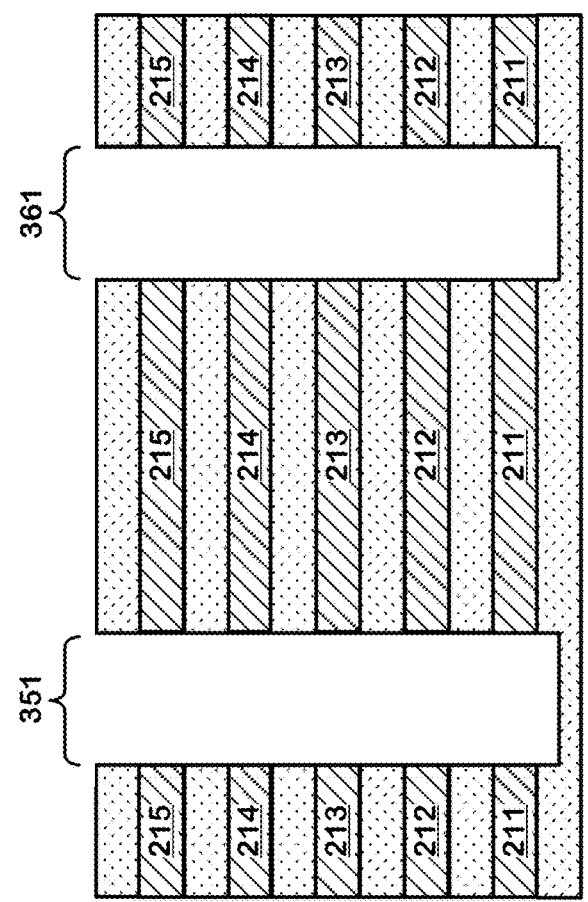

FIG. 3A illustrates a subassembly in a later stage after using the hard mask to define a pattern for an array of holes, and etching holes 351, 361 through the stack to be used for forming the insulating pillars. FIG. 3B is a perspective view showing a layout (representative) that can be used for array 110 of holes through the stack, including holes 351, 361.

FIG. 4A is a cross section in a row direction, or X direction, which illustrates a subassembly in a later stage after a sequence of steps including depositing the memory structure at least at the levels of the word lines. In this example, the memory structure is a multilayer dielectric charge storage structure 411, 421 lining the sidewalls of the holes 351, 361. Example multilayer dielectric charge storage structures can be implemented using so-called SONOS technology and bandgap engineered SONOS technology, in which the memory structure includes a dielectric tunneling layer, a dielectric charge trapping layer, and the dielectric blocking layer. A tunneling layer can be implemented using one or more thin films of silicon oxide and silicon nitride in some embodiments. The dielectric charge trapping layer can be implemented using silicon nitride, or other materials. The dielectric blocking layer can be implemented using one or more layers, including silicon oxide, or other insulators that can have a higher dielectric constant than silicon oxide. These dielectric charge trapping structures are sometimes referred to using a shorthand designator like ONO, ONONO, ONONONO and so on. In other embodiments, ferroelectric memory structures can be used. The ferroelectric memory structures can include ferroelectric material such as hafnium oxide, including for example silicon-doped hafnium oxide, aluminum-doped hafnium oxide, yttrium-doped hafnium oxide, gadolinium-doped hafnium oxide, lanthanum-doped hafnium oxide, zirconium-doped hafnium oxide, or other materials.

Also, a semiconductor channel layer 412, 422 is formed over the multilayer dielectric charge storage layer 411, 421.

A process to form the structure can include first performing a blanket deposition of the multilayer dielectric charge storage structure, followed by a blanket deposition of the semiconductor channel material over the multilayer dielectric charge storage structure. Thereafter, an anisotropic spacer etch using for example a reactive ion etch chemistry is applied to remove material from the bottom of the hole, and from the top of the stack leaving the sidewall structures illustrated in FIG. 4A. FIG. 4B is a 3D perspective like that of FIG. 3B, showing the holes lined with the multilayer charge storage structure and the semiconductor channel layer (e.g. hole 361 lined with 422, 421).

Figure 5A:
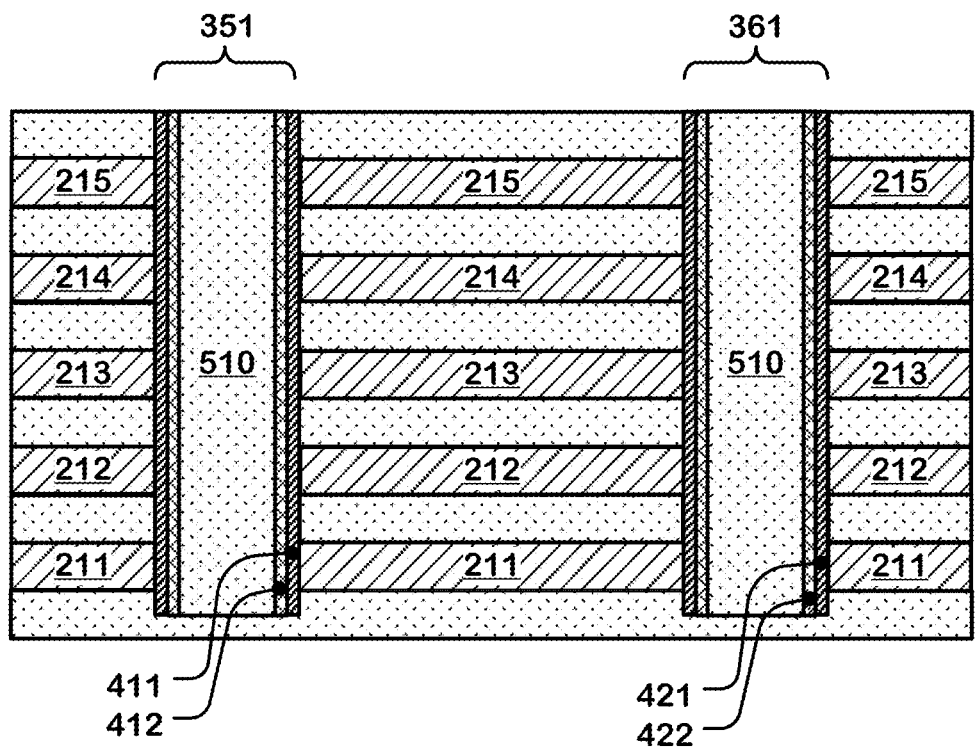
FIG. 5A is a cross-section of the stack after filling the first holes with an insulator.

FIG. 5A illustrates the structure after performing a process to fill the holes 351, 361 with an insulator 510, such as a silicon oxide, and a planarizing step such as a chemical mechanical polishing to level the surface.

Figure 5B:
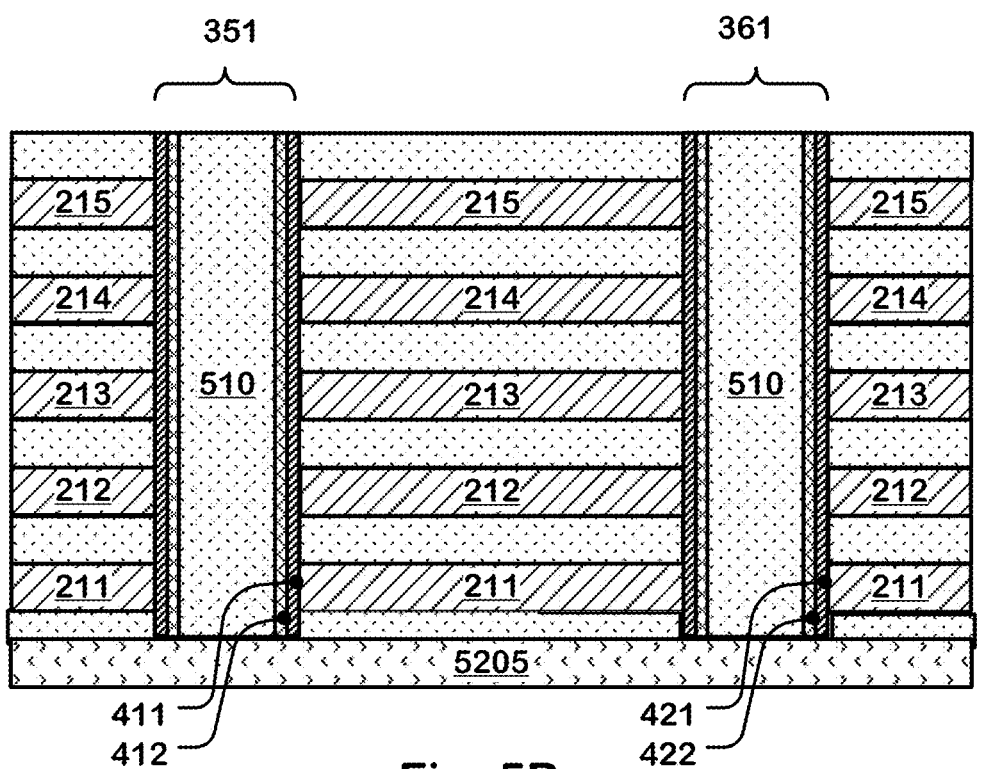
FIG. 5B is a cross-section of the stack in an alternative embodiment, in which a bottom layer the stack is a conductor, such as a p-type semiconductor.

FIG. 5B illustrates the structure in an alternative embodiment having an underlying source line conductor, in which an underlying conductive layer 5205 is disposed below the stack. The same reference numerals as in FIG. 5A are used for similar structures. More details of this alternative embodiment are described below.

FIG. 6A is a top plan view of an embodiment of a 3D memory block 105 in an intermediate manufacturing stage after etching an array of second holes, in which conductor material is deposited, to form the conductive pillars (e.g. 601, 602, 603, 604), forming a plurality of series of alternating conductive pillars and insulating pillars (e.g. 351, 361). In one embodiment, the conductive pillars can be formed by depositing a N+ type polysilicon into the array of second holes, followed by a planarizing step such as chemical mechanical polishing.

In the illustrated embodiment, there are four series of alternating conductive pillars and insulating pillars extending in the row direction. Each of the series is offset in the row direction from the adjacent rows for a high density configuration as discussed below. As described above, the insulating pillars contain the semiconductor channel layer and the memory structure layers. The conductive pillars contact the semiconductor channel layer on the adjacent insulating pillar or pillars, forming source/drain terminals at the contacts for the memory cells at the cross points with the word line layers.

FIG. 6B is a 3D perspective view of the stack showing the array of holes disposed between the insulating pillars (e.g. 351, 361) for formation of the conductive pillars (e.g. 604).

Figure 7:
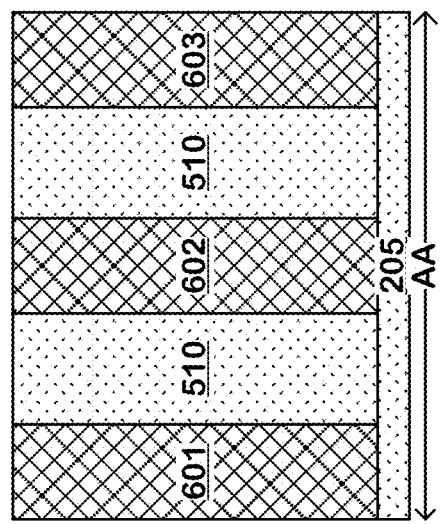
FIG. 7 is a cross-section on the line A-A of FIG. 6A.

FIG. 7 is a cross-section of the structure of FIG. 6A taken in the row or X direction on the line A-A. As seen, the conductive pillars 601, 602, 603 are disposed in an alternating fashion with insulating pillars. Because the cross-section is taken on a centerline of the row, the semiconductor channel layer and the memory structure layers which extend around outside surfaces of the insulating pillars are not intersected in this cross-section for this embodiment.

Figure 8:
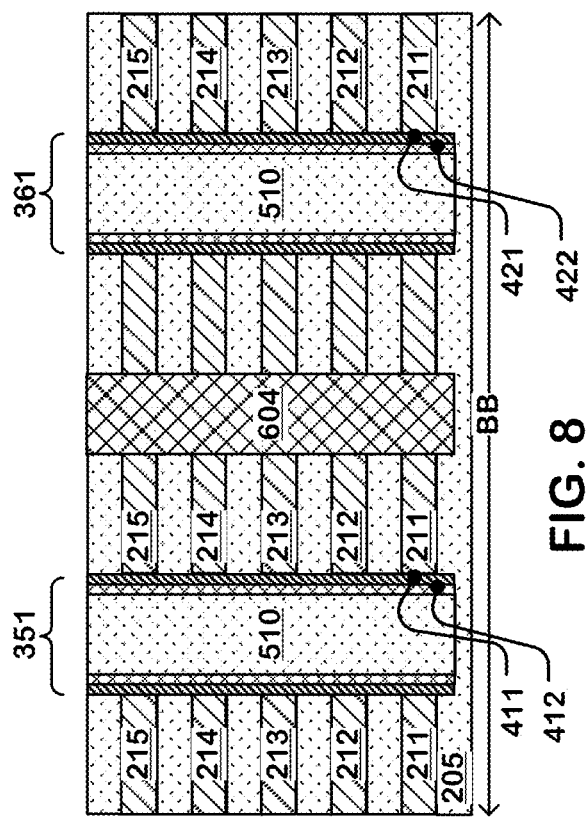
FIG. 8 is a cross-section on the line B-B of FIG. 6A.

FIG. 8 is a cross-section of the structure of FIG. 6A taking in a column or Y direction on the line B-B. As seen, insulating pillars 351, 361 are disposed in separate rows along the column. An intermediate row along the column includes the conductive pillars 604. At the word line layers, the sacrificial material 211-215 extends around the insulating pillars and the conductive pillars in the locations of word lines to be formed after replacement of the sacrificial material.

Figure 9:
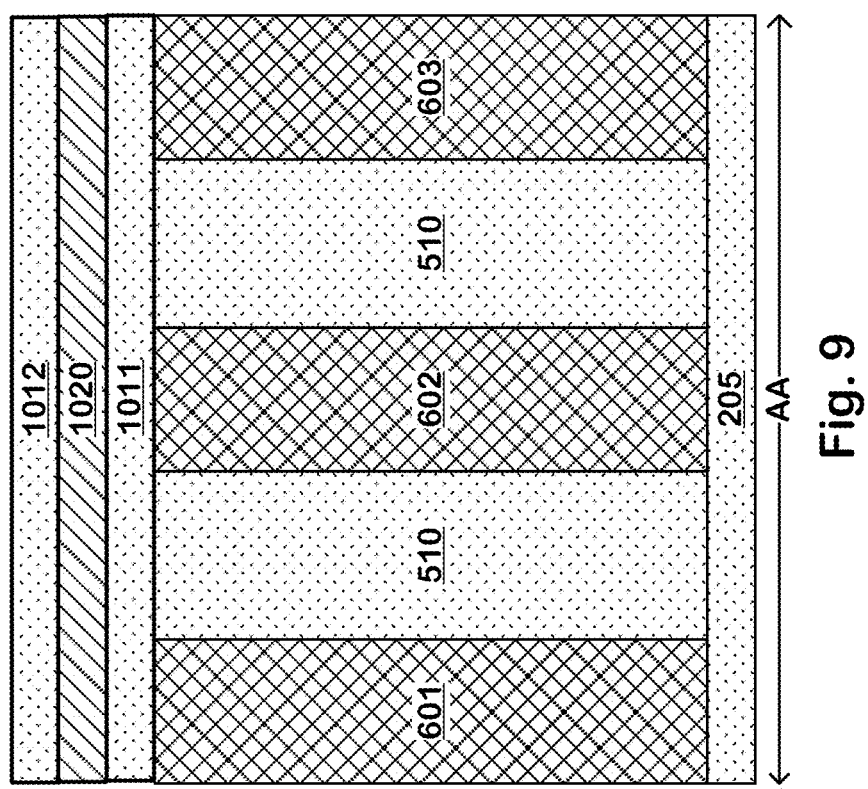
FIG. 9 is a cross-section on the line A-A of a structure like that of FIG. 6A in a later stage of manufacturing with overlying layers.

FIG. 9 is a cross-section like FIG. 7 on the line A-A, in a later stage after formation of a layer of insulator 1011, a layer of sacrificial material 1020 and the layer of insulator 1012 over the top of the stack, to be used for the formation of pillar select transistor structures. In combination, layers in this position are referred to as pillar select layers over the stack.

Figure 10:
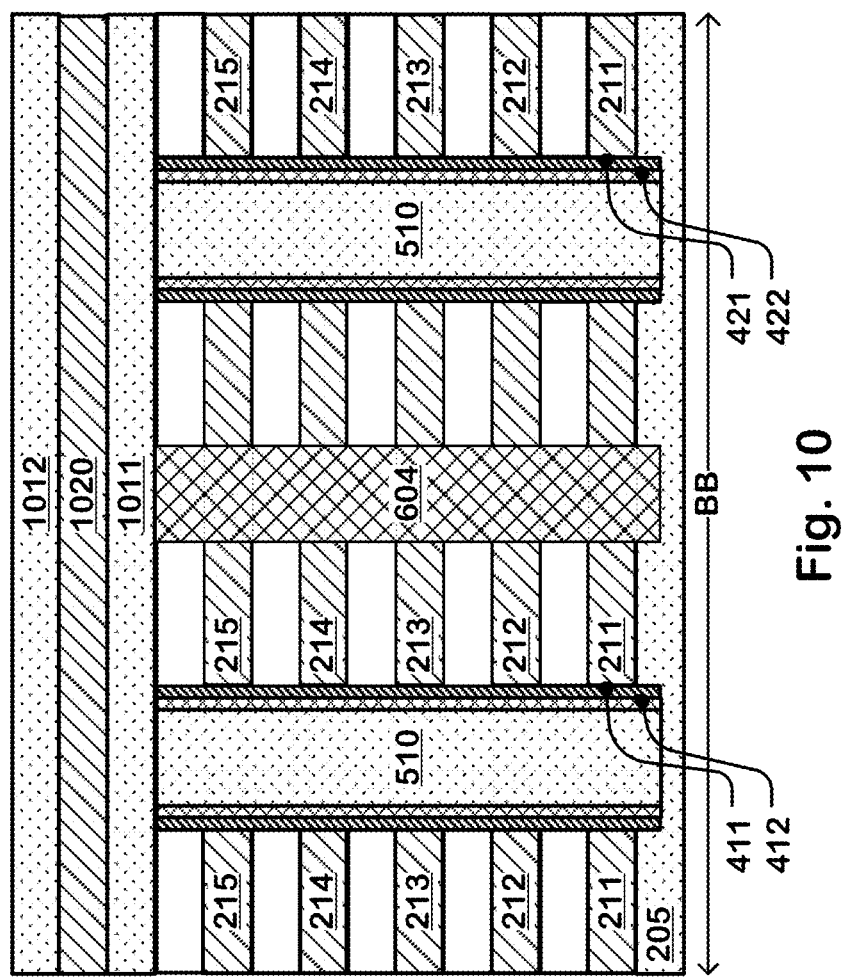
FIG. 10 is a cross-section on the line B-B of a structure like that of FIG. 6A in a later stage of manufacturing with overlying layers.

FIG. 10 is a cross-section is the same stage as FIG. 9, taken on the line B-B of FIG. 7, after formation of the layer of insulator 1011, the layer of sacrificial material 1020 and the layer of insulator material 1012 at the level of the pillar select transistors. The sacrificial material 1020 and the insulator 1011 can be the same materials as used in the stack in the alternating insulating layers and word line layers.

Figure 11B:
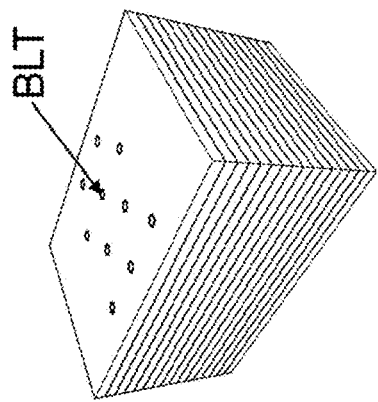
FIGS. 11A and 11B are a cross-section and a 3D perspective, respectively, of a stack after formation of holes for vertical bit line select transistors in a structure like that of FIG. 10.
Figure 11A:
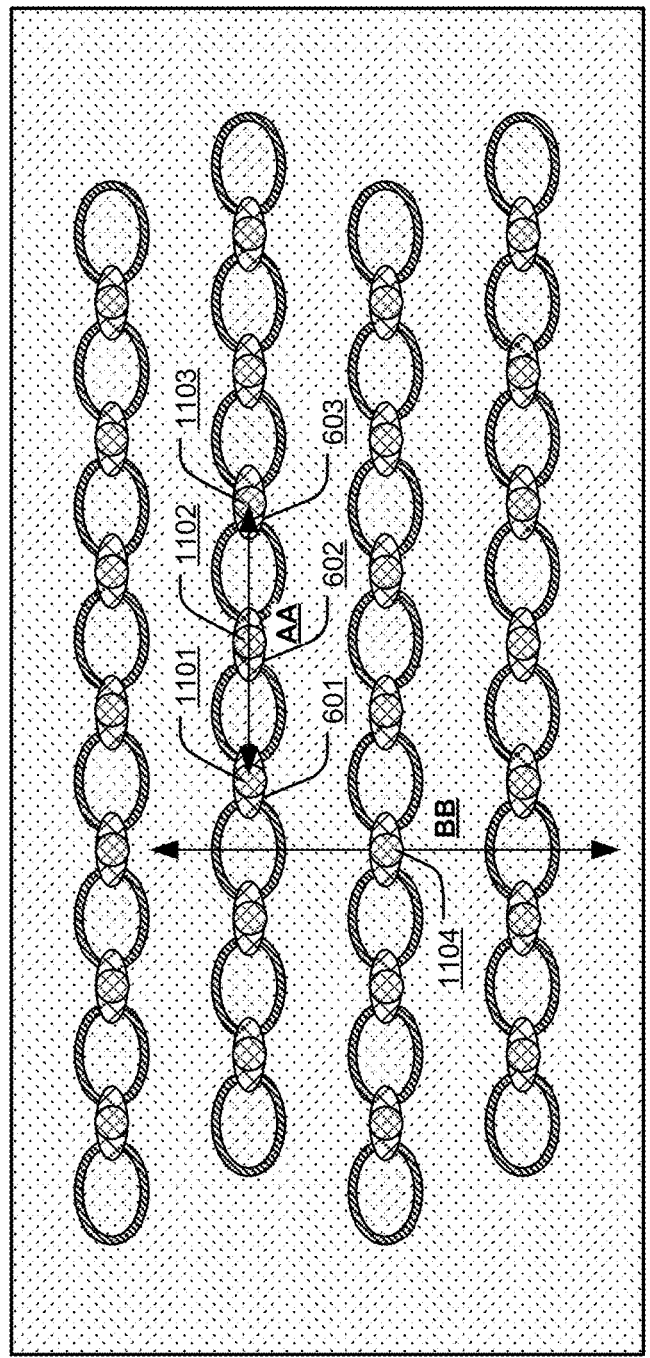

FIG. 11A is a top plan view of an embodiment of a 3D memory block 105 in an intermediate manufacturing stage after formation of structures used to implement pillar select transistors over the conductive pillars. As seen in the layout of FIG. 11A, contact pads 1101, 1102, 1103, 1104 are formed on top of the vertical channel structures of the pillar select transistors, which are in turn disposed on top of the conductive pillars. FIG. 11B is a 3D perspective showing the array of contact pads are exposed at a top of the stack.

FIG. 12 is a cross-section on the line A-A in the row direction of the structure shown in FIG. 11A in a later stage. Steps taken to form the pillar select transistors include etching an array of holes over the conductive pillars as illustrated in FIG. 11B, where the holes expose the top of the conductive pillars e.g. 601, 602, 603. Then, a layer of gate oxide material (e.g. 1211), such as silicon oxide, and a layer of channel material (e.g. 1212), such as polysilicon is disposed on the sides of the holes, such as by performing blanket depositions of the materials followed by a anisotropic spacer etch to remove material from the bottom of the holes in the top of the structure. After formation of the gate oxide material and channel material, the holes are filled with a silicon oxide, other insulator or other suitable material. Thereafter, an etch back process can be applied to remove material from the top of the holes leaving a recess in the upper surface. Then, a conductive polysilicon, such as N+ polysilicon, or other conductor can be deposited and planarized to form contact pads 1101, 1102, 1103. This procedure results in formation of pillar select transistor structures having source/drain terminals at corresponding conductive pillars and contact pads, and having vertical channels extending between the conductive pillars and the contact pads. The sacrificial material layer 1020 is replaced with a word line material as discussed further below.

FIG. 13A is a cross-section on the line B-B in the column direction of the structure shown in FIG. 11A. As seen, the conductive pillar 604 is disposed in a row of the array between insulating pillars 351 and 361 in adjacent rows. The structures for the pillar select transistors (e.g. 1210) are disposed over the conductive pillars 604. They are not disposed over the insulating pillars 351, 361.

FIG. 13B is a cross-section on the line B-B in the column direction of the structure shown in FIG. 11A, for the alternative embodiment in which a source line conductor 5205, such as a p-type conductor layer is disposed beneath the stack. In the structure, the conductive pillars 604 can be n-type or N+-type polysilicon, and the source line conductor 5205 can be p-type diffusion in semiconductor substrate, or other p-type semiconductor body. This results in formation of a PN junction 1301 at their intersection, such as junction 6332 shown in FIG. 56.

Figure 15:
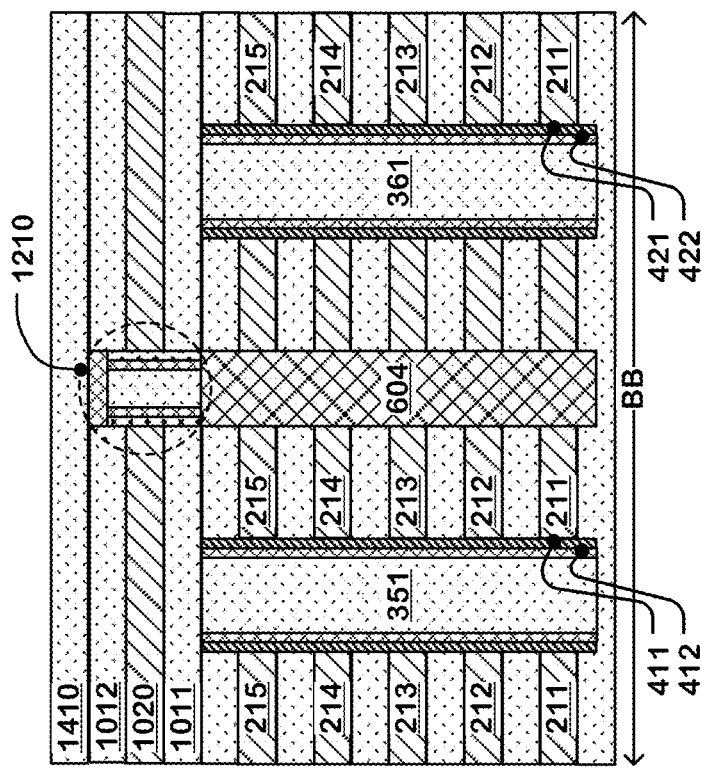
FIG. 15 is a cross-section of the stack on the line B-B of a structure like that of FIG. 11A after formation of a contact pad for vertical transistors.
Figure 14:
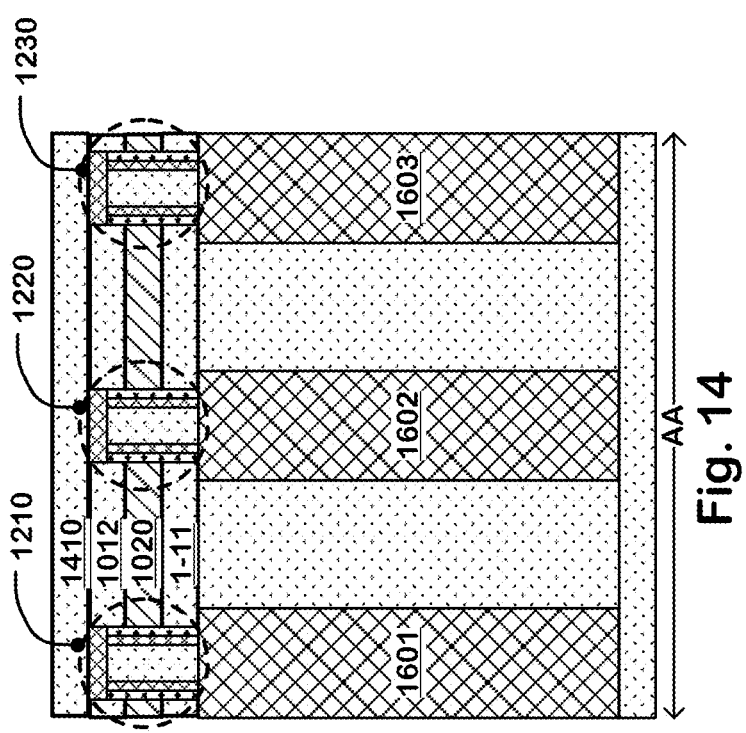
FIG. 14 is a cross-section of the stack on the line A-A of a structure like that of FIG. 11A after formation of a contact pad for vertical transistors.

FIGS. 14 and 15 are cross-sections on the line A-A and B-B respectively, illustrating the structure of FIGS. 12 and 13A after formation of a cap layer 1410 over the contact pads 1210, 1220, 1230. The cap layer 1410 can be a layer of silicon oxide or other material that can act as a hard mask or other type of protection for later processing steps.

Figure 16B:
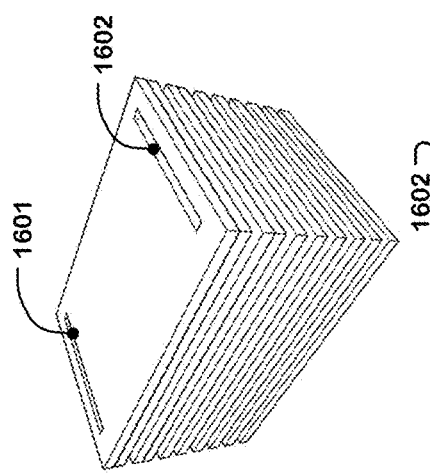
FIGS. 16A and 16B are a top plan view and a 3D perspective, respectively, of an embodiment of a stack having a structure of FIG. 15 after formation of slots to be used for replacement of sacrificial material.
Figure 16A:
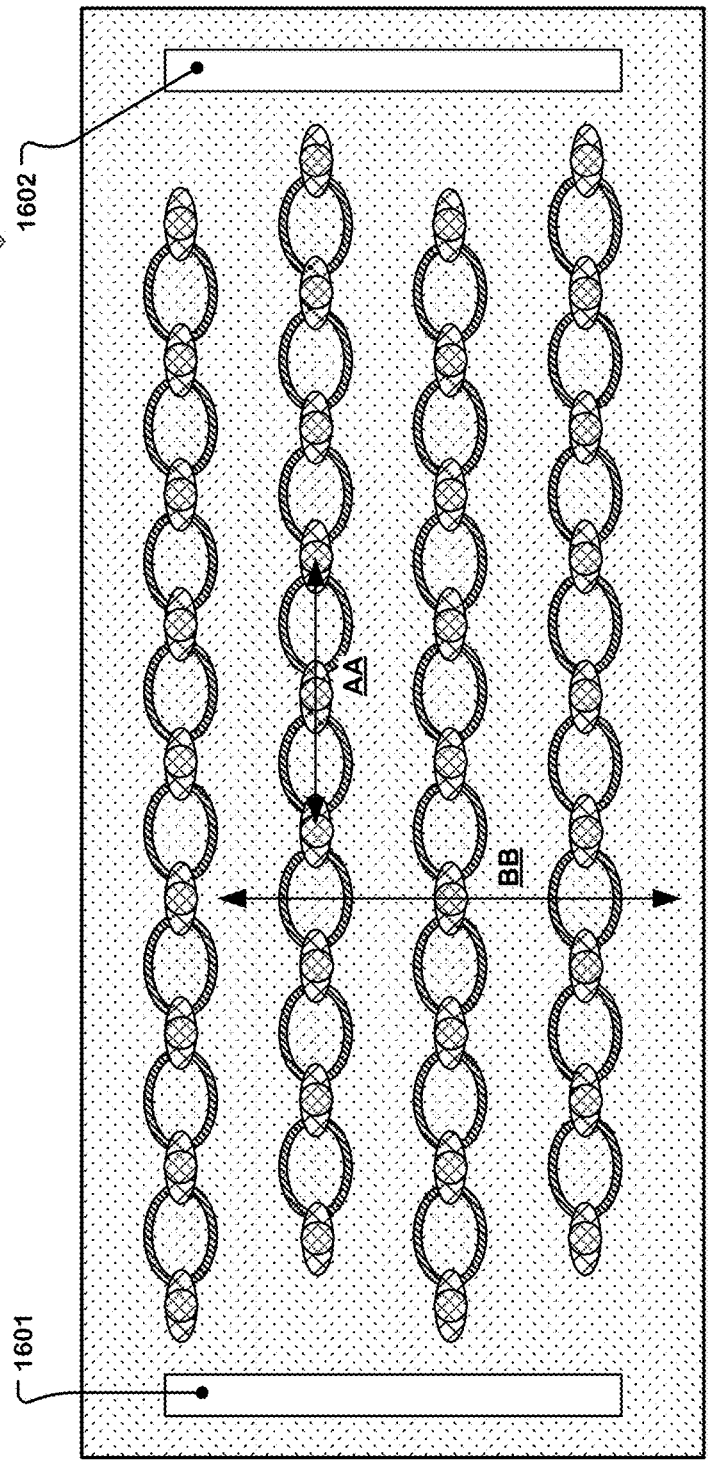

FIG. 16A is a top plan view (first cap layer 1402 transparent) of an embodiment of a 3D memory block 105 in an intermediate manufacturing stage after formation of slots 1601, 1602 through the stack to be used for the purposes of replacement of the sacrificial material.

FIG. 16B is a 3D perspective showing the array having slots exposed at a top of the stack through the layer 1402.

In this example, the slots 1601, 1602 are disposed in intervals of eight insulating pillars along the row direction, and extending the column direction across for series of alternating conductive pillars and insulating pillars. The length of the intervals can be defined for example by parameter M, where the length of the intervals specified by the count of the number of insulating pillars, is equal to $2^M$. The parameter M can be any positive integer, including one, two, three, four. In the illustrated example M=3. The length of the slots in the column direction in this example is equal to about four rows. Again, the length of the slots in a column direction can be selected according to a particular embodiment.

FIGS. 17 and 18 are cross-sections on the line A-A and B-B respectively, illustrating the structure of FIG. 16A, showing results of replacement of the sacrificial material in the word line layers and at the layer of the pillar select transistors, with a word line material.

Replacement of the sacrificial material can be accomplished by applying a etch process which removes the exposed sacrificial material in the word line layers 211-215, and in the pillar select layer through the slots 1601, 1602, while leaving the insulator material in layers 205-210, and 1011, 1012. Next, the word line material is deposited into the voids left by removal of the sacrificial material. Thus, as illustrated in FIGS. 17 and 18, the word line layers (2111-2115) and pillar select gate layer (1815) are represented by crosshatching like that of the vertical conductive pillars. Note that the material of the word lines and the pillar select gates (substantially tungsten in this example) may not be the same as that used in the vertical conductive pillar (N+ polysilicon as described above) as discussed above.

In some embodiments, prior to depositing word line material, a high dielectric constant liner (2151) can be deposited in the voids, having a dielectric constant higher than silicon dioxide for example or higher than the insulator material used in the alternating layers 205-209. This high dielectric constant liner 2151 can comprise an aluminum oxide, hafnium oxide, or zirconium oxide or other high K (where high K means a dielectric constant K is greater than 7) material that can act as the blocking layer or as part of the blocking layer of the dielectric charge trapping memory structure that lines the insulating pillars. This results in a high-K dielectric between conductive pillars in the series and the word line material in the layers of word line material. The high K material also electrically isolates the word line material (e.g. 2111) from the conductive pillars (e.g. 604). Also, in other embodiments, additional materials of the dielectric charge trapping memory structure can be deposited in this manner, such as the charge trapping layer including silicon nitride for example, and the blocking layer including one or more layers of an insulator such as a high K aluminum oxide, hafnium oxide or zirconium oxide. In this case, after formation of the holes to be used for the insulating pillars, only parts of the memory storage structure that are not deposited during the gate replacement process need to be applied on the sidewalls of the openings. In some embodiments, the word line material is formed by first depositing a liner of titanium nitride or other suitable adhesion/barrier liner into the voids (optionally covering the liners mentioned above), followed by a deposition of tungsten through the slots. After depositing the material into the voids, the tungsten/titanium nitride material is then etched back out of the slots to break conductive paths between the word line layers and the pillar select layer in the region of the array.

Figure 19:
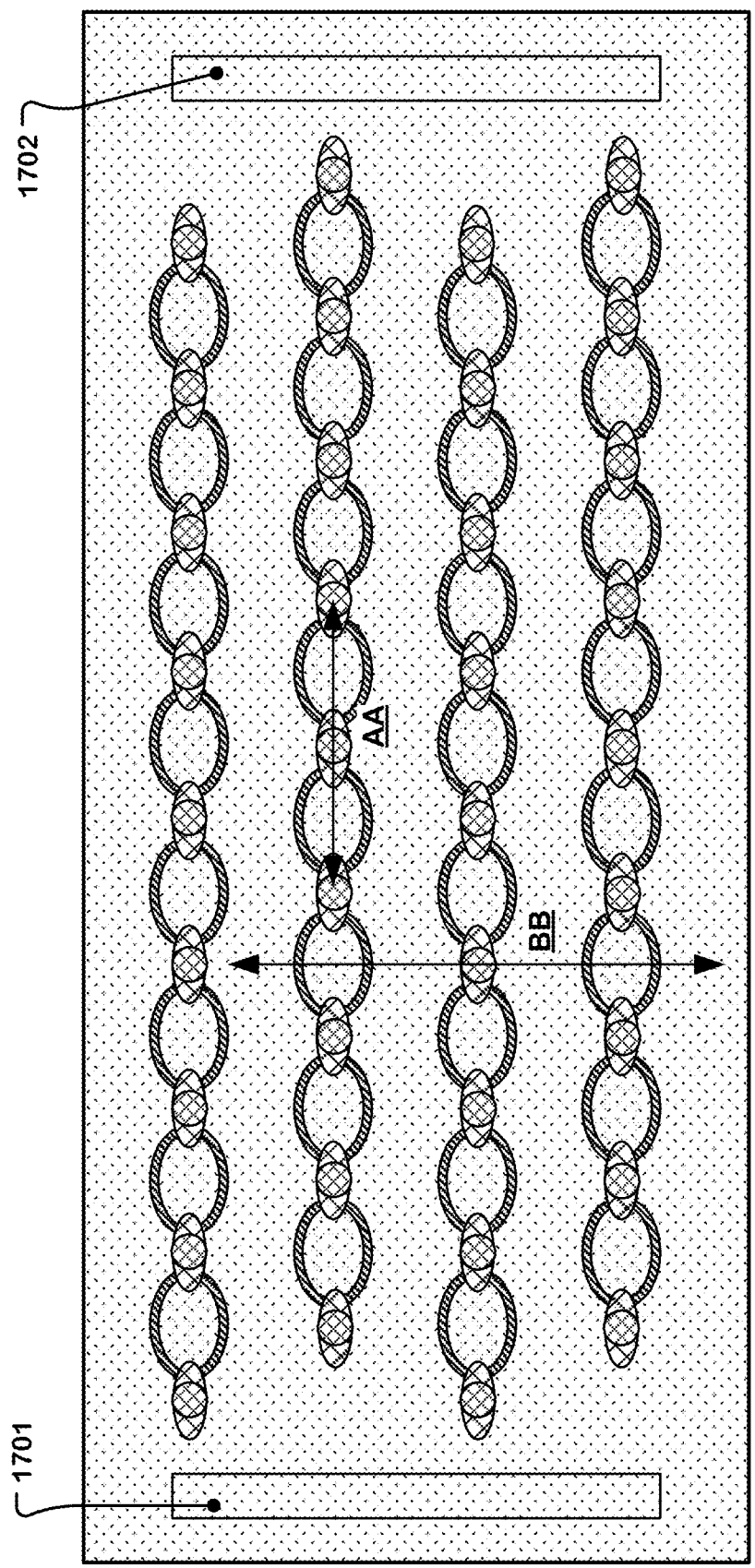
FIG. 19 is a top plan view of an embodiment of a stack having a structure of FIG. 16A after filling the slots to be used for replacement of sacrificial material.

FIG. 19 illustrates the top plan view after filling the slots with insulator material. After the etch back, the slots are filled with an insulator 1701, 1702 in this embodiment.

Figure 20B:
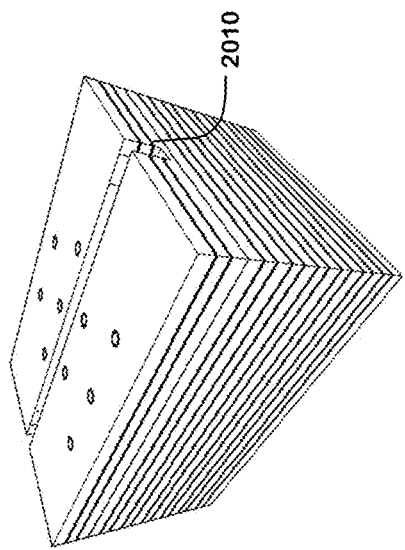
FIGS. 20A and 20B are a top plan view and a 3D perspective, respectively, of an embodiment of a stack having a structure of FIG. 19 after formation of slots through a pillar select layer.
Figure 20A:
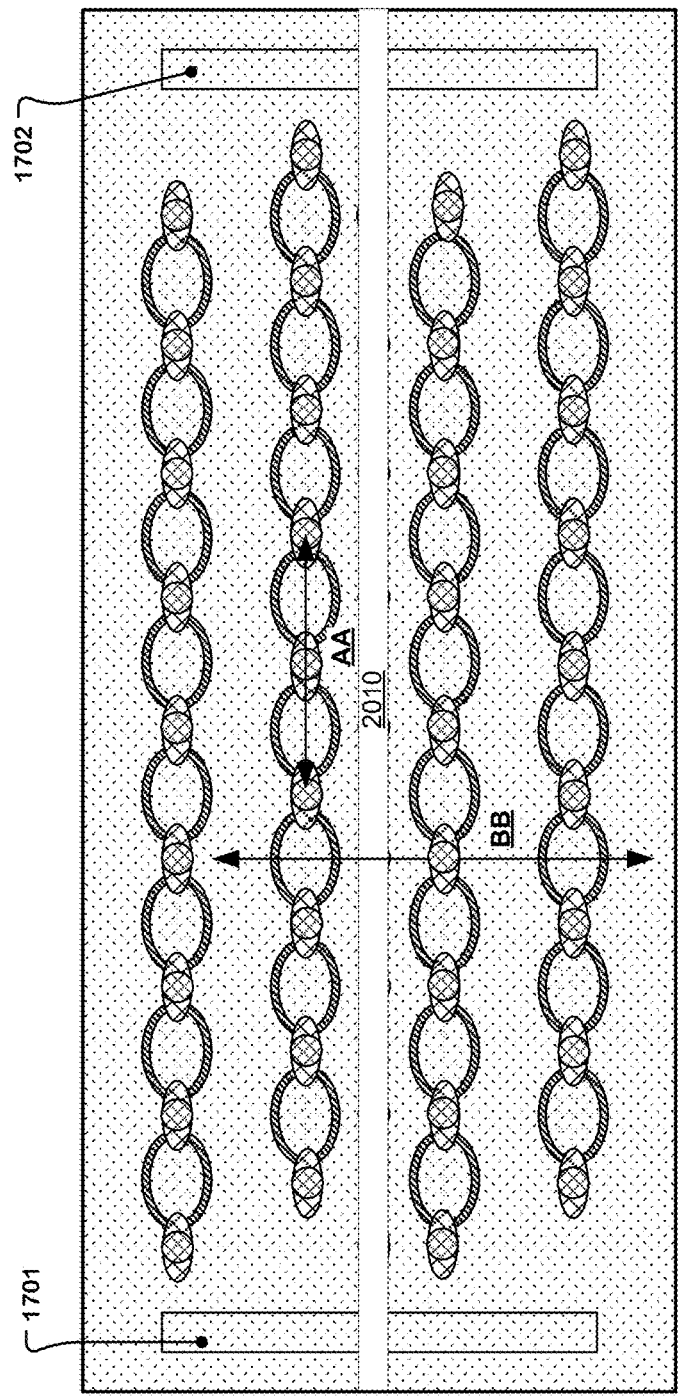

FIG. 20A illustrates the top plan view after forming cut 2010 through the pillar select gate layer forming a shallow trench that stops for the top word line layer of the stack. FIG. 20B is a 3D perspective view illustrating this shallow cut 2010 to form the distinct pillar select gates (also called bit line transistor BLT lines), used to select distinct subarrays of the memory array as discussed above. In the example illustrated in FIG. 20A, the cut 2010 is disposed between series of alternating insulating pillars in conducting pillars.

Figure 21:
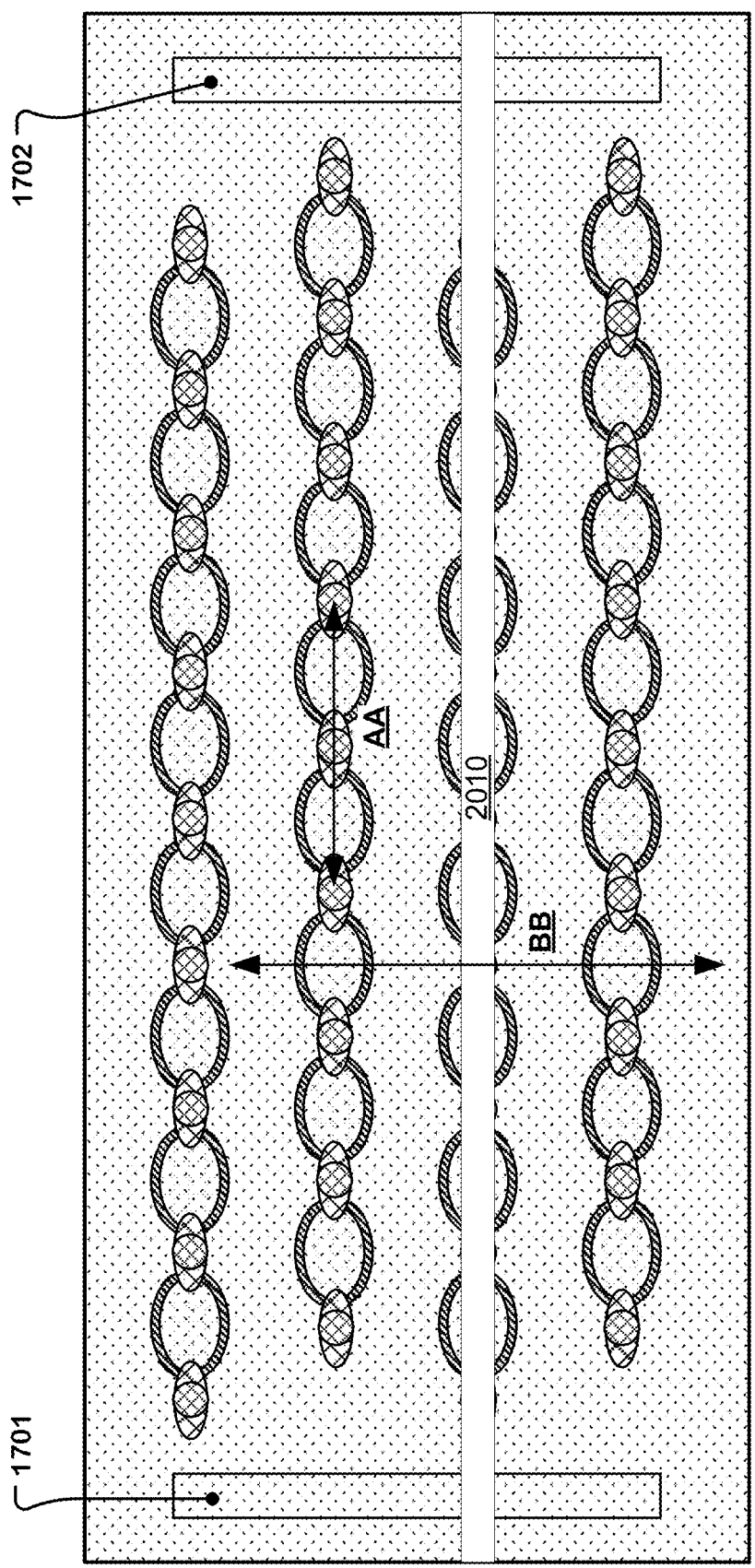
FIG. 21 is a top plan view of an embodiment of a stack having a structure of FIG. 19 after formation of slots through a pillar select layer in an alternative arrangement.

FIG. 21 illustrates subassembly with an alternative positioning for the cut 2010, in which it is disposed over a series of dummy insulating pillars and conductive pillars. The approach of FIG. 21 may allow formation of the stack with the array of pillars in a manner that reduces the variation in the structure of the pillars along the edges between the cuts, and they allow a denser array layout.

Figure 22:
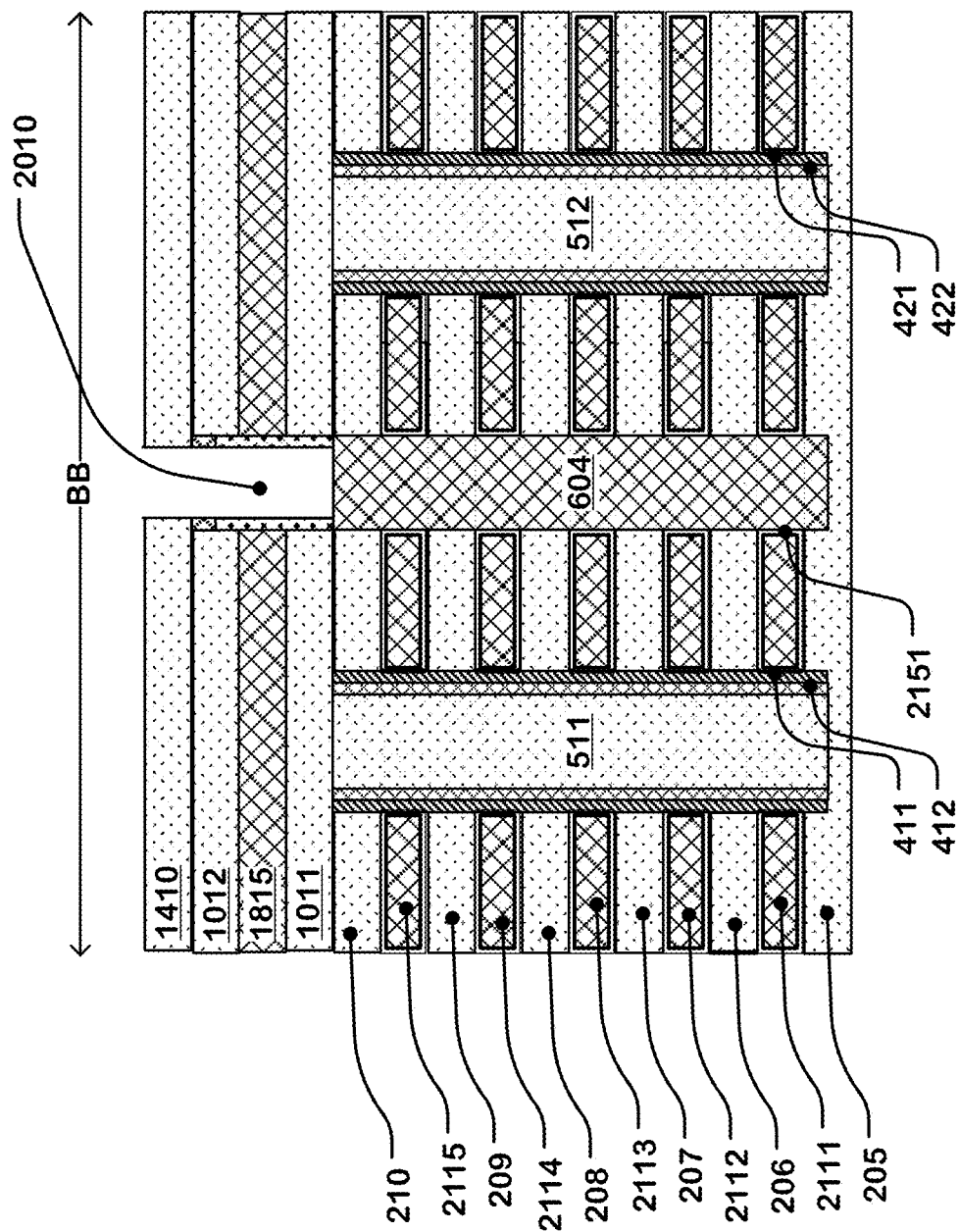
FIG. 22 is a cross-section of the stack on the line B-B of an embodiment of the stack like that of FIG. 21.

FIG. 22 is a cross-section in a column direction on the line B-B of FIG. 21 illustrating the cut 2010 which forms a gap separating the conductive layer 1815 into a plurality of conductive strips, in which a corresponding conductive strip of the plurality of conductive strips, is formed for each distinct subarray of the array. As a result, a plurality of vertical channel structures through the corresponding conductive strip for each distinct subarray contacts conductive pillars in the distinct subarray.

Figure 23B:
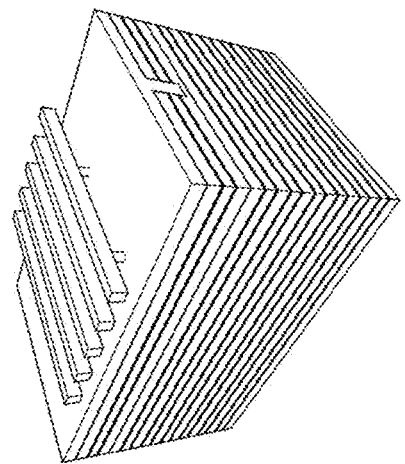
FIGS. 23A and 23B are a top plan view and a 3D perspective, respectively, of an embodiment of a stack having a structure of FIG. 21 after formation of overlying bit line structures.
Figure 23A:
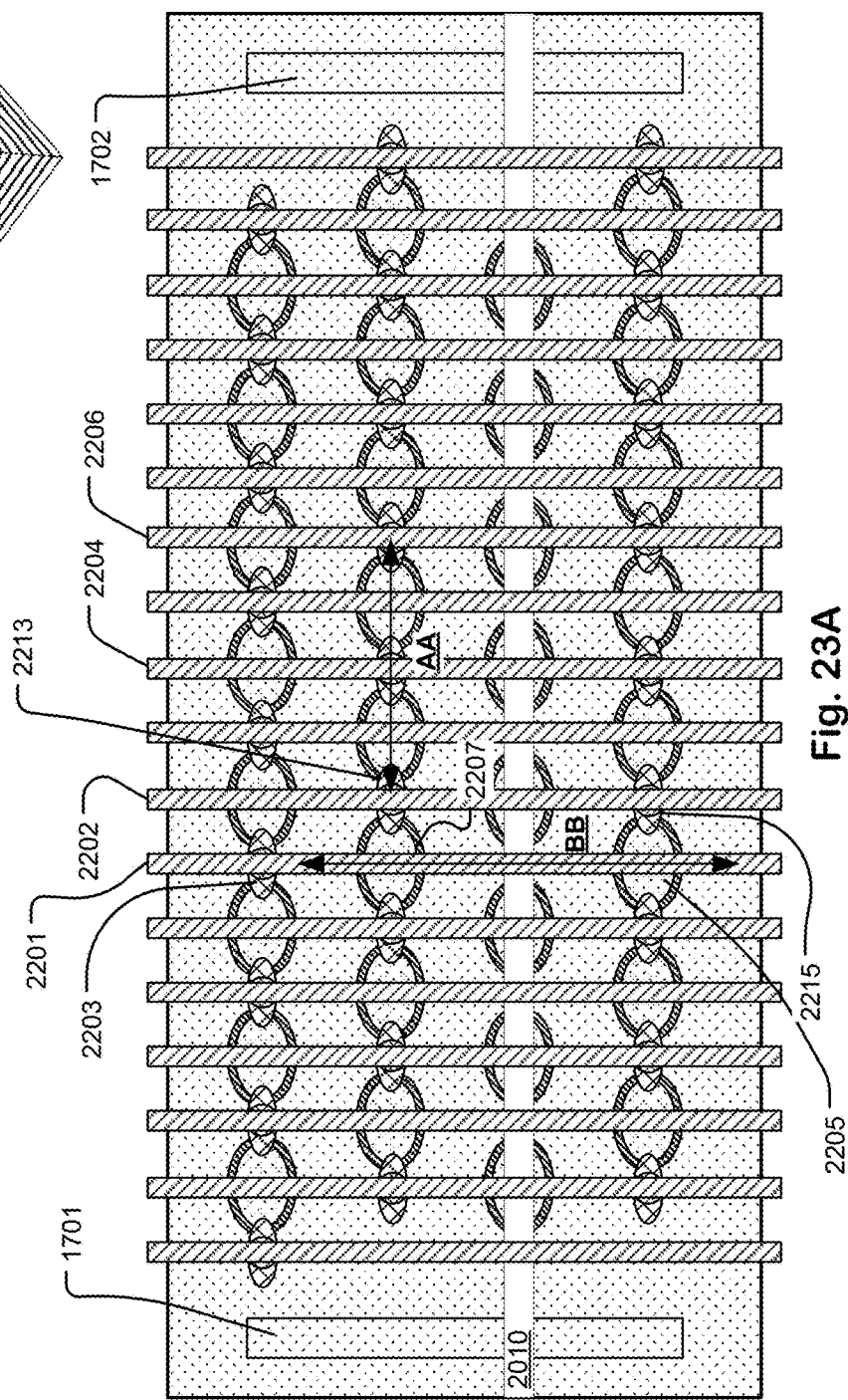

FIG. 23A is a top plan view of the structure after a process to form overlying bit lines (e.g. 2201, 2202, 2204, 2206). This process can include deposition of an interlayer dielectric over the pillar select transistor contact pad, formation of bit line contact plugs through the interlayer dielectric, and then forming and patterning of the metal at the layers of the bit lines to form the bit lines. The bit lines are configured so that they contact at most one vertical conductor structure in each distinct subarray. Thus, the bit line 2201 contacts a vertical conductor structure 2203 in the subarray at the top above the gap 2010, and traverses over the insulating pillar 2207 above the gap 2010 and insulating pillar 2205 below the gap 2010, to a vertical conductor structure (not shown) below the vertical insulating pillar 2205 at the bottom, below the gap 2010. Also, the bit line 2202 contacts the vertical conductor structure 2213 above the gap 2010 and the vertical conductor structure 2215 below the gap 2010. FIG. 23B is a 3D perspective view of the structure after formation of the bit lines. The bit lines are arranged in the column direction in this example, orthogonal to the row direction in which the series of alternating conductive pillars and insulating pillars are formed.

Figure 24:
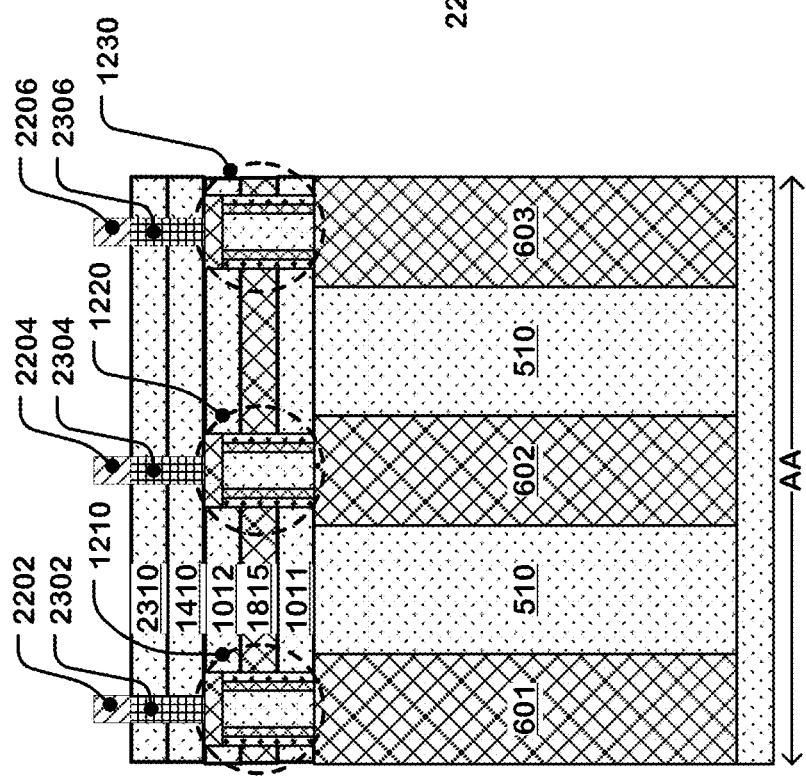
FIG. 24 is a cross-section of the stack on the line A-A of a structure like that of FIG. 23A.

FIG. 24 is a cross-section on the line A-A of the plan view of FIG. 23A after formation of the bit lines. As seen, bit line contacts 2302, 2304, 2306 are formed between the contact pads of the vertical transistor structures (1210, 1220, 1230) and the overlying bit lines (2202, 2204, 2206).

Figure 25:
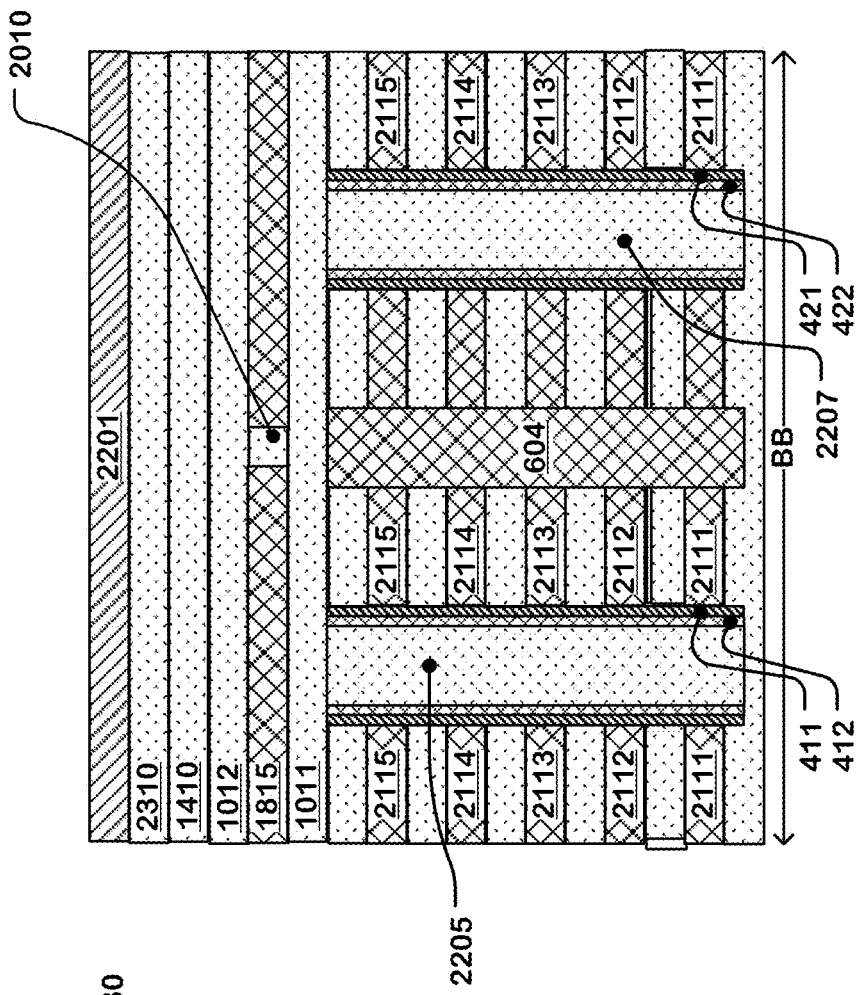
FIG. 25 is a cross-section of the stack on the line B-B of a structure like that of FIG. 23A.

FIG. 25 is a cross-section on the line B-B of the structure of FIG. 23A, illustrating, the gap or cut 2010 forming the distinct pillar select gate structures for each distinct subarray. Although not shown, the gap 2010 can be cut through a pillar select transistor structure formed with the pillar select transistors for active conductive pillars in the array, in some embodiments.

The layout of the gap or cuts 2010 in the pillar select layer corresponds to the arrangement of the distinct subarrays in the array. The cut 2010 can be defined between each row in which case each distinct subarray includes only one series of alternating conductive pillars and insulating pillars. The cut 2010 can be defined pairs of rows, where each distinct subarray includes two series of alternating conductive pillars and insulating pillars. The spacing between the gaps can be set at any number. For example, the parameter P can be used to define the number $2^P$ of series of alternating conductive pillars and insulating pillars in each distinct subarray, where P can be any integer, such as one, two, three and so on. A larger number of series of alternating conductive pillars and insulating pillars in each distinct subarray, may require higher density of bit lines relative to the density of the pillars in order to make sufficient number of contacts.

Figure 26:
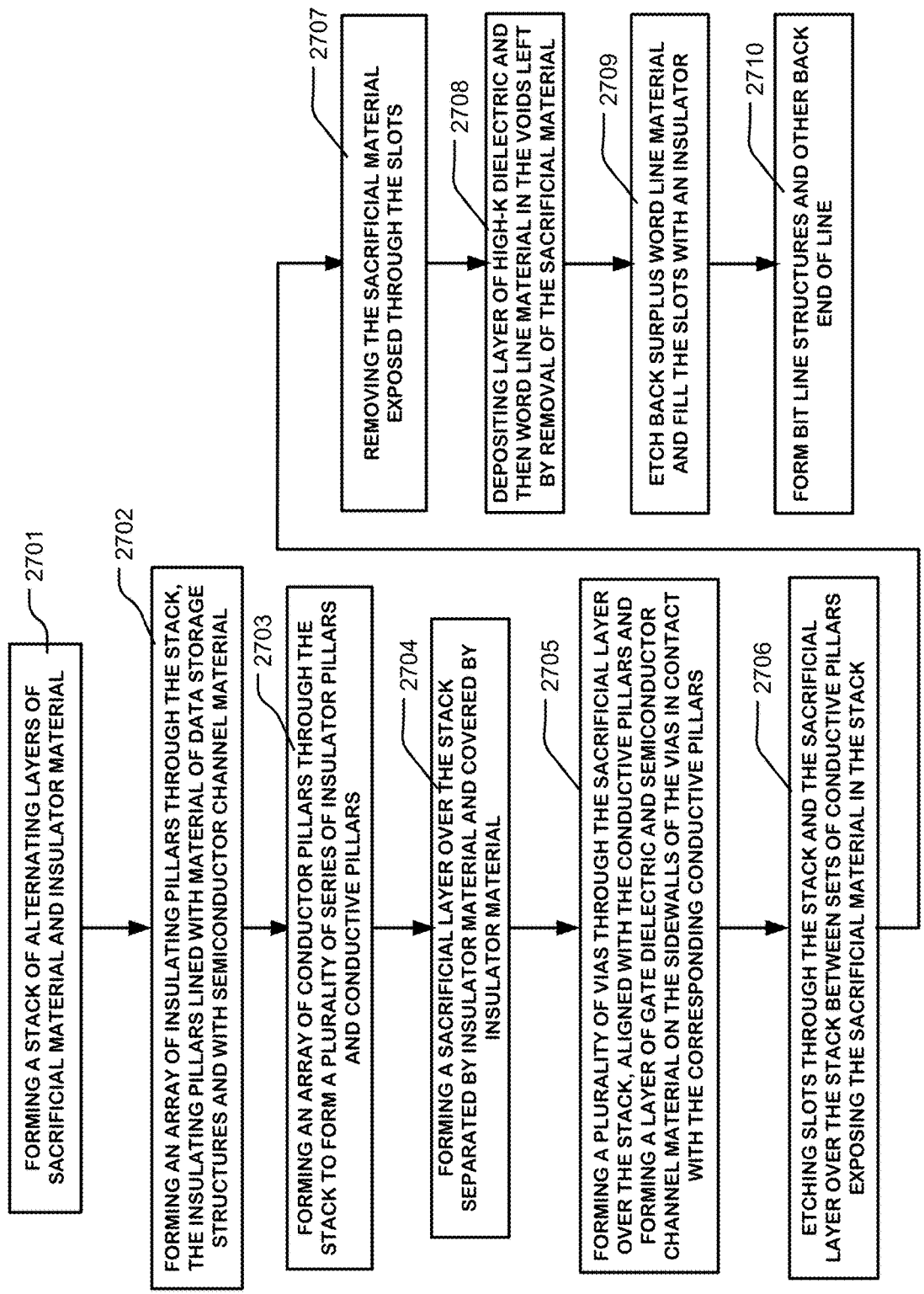
FIG. 26 is a flowchart of a manufacturing method like that represented by FIGS. 2-25.

FIG. 26 is a flowchart of a manufacturing process such as discussed above in connection with FIGS. 2 through 25. As illustrated in the flowchart, the procedure begins with forming a stack of alternating layers of sacrificial material and insulator material on a substrate (2701). The substrate can comprise an integrated circuit substrate including logic circuits adjacent to the stack and beneath the stack in some cases that can be used to implement peripheral circuitry for the memory device. After forming the stack, an array of insulating pillars is formed through the stack by etching holes in the selected pattern, lining the holes with material of the data storage structure, such as one or more layers of a multilayer dielectric charge storage structure, and then lining the material of the data storage structure with semiconductor channel material (2702). Next in the flowchart, an array of conductive pillars is formed through the stack arranged in a pattern that results in formation of a block including a stack of insulating layers and sacrificial layers in which plurality of series extending in a row direction of alternating insulating pillars and conductive pillars extend through the stack (2703).

Next in the flowchart, the method includes forming a sacrificial layer over the stack, separated by insulating layers above and below the sacrificial layer to be used to form pillar select transistors (2704). A plurality of holes are formed through the sacrificial layer over the stack, which are aligned with the conductive pillars. The holes are lined with the gate dielectric and a semiconductor channel material on the sidewalls in a manner that results in the semiconductor channel material in contact with corresponding conductive pillars (2705). Also, contact pads can be formed on the tops of the holes, the contact pads contacting the semiconductor channel material to provide a current flow path from the corresponding conductive pillar to the contact pad.

In the embodiment of FIG. 26, a plurality of slots are etched through the stack and through the sacrificial layer over the stack. The slots are arranged at intervals in the row direction between, for example every set of eight insulating pillars and nine conductive pillars in the series, and extending in the column direction across a plurality of series, for example across four or eight series. The slots exposing the sacrificial material in the stack and in the layer of sacrificial material over the stack (2706). After exposing the sacrificial material, the sacrificial material is removed through the slots leaving voids at the locations of word lines and the pillar select lines for the memory array implemented in this block (2707). Thereafter, word line material such as tungsten is deposited in the voids left by removal of the sacrificial material. In some embodiments, the deposition of word line material is preceded by formation of a liner of a high dielectric constant insulator, or by one or more layers of the multilayer charge storage structure to be formed at the cross point of the word lines and the insulating pillars (2708). After deposition of the word line material, surplus material is removed from inside the slots, and the slots are filled with an insulator in this embodiment (2709).

Thereafter, bit line structures and other back end of line operations can be executed to complete the device (2710).

In general, FIG. 26 illustrates an example of a method for manufacturing a vertical memory structure that includes forming a block comprising a stack of alternating layers of insulator material and word line material and forming a plurality of distinct series of alternating conductive pillars and insulating pillars arranged in an array and penetrating through the stack. Also, the manufacturing method includes forming data storage structures disposed on the inside surfaces of the layers of word line material at cross points of the insulating pillars and the layers of word line material. The method also includes forming a semiconductor channel material between the insulating pillars and the data storage structures at cross points of the insulating pillars with layers of word line material. The semiconductor channel material can be an arcuate layer which extends around an arcuate outside surface of the insulating pillars, and contacts adjacent conductive pillars on both sides in a manner, such as an ohmic contact, that establishes a source/drain terminals at the contacts. Also, the method results in forming a plurality of conductive strips in a pillar select layer over the stack. The plurality of conductive strips includes for each distinct subarray of the array, a corresponding conductive strip acting as a gate for a plurality of vertical channel structures for the distinct subarray. Furthermore, the method includes forming bit line conductors over the pillar select layer over the stack. In embodiments described herein, each bit line conductor has a contact to one vertical channel transistor in each of the distinct subarrays of the array in the stack.

Figure 27:
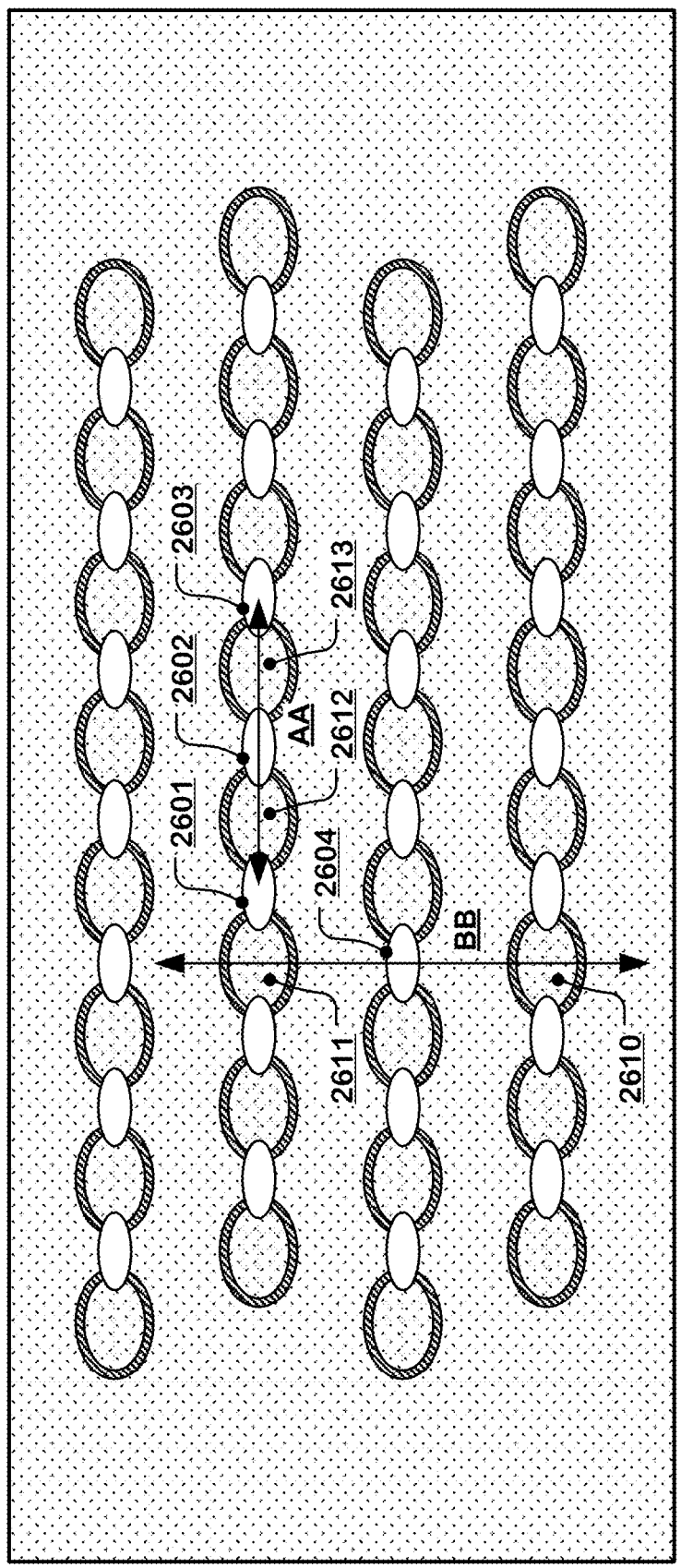
FIG. 27 is a top plan view of a stack including an array of second holes disposed between the first holes, to form series of alternating first holes and second holes through the stack, like that of FIG. 6A without conductor material filling the second holes.

Integrated circuit memory structures to implement memory arrays can be represented by the schematic diagrams in FIGS. 55 and 56, also can be manufactured in a number of processes, some of such processes can be understood with reference FIG. 27 to FIG. 42. FIGS. 27-42 illustrate stages in a manufacturing process for an alternative embodiment, in which slots are not used for replacement of the sacrificial material. This manufacturing process proceeds as discussed above in FIG. 6A, in which the array of holes is formed to be used for formation of conductive pillars disposed in the plurality of series. FIG. 27 therefore is like FIG. 6A, with the exception that the holes are not filled with conductor material.

FIG. 27 is a top plan view of an embodiment of a 3D memory block in an intermediate manufacturing stage after etching an array of second holes (e.g. 2601, 2602, 2603, 2604), in which conductor material is to be deposited in a later stage to form the conductive pillars of a plurality of series of alternating conductive pillars and insulating pillars (e.g. 2610, 2611, 2612, 2613).

Figure 28:
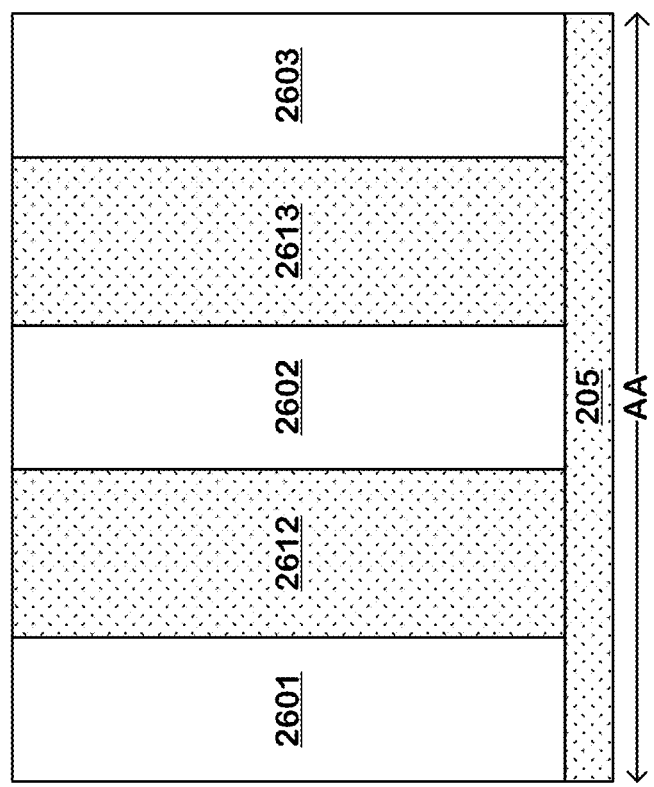
FIG. 28 is a cross-section of the stack on the line A-A of a structure like that of FIG. 27.

FIG. 28 is a cross-section of the structure of FIG. 27 taken in the row or X direction on the line A-A. As seen, the holes 2601, 2602, 2603 are disposed in an alternating fashion with insulating pillars 2612, 2613. Because the cross-section is taken on a centerline of the row, the semiconductor channel layer and the memory structure layers which extend around outside surfaces of the insulating pillars are not intersected in this cross-section for this embodiment.

Figure 29:
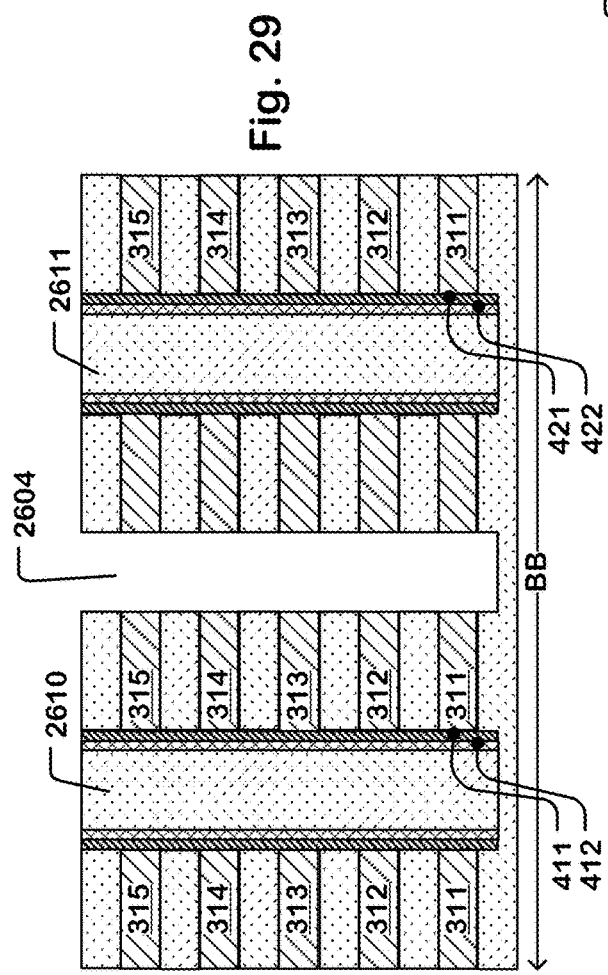
FIG. 29 is a cross-section of the stack on the line B-B of a structure like that of FIG. 27.

FIG. 29 is a cross-section of the structure of FIG. 27 taking in a column or Y direction on the line B-B. As seen, insulating pillars 2610, 2611 are disposed in separate rows along the column. An intermediate row along the column includes the conductive pillar 2604. At the word line layers, the sacrificial material 311-315 extends around the insulating pillars and the holes for the conductive pillars in the locations of word lines to be formed after replacement of the sacrificial material.

Figure 30:
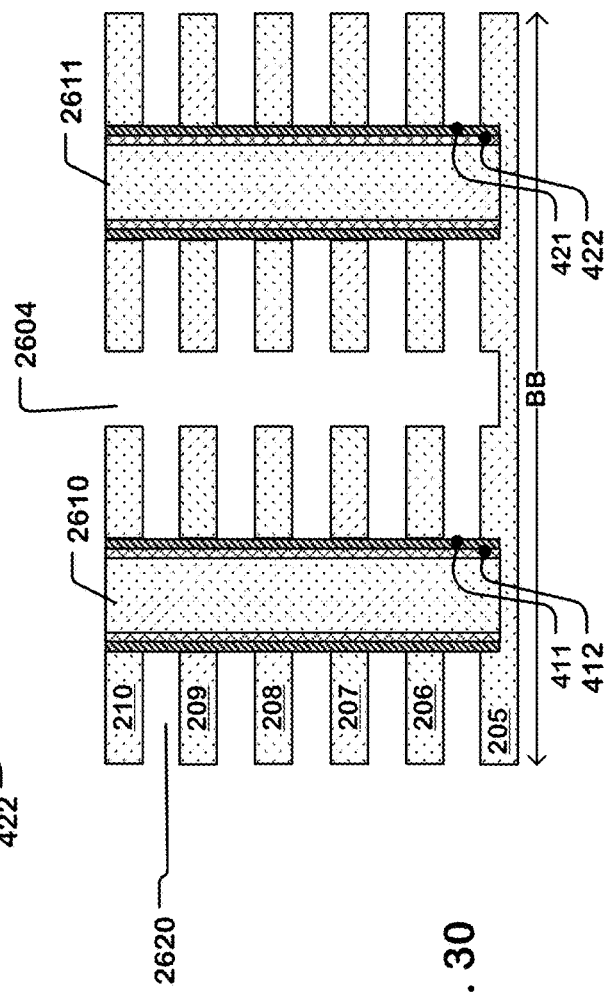
FIG. 30 is a cross-section of the stack on the line B-B of a structure like that of FIG. 29 after removal of sacrificial material.

FIG. 30 illustrates a subassembly in the cross-section shown in FIG. 29 after a procedure is executed to remove the sacrificial material through the holes (e.g. 2604) to be used to form the conductive pillars. For this embodiment, it may be preferred to use a sacrificial material such as a silicon germanium, which can be more readily removed between the insulating pillars by selective etching than in some embodiments using silicon nitride. As seen, the removal of the sacrificial material results in formation of voids (e.g. 2620) between the insulator layers into which word line material can be deposited. In this embodiment, the additional slots disposed in intervals along the series of alternating insulating pillars and conductive pillars are optional, and can be omitted in some embodiments to improve the density of the array layout. As illustrated, the material of the data storage structure, or in some embodiments, some of the material of the multilayer data storage structure, that extends around the outside surfaces of the insulating pillars (e.g. 2610) is exposed within the voids.

Figure 31:
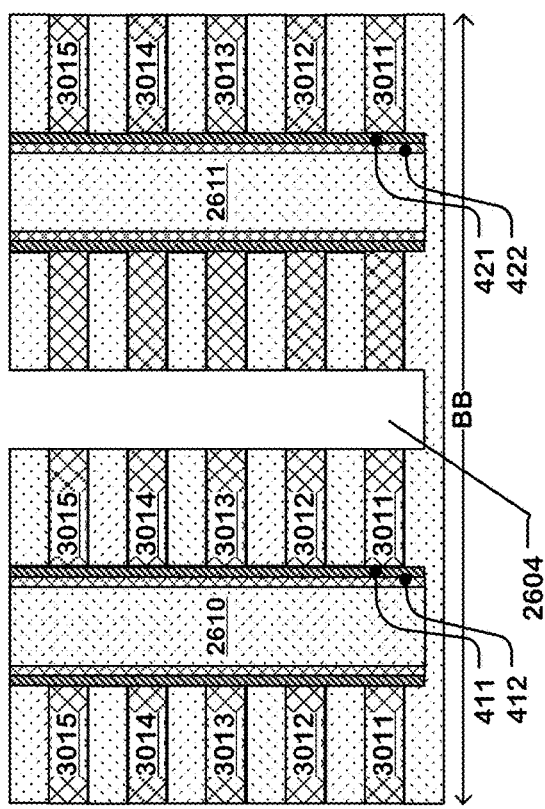
FIG. 31 is a cross-section of the stack on the line B-B of a structure like that of FIG. 30 after filling the voids left by removal of the sacrificial material with word line material.

FIG. 31 illustrates a subassembly following structure of FIG. 30 after executing a process to fill the voids with a word line material such as a titanium nitride liner with tungsten fill, forming word line layers 3011-3015. As mentioned above, in some embodiments, the filling of the voids may include a deposition of a high dielectric constant insulator film or other dielectric films, which can act as part of the data storage structure in the completed product. This procedure involves depositing the material and then etching back the material to reopen the holes (e.g. 2604).

Figure 32:
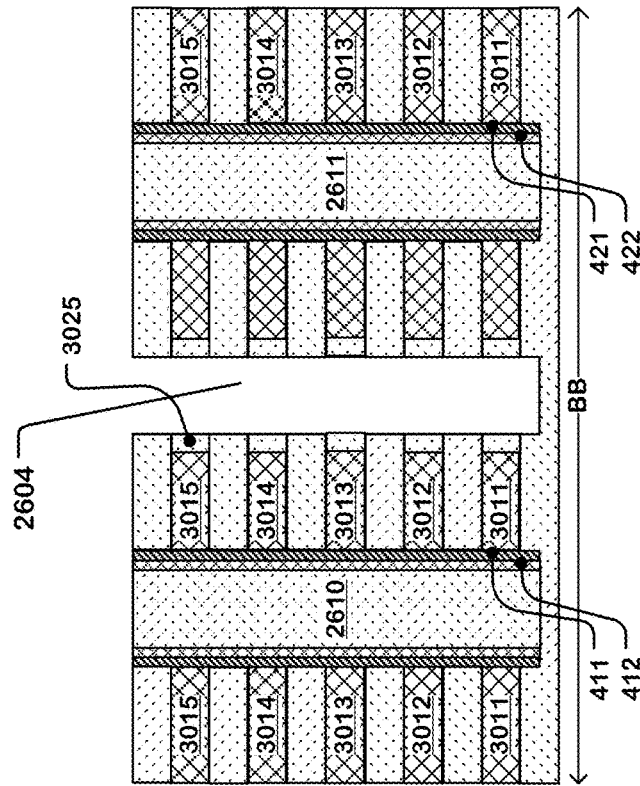
FIG. 32 is a cross-section of the stack on the line B-B of a structure like that of FIG. 28, after forming a seal in the open holes.

FIG. 32 illustrates a structure like that of FIG. 31, after executing a procedure to form recesses in the titanium nitride/tungsten fill, and then forming an oxide or other insulator side wall (e.g. 3025) within the recesses, for the purposes of isolating the word line structures from the conductive pillar to be formed in the hole 2604. This can be accomplished by filling the hole 2604 with a silicon oxide or other suitable material, and then anisotropically etching back the fill. As a result, the channel layers (412, 422) are exposed and may protrude at the top of the stack.

Figure 33:
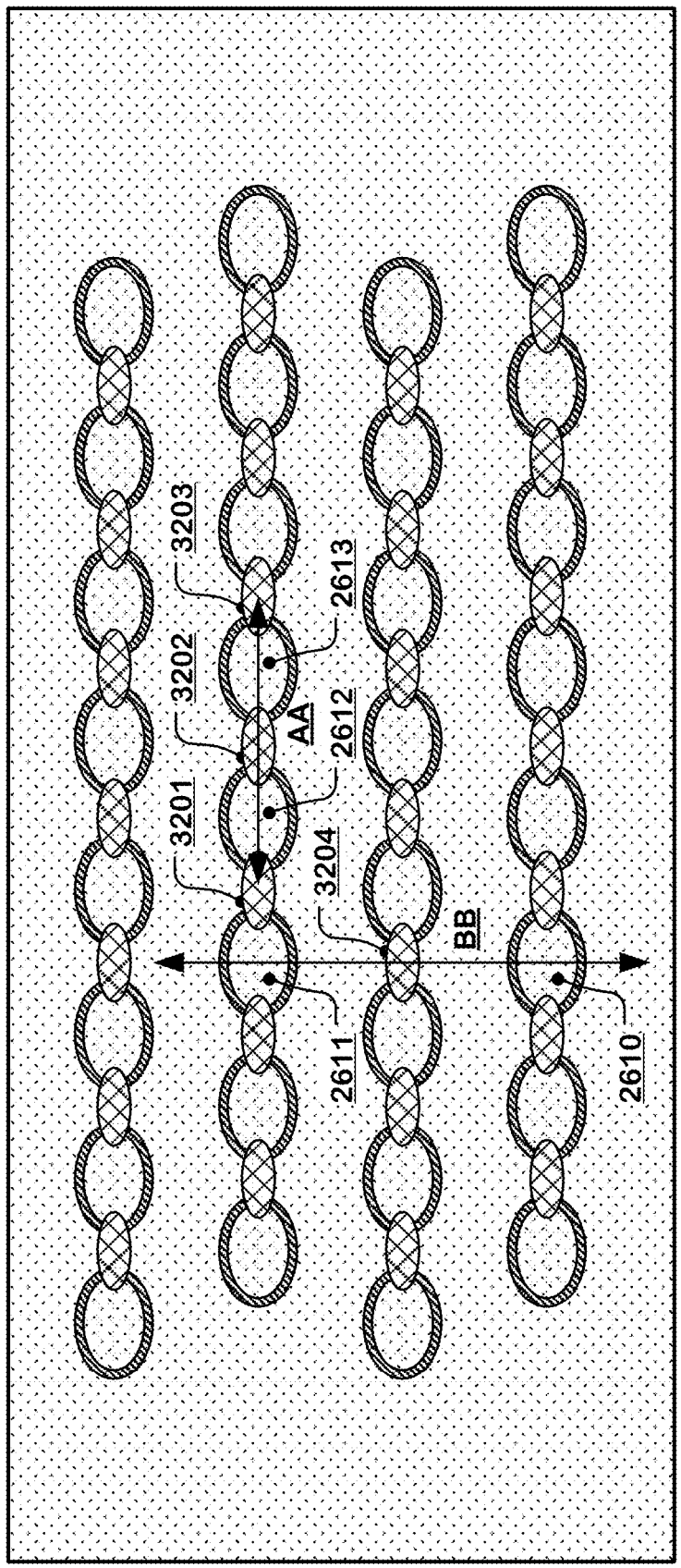
FIG. 33 is a top plan view of a stack including of alternating insulating pillars and conductive pillars through the stack, like that of FIG. 32.

FIG. 33 is a top plan view of the resulting structure after filling the holes illustrated in FIG. 31 with a conductor material, such as an n-type polysilicon, to form conductive pillars (e.g. 3201, 3202, 3203, 3204) in the place of the holes, followed by a planarizing step to smooth the top surface.

Figure 34:
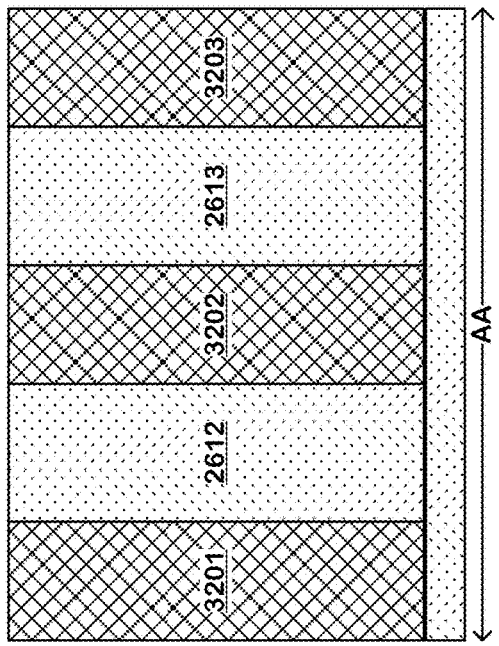
FIG. 34 is a cross-section of the stack on the line A-A of a structure like that of FIG. 33.

FIG. 34 is a cross-section of the structure of FIG. 33 taken in the row or X direction on the line A-A. As seen, the conductive pillars (e.g. 3201, 3202, 3203) are disposed in an alternating fashion with insulating pillars 2612, 2613. Because the cross-section is taken on a centerline of the row, the semiconductor channel layer and the memory structure layers which extend around outside surfaces of the insulating pillars are not intersected in this cross-section for this embodiment.

Figure 35:
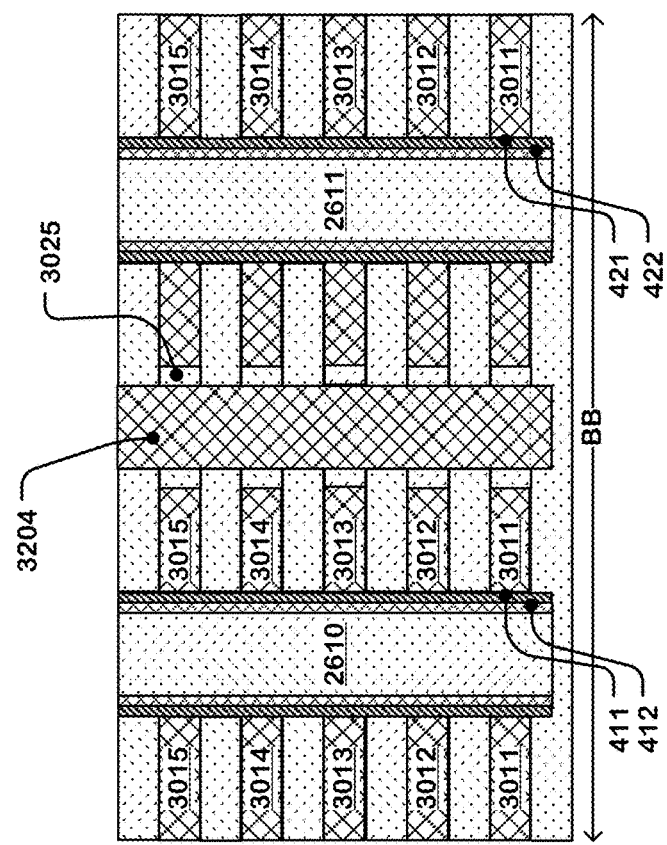
FIG. 35 is a cross-section of the stack on the line B-B of a structure like that of FIG. 33.

FIG. 35 is a cross-section of the structure of FIG. 33 taking in a column or Y direction on the line B-B. As seen, insulating pillars 2610, 2611 are disposed in separate rows along the column. An intermediate row along the column includes the conductive pillar 3204.

The word line layers 3011-3015 extend around the insulating pillars and the conductive pillars as isolated by the insulator sidewall (e.g. 3025) in the locations of word line material. The conductive pillar 3204 is insulated from the word line layers 3011-3015 by the insulating 3025. However, conductive pillar 3204 is physically connected to channel layer 412, 422.

Figure 36:
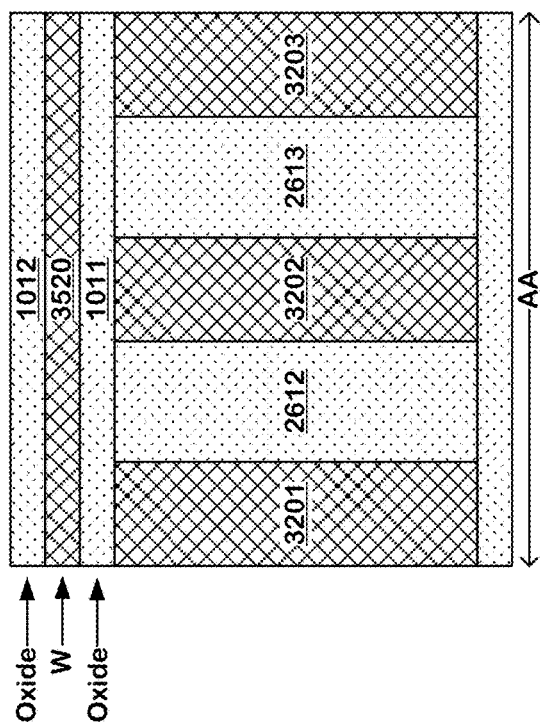
FIG. 36 is a cross-section of the stack on the line A-A of a structure like that of FIG. 33, after formation of pillar select layer materials.

FIG. 36 is a cross-section in the row direction on the line A-A of the structure of FIG. 34 after formation of a materials at the pillar select layer of the structure to be used in the formation of pillar select transistors. The illustrated materials include a layer of insulator 1011, such as silicon oxide or other material suitable as an interlayer insulator, a layer of word line material 3520 such as tungsten or other suitable word line material, and a top layer of insulator 1012 which can be the same material as the layer of insulator 1011. These layers can be deposited in a blanket deposition over the top of the stack in which the plurality of series of alternating conductive pillars (e.g. 3201, 3202, 3203) and insulating pillars (e.g. 2612, 2613) is formed.

Figure 37:
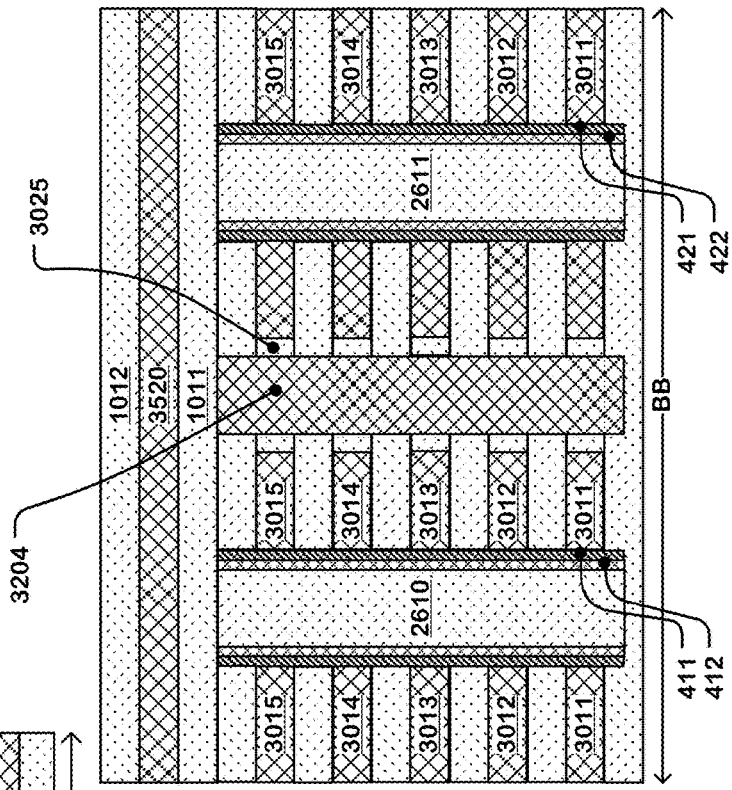
FIG. 37 is a cross-section of the stack on the line B-B of a structure like that of FIG. 33, after formation of pillar select layer materials.

FIG. 37 is a cross-section of the column direction on the line B-B like FIG. 35. FIG. 37 also illustrates materials at the pillar select layer of the structure to be used in the formation of pillar select transistors. The illustrated materials include a layer of insulator 1011, such as silicon oxide or other material suitable as an interlayer insulator, a layer of word line material 3520 such as tungsten or other suitable word line material, and a top layer of insulator 1012 which can be the same material as the layer of insulator 1011. As seen in this view, the insulating pillars (2610, 2611) are lined with a memory structure 411, 421, and a semiconductor channel structure 412, 422 which extend around the arcuate outside surfaces of the insulating pillars contacting the word line layers 3011-3015. Also, the word line layers 3011-3015 are isolated from the vertical conductive pillars (e.g., 3204) by the oxide sidewalls (e.g., 3025).

Figure 38:
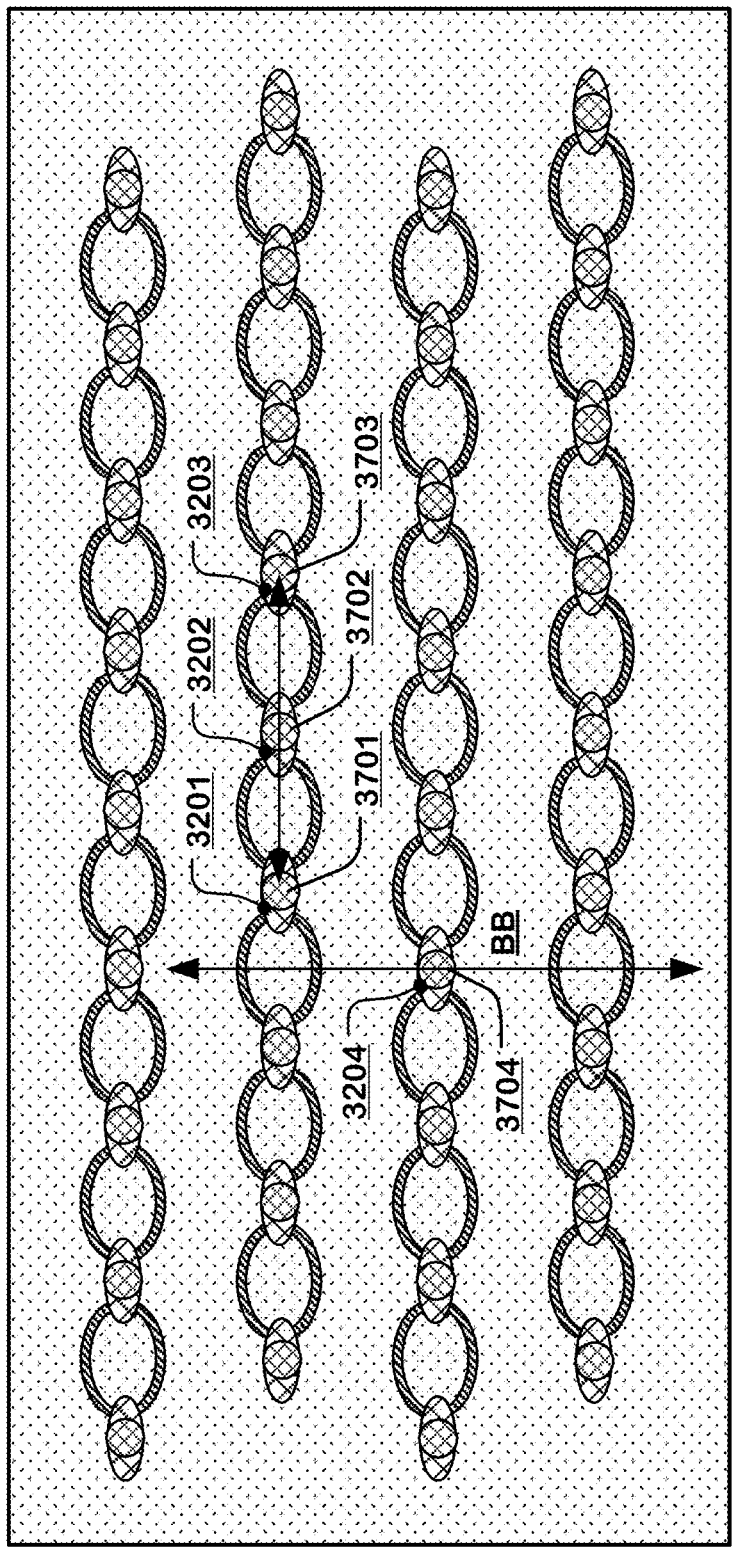
FIG. 38 is a top plan view of a stack including after forming vertical channel structures for pillar select transistors on the conductive pillar.

FIG. 38 is a top plan view of the stack illustrating top contact pads (e.g. 3701, 3702, 3703, 3704) of vertical pillar select transistors formed in the pillar select layer over corresponding pillars (e.g. 3201, 3202, 203, 3204). In this illustration, the layer of word line material 3520 is transparent so that the alternating conductive pillars and insulating pillars are shown.

Figure 39:
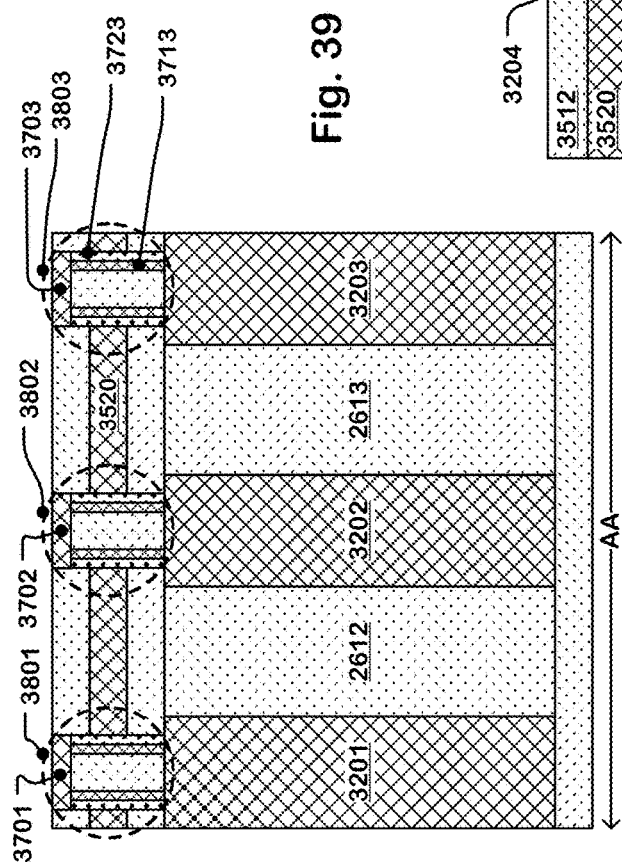
FIG. 39 is a cross-section of the stack on the line A-A of a structure like that of FIG. 38.

FIG. 39 is a cross-section in the row direction on the line A-A for the structure of FIG. 38 after a process including formation of holes which extend to the top of the corresponding conductive pillars. This is followed by deposition of a gate oxide material and a semiconductor channel material followed by a reactive ion etch or other anisotropic etching process which forms sidewalls leaving the gate oxide material and semiconductor channel material on the sidewalls. Then, the remaining volume of the hole is filled with an insulator, such as silicon dioxide and planarized. An etch back is performed to form a recess in the top, which is then filled with a conductive polysilicon, such as N+ polysilicon or other suitable conductor, and planarized by a chemical mechanical polishing or otherwise to form landing pads on top of the vertical pillar select transistors. As seen in FIG. 39, pillar select transistors 3801, 3802, 3803 are formed for corresponding vertical conductive pillars 3201, 3202, 3203. Each vertical pillar select transistor includes a gate oxide layer (e.g. 3723) in contact with the layer of word line material (3520) to be used as the pillar select gate. Also, each vertical pillar select transistor includes a semiconductor channel layer (e.g. 3713) which extends around the insulator and provides a transistor channel extending between the vertical conductive pillar (e.g. 3203) and the contact pad (e.g. 3703).

Figure 40:
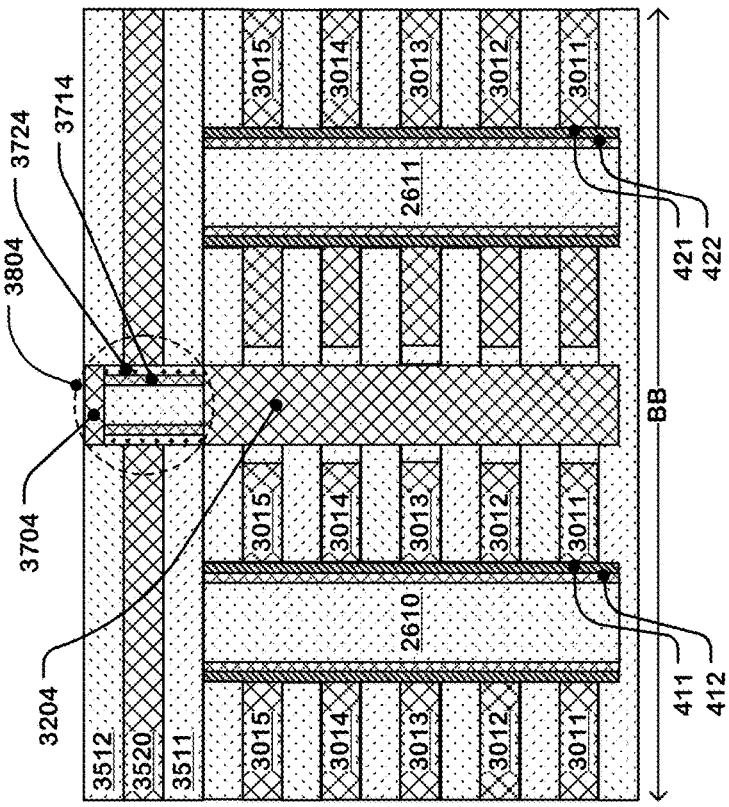
FIG. 40 is a cross-section of the stack on the line B-B of a structure like that of FIG. 38.

FIG. 40 is a cross-section of the structure of FIG. 38 taken on the line B-B in the column direction. As seen, the vertical pillar select transistor 3804 having contact pad 3704 is disposed on the vertical conductive pillar 3204 in this example. The vertical pillar select transistor 3804 includes a gate oxide layer 3724 and a semiconductor channel layer 3714 extending between the conductive pillar 3204 and the contact pad 3704.

Figure 41:
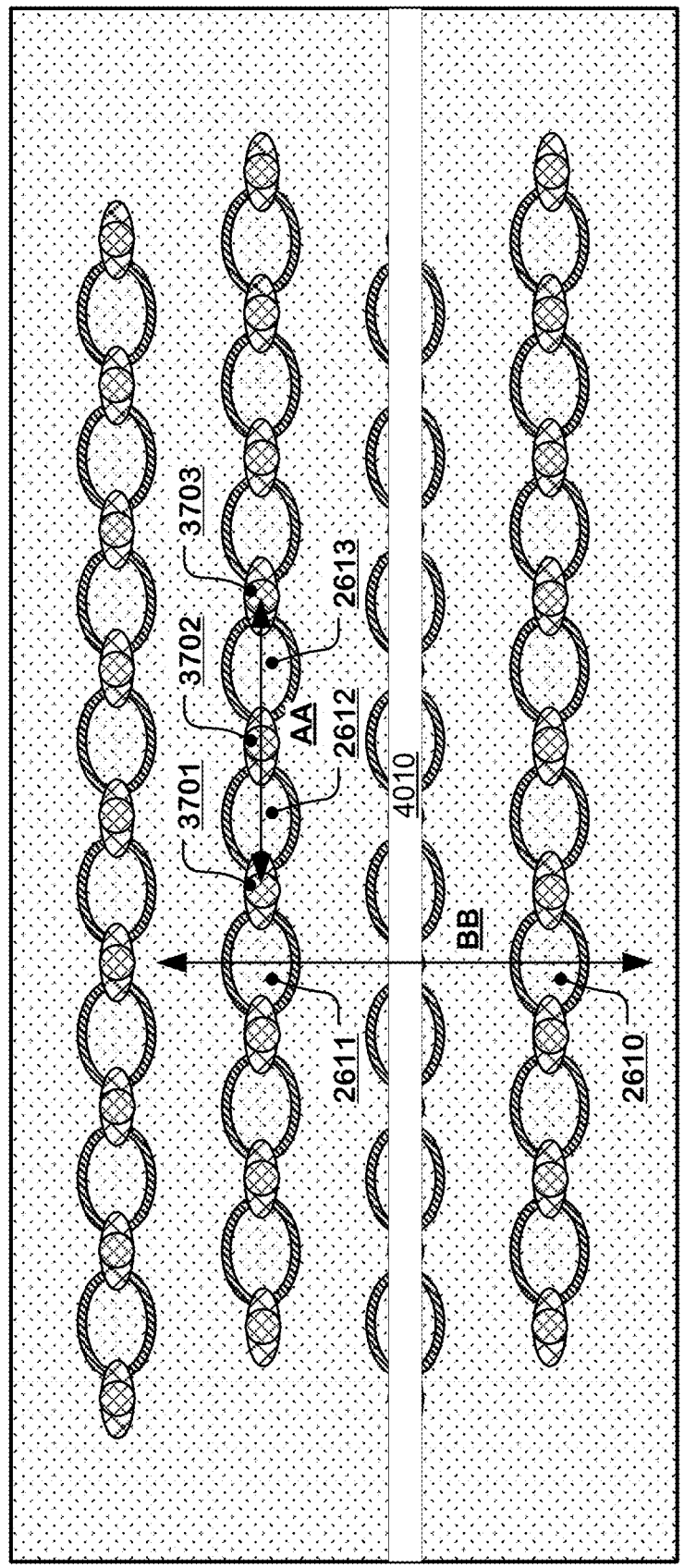
FIG. 41 is a top plan view of an embodiment of a stack having a structure of FIG. 38 after formation of slots through a pillar select layer.

FIG. 41 illustrates the top plan view after forming cut 4010 through the pillar select gate layer forming a shallow trench that stops before the top word line layer of the stack. The cut 4010 is used to form the distinct pillar select gates (also called as bit line transistor BLT gates), used to select distinct subarrays of the memory array as discussed above. In the example illustrated in FIG. 41, the cut 4010 is disposed over a series of dummy insulating pillars and conductive pillars. See FIG. 21 above.

As a result, a plurality of vertical channel transistors is provided controlled by a distinct pillar select gate for each distinct subarray.

Figure 42:
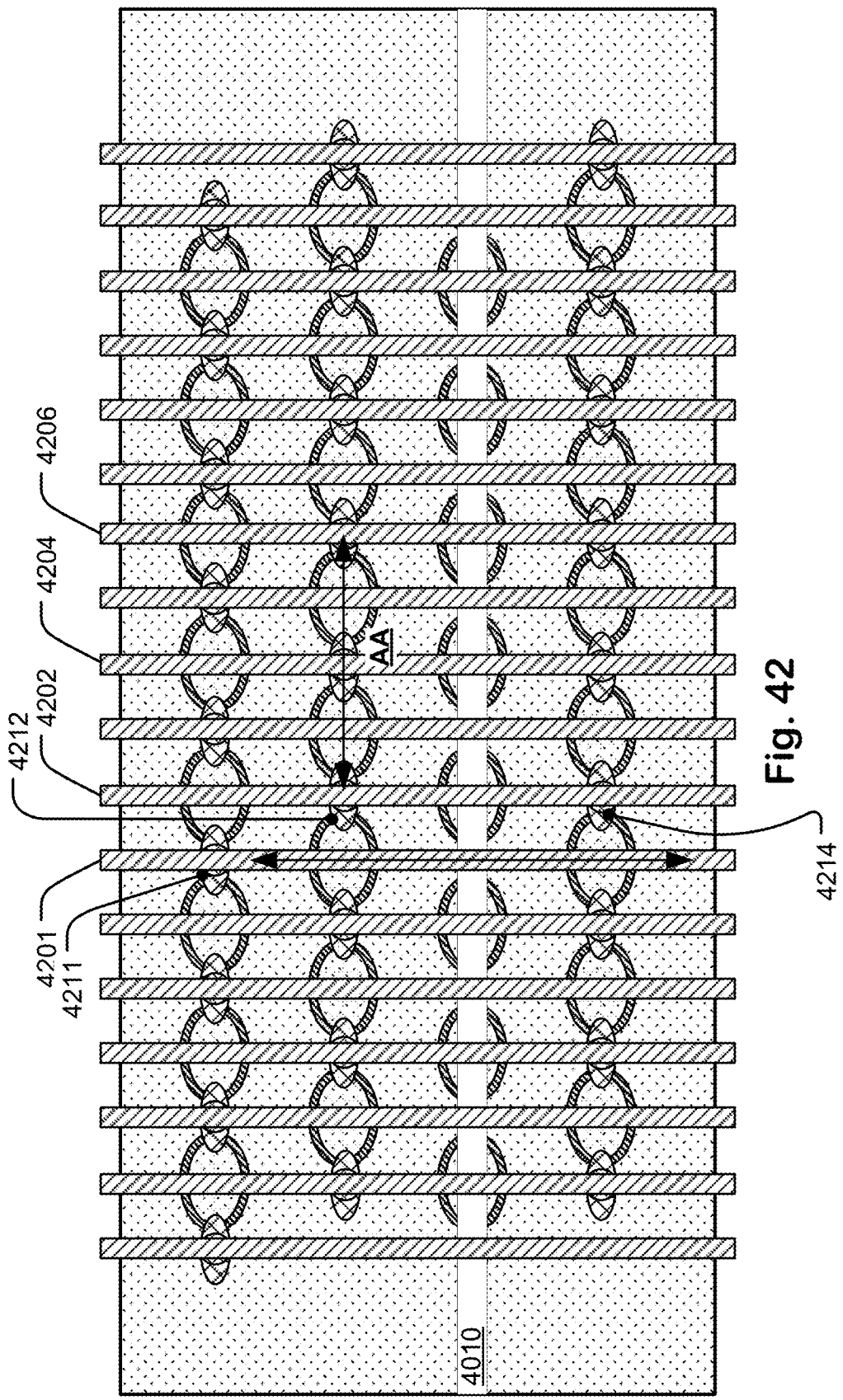
FIG. 42 is a top plan view of an embodiment of a stack having a structure of FIG. 41 after formation of overlying bit lines.

FIG. 42 is a top plan view of the structure of FIG. 41 after formation of overlying bit lines. The structure can be formed by a procedure that involves performing an interlayer dielectric over the contact pads of the vertical pillar select transistors followed by etching an array of bit line contact holes which contact the contact pads of the vertical pillar select transistors. Then, a metal layer is deposited and patterned to form bit lines for the array (e.g. 4201, 4202, 4204, 4206).

Each bit line contacts one vertical pillar select transistor in each distinct subarray. For example, bit line 4201 contacts the pillar select transistor for conductive pillar 4211 in a distinct subarray above the cut 4010, and for another conductive pillar below the cut (not shown) for a different distinct subarray. Bit line 4202 contacts the pillar select transistor for conductive pillar 4212 for the distinct subarray above the cut 4010 and the pillar select transistor for conductive pillar 4214 for the distinct subarray below the cut 4010.

Figure 43:
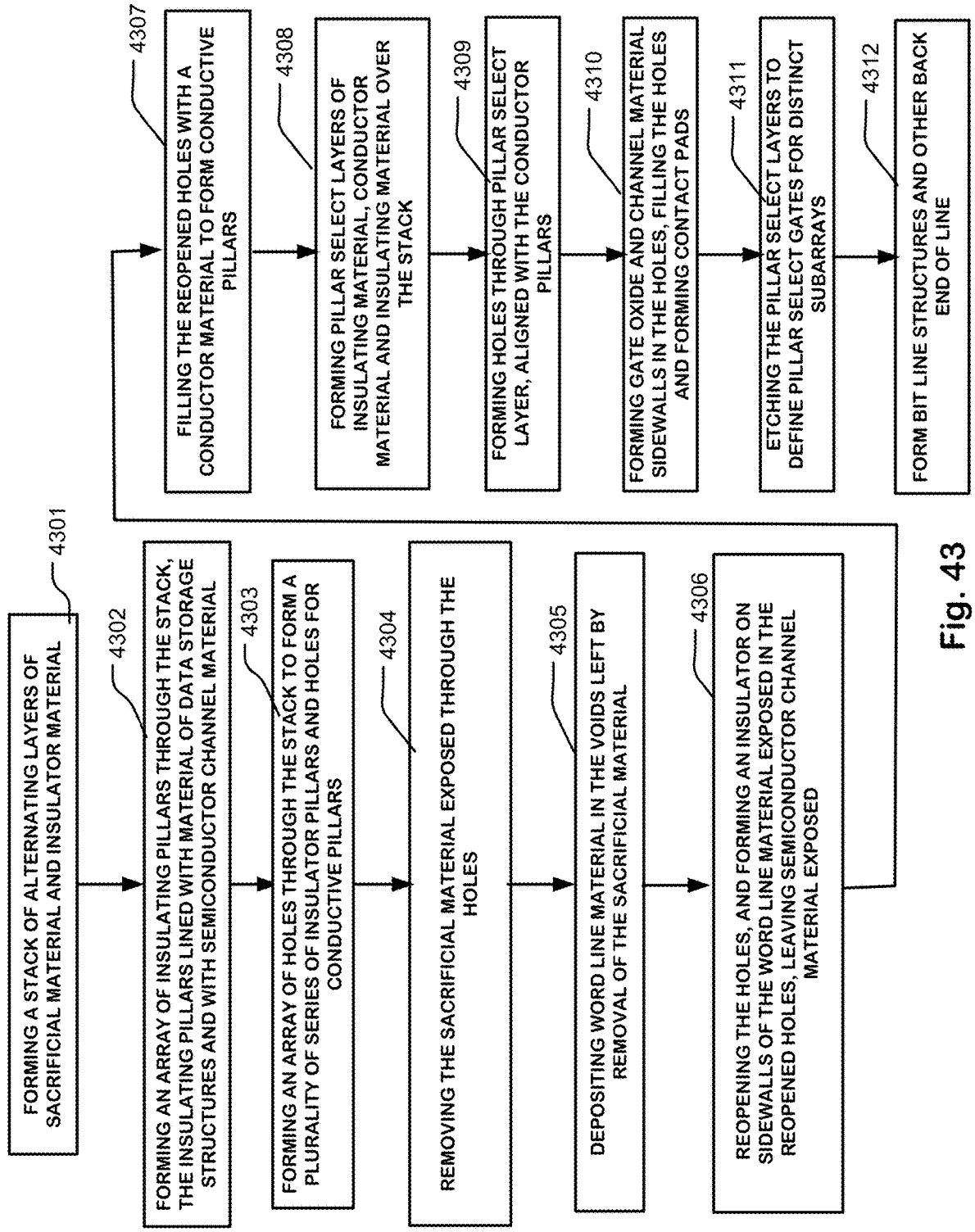
FIG. 43 is a flowchart of a manufacturing method like that represented by FIGS. 27-42.

FIG. 43 is a flowchart of a manufacturing process such as discussed above in connection with FIGS. 27 through 42. As illustrated in the flowchart, the procedure begins with forming a stack of alternating layers of sacrificial material and insulator material on a substrate (4301). The substrate can comprise an integrated circuit substrate including logic circuits adjacent to the stack and beneath the stack in some cases that can be used to implement peripheral circuitry for the memory device. After forming the stack, an array of insulating pillars is formed through the stack by etching holes (first holes) in the selected pattern, lining the holes with material of the data storage structure, such as one or more layers of a multilayer dielectric charge storage structure, and then lining the material of the data storage structure with semiconductor channel material (4302).

In this procedure, after forming the array of insulating pillars, an array of holes is formed through the stack to form a plurality of series of insulating pillars and holes (second holes) that are to be used to form conductive pillars later in the process (4303). After formation of the holes, a procedure is used to remove the sacrificial material exposed through the holes (4304). This is distinguished from the procedure described with reference to FIG. 26, in which slots to be used for the replacement process are not required, enabling higher density array layout.

After depositing the word line material in the voids left by removal of the sacrificial material (4305), the holes are reopened, the word line material is etched back to form recesses on the sidewalls, and an insulating material is deposited followed by a reactive ion etch process that can remove the insulator material that is outside the recesses. The reactive ion etch process can also remove any oxide on the sides of the semiconductor channel material that surrounds the insulating pillars exposed through the holes (4306). Next, the holes are filled with a conductive material to form the conductive pillars (4307).

The stack can then be planarized using chemical mechanical polishing for example, and then pillar select layers are formed, including an insulating material, a conductor material and an insulating material over the stack (4308). Thereafter, the procedure used to form the vertical pillar select transistors, including forming holes through the pillar select layer aligned with the conductive pillars (4309). Then, the holes are lined with a gate oxide and channel material on the sidewalls and then filled with an insulator. The insulator is etched back and contact pads are formed on top of the vertical pillar select transistors (4310). Next, the pillar select layers are etched to define pillar select gates for the distinct subarrays as discussed above (4311). Finally, bit line structures and other back end of line procedures are executed to complete the device (4312).

In general, FIG. 43 illustrates another example of a method for manufacturing a vertical memory structure that includes forming a block comprising a stack of alternating layers of insulator material and word line material, and forming a plurality of distinct series of alternating conductive pillars and insulating pillars arranged in an array and penetrating through the stack. Also, the manufacturing method includes forming data storage structures disposed on the inside surfaces of the layers of word line material at cross points of the insulating pillars and the layers of word line material. The method also includes forming a semiconductor channel material between the insulating pillars and the data storage structures at cross points of the insulating pillars with layers of word line material. The semiconductor channel material can be an arcuate layer which extends around an arcuate outside surface of the insulating pillars, and contacts adjacent conductive pillars on both sides in a manner that establishes a source/drain terminals at the contacts. Also, the method results of forming a plurality of conductive strips in a pillar select layer over the stack. The plurality of conductive strips includes for each distinct subarray of the array, a corresponding conductive strip acting as a gate for a plurality of vertical channel structures for the distinct subarray. Furthermore, the method includes forming bit line conductors over the pillar select layer over the stack. In embodiments described herein, each bit line conductor has a contact to one vertical channel transistor in each of the distinct subarrays of the array in the stack.

Integrated circuit memory structures to implement memory arrays can be represented by the schematic diagrams in FIGS. 55 and 56 also can be manufactured in a number of processes, some of such processes can be understood with reference to FIG. 44 to FIG. 50. FIGS. 44-50 illustrate stages in a manufacturing process for an alternative embodiment, in which the semiconductor channel material is discontinuous in the vertical direction, which breaks current leakage paths in the array. This manufacturing process proceeds as discussed above to a stage like that described with reference to FIG. 3A, in which the array of holes is formed to be used for formation of insulating pillars.

Figure 44:
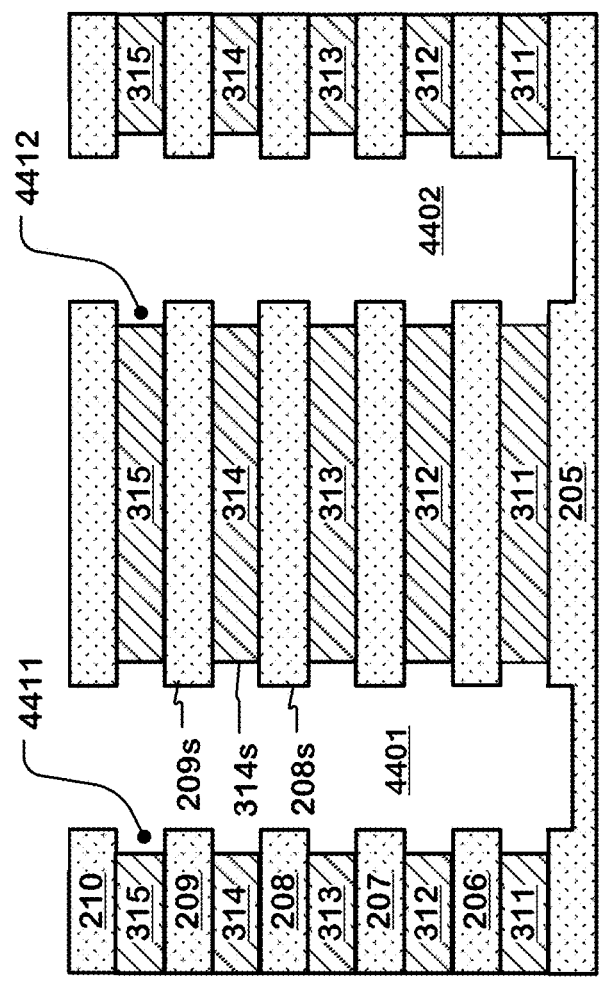
FIG. 44 is a cross-section like that of FIG. 3A after etching the sacrificial material to form recesses according to another manufacturing method.

FIG. 44 illustrates a subassembly in a stage in the process after FIG. 3A, after formation of holes 4401, 4402 to be used for insulating pillars, an etch back of the sacrificial layers (311 to 315) is performed to form shallow recesses (e.g. 4411, 4412). Suitable recipes for forming the recesses for embodiments in which the sacrificial material and silicon nitride, can include using a solution of $H_3PO_4$, or a timed selective reactive ion etch. The recesses provide concave cavities for formation of the channel material of the memory cells in which the sidewalls (e.g. 314$s$) of the sacrificial layers are recessed relative to the sidewalls (e.g. 209$s$, 208$s$) of the adjacent insulating layers.

Figure 45:
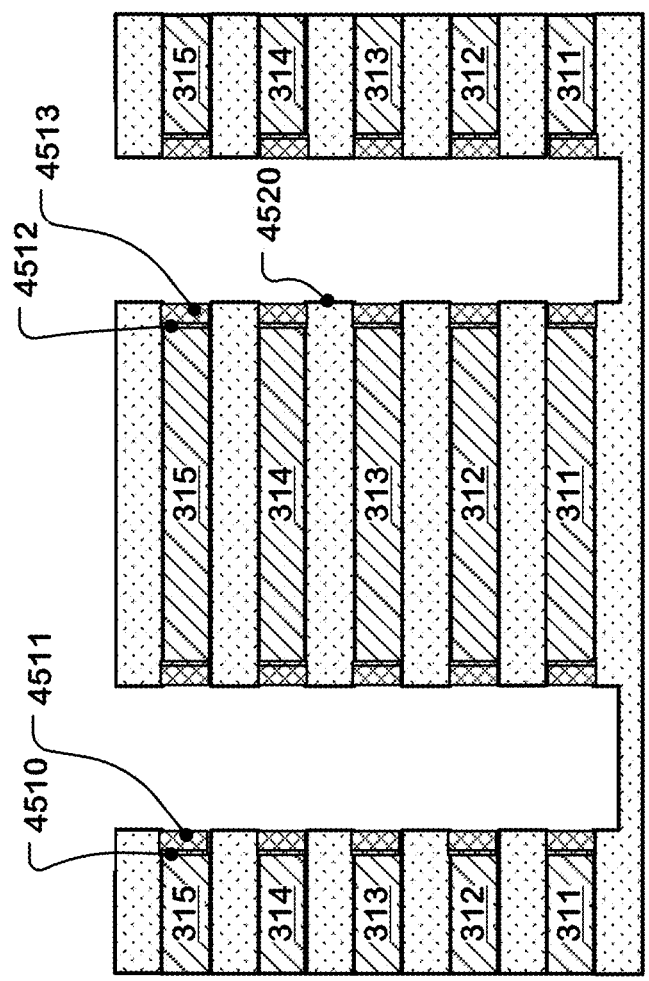
FIG. 45 is a cross-section of the structure after formation of memory structures and semiconductor channel material inside the recesses of FIG. 44.

FIG. 45 illustrates a subassembly in a stage of the manufacturing process after depositing a layer of silicon oxide and a layer of semiconductor channel material, such as polysilicon, followed by an anisotropic etch to remove semiconductor channel material between the recesses. This leaves confined semiconductor channels (e.g. 4511, 4513) separated from the sacrificial layer by layer of silicon oxide (e.g. 4510, 4512) at each level extending in an arcuate shape around the outside of the holes within the recesses. Thus, the semiconductor channel material is discontinuous in the regions (e.g. 4520) across the insulator layers, breaking a potential current leakage path between the memory cells at the different levels of the structure.

A layer of silicon oxide (e.g. 4510, 4512) can be a part of the data storage structure, such as the tunneling layer of the multilayer dielectric charge trapping structure. Also, additional layers of the multilayer dielectric charge trapping structure can be deposited prior to the layer of silicon oxide in some embodiments. As discussed above, the balance of the multilayer dielectric charge trapping structure can be deposited during the procedure to replace the sacrificial material to form the data storage structures in the confined arcuate regions at the cross points of the word line layers with the insulating pillars in the structure.

Figure 46:
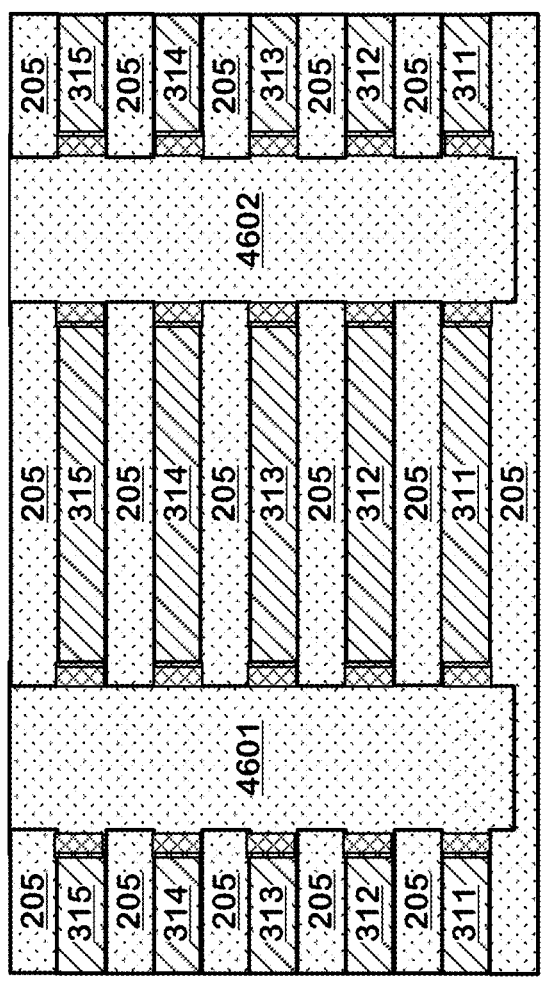
FIG. 46 illustrates filling the holes shown in FIG. 45 with an insulating material to form insulating pillars.

FIG. 46 is a cross-section in the column direction illustrating a following stage after filling the holes with an insulator material, and performing a planarizing process such as chemical mechanical polishing form insulating pillars 4601, 4602.

Figure 47:
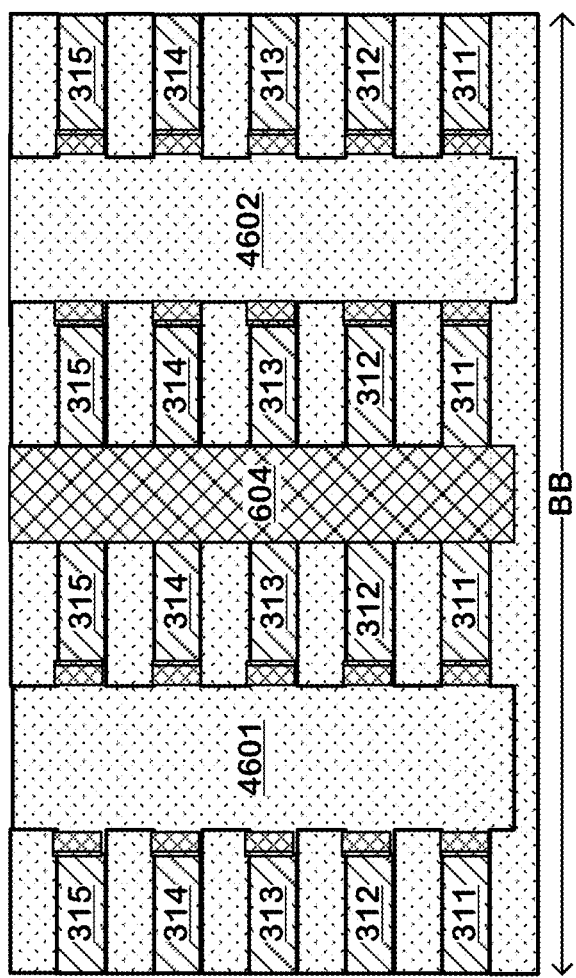
FIG. 47 illustrates formation of conductive pillars between the insulating pillars of FIG. 46.

FIG. 47 is a cross-section in the column direction on the line B-B of a plan view as shown in FIG. 6A above, after formation of array of holes to be used for formation of the conductive pillars and filling the holes with a conductor, such as N+ polysilicon. After filling the holes, planarizing step is executed such as chemical mechanical polishing.

Figure 48:
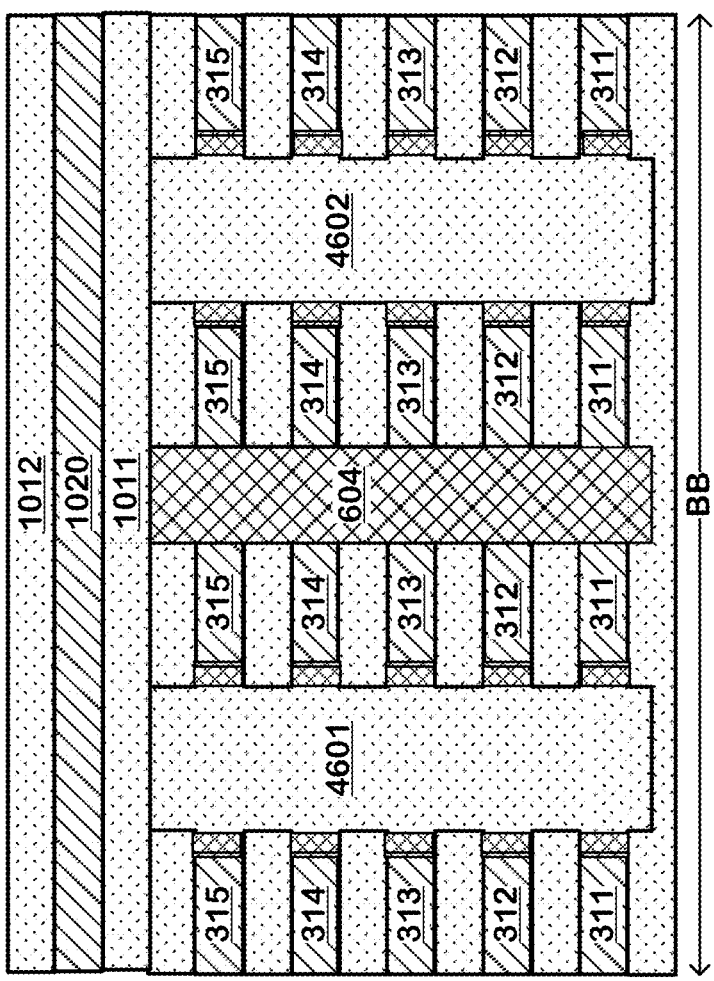
FIG. 48 illustrates formation of materials for use in forming the pillar select layer on a structure like that of FIG. 47.

FIG. 48 is a cross-section like FIG. 10 on the line B-B, in a later stage after formation of a layer of insulator 1011, a layer of sacrificial material 1020 and the layer of insulator 1012 over the top of the stack, to be used for formation of pillar select transistor structures. In combination layers in this position are referred to as pillar select layers over the stack. The sacrificial material 1020 and the insulator 1011 can be the same materials as used in the stack in the alternating insulating layers and word line layers.

Figure 49:
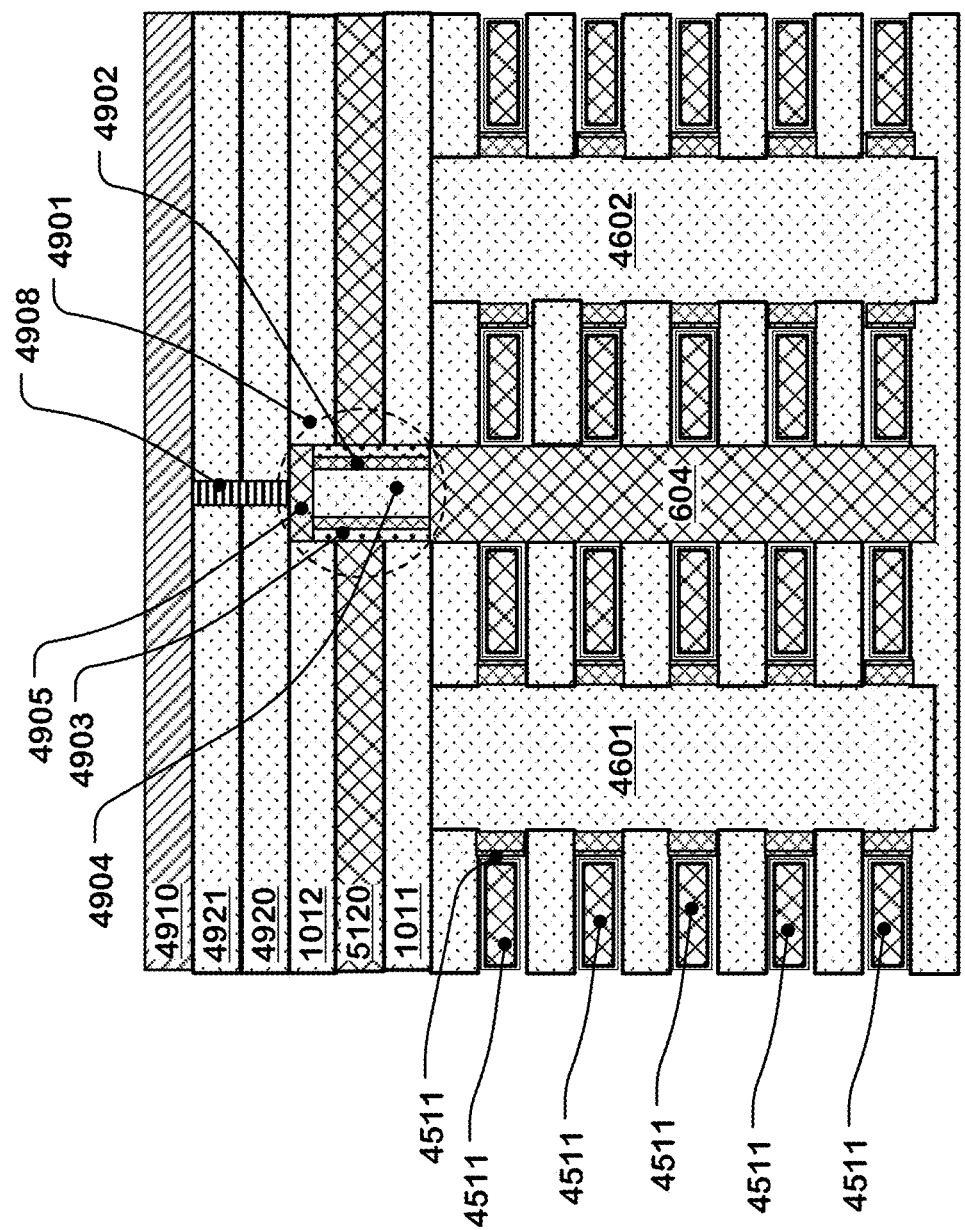
FIG. 49 is a cross-section on the line B-B of the structure after formation or vertical channel structures for pillar select transistors, replacement of the sacrificial material and formation of overlying bit line structures.

FIG. 49 is a cross-section orthogonal to a bit line in subassembly at a stage of manufacturing after performing the steps such as those described above with reference to FIGS. 10 through 23, showing a vertical transistor structure 4901 for connection of vertical conductive pillar 604 to overlying bit line 4910. The steps include replacement of the sacrificial layer with word line material using slots positioned in intervals along the series of alternating insulator pillars and conductive pillars as discussed above, such as tungsten in the word line layers of the stack, and in the pillar select layer discussed above. In this embodiment, the replacement of the sacrificial material with word line material includes deposition of the remaining parts of the data storage structure, such as for a dielectric charge storage structure, a charge trapping layers comprising silicon nitride for example, and the blocking layer comprising aluminum oxide or other high dielectric constant dielectric. As mentioned above, the tunneling layer (e.g. 4510 of FIG. 45) can be deposited prior to formation of the semiconductor channel material surrounding the insulator pillars as discussed above. In other embodiments, the tunneling layer 4510 and the charge trapping layer might be deposited at a stage of FIG. 45, leaving only the blocking layer to be deposited at the stage of replacing the sacrificial material. Thus, vertical pillar select transistor structures, such as the vertical transistor structure 4901 are formed. The vertical pillar select transistor structures include a gate oxide layer 4902, and a semiconductor channel layer 4903 surrounding and insulating core 4904. Also, a contact pad 4905 is formed establishing a current path from the contact pad 4905 to the underlying conductive pillar 604.

Also, interlayer dielectrics 4920, 4921 are formed over the pillar select layer structures, and a plurality of bit lines (e.g. bit line 4910) is formed over the interlayer dielectrics. As seen, bit line contact 4908 is formed between the contact pad 4905 of the vertical transistor structure (4901) and an overlying bit line 4910. The structure in this embodiment may also include insulator filled slots (not shown), where the slots are utilized for access to the sacrificial material during the procedure used to replace it with word line material, disposed in intervals along the series of alternating insulator pillars and conductive pillars as discussed above. Of course, other techniques for accessing the sacrificial material might be utilized, including the techniques discussed above in which the holes used for formation of the conductive pillars are utilized for access to the sacrificial material in the stack.

As a result of formation of the conductor channel in confined rings around the outside surfaces of the insulator pillars in this embodiment, there can be formed a structure in which all regions of the semiconductor channel material on the sidewalls of the insulator pillar are controlled by the word lines.

Figure 50:
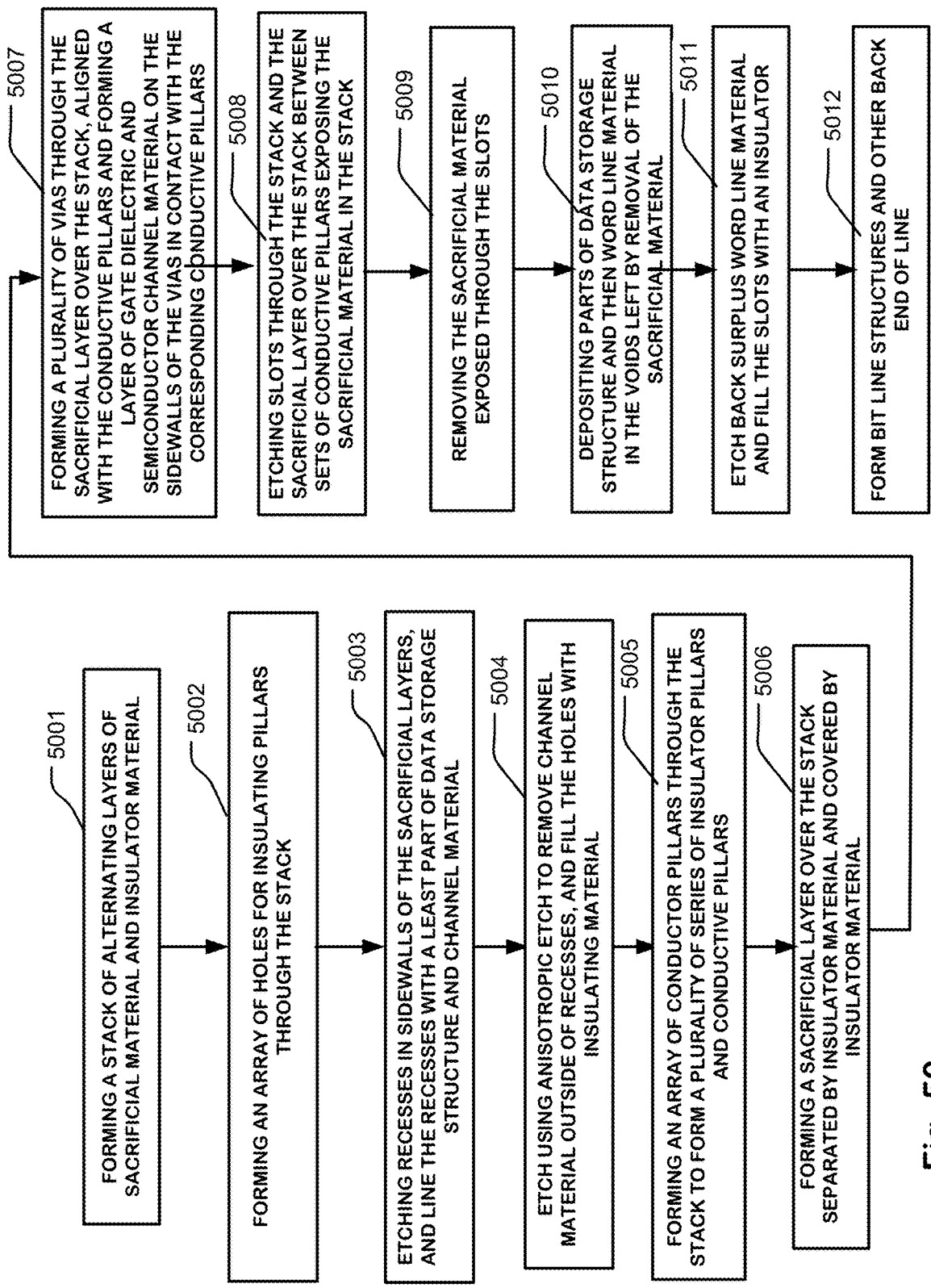
FIG. 50 is a flowchart of an alternative manufacturing method like that represented by FIGS. 44-49.

FIG. 50 is a flowchart of a manufacturing process such as discussed above in connection with FIGS. 2 through 25, as modified according to the processes of FIGS. 44 through 49. As illustrated in the flowchart, the procedure begins with forming a stack of alternating layers of sacrificial material and insulator material on a substrate (5001). The substrate can comprise an integrated circuit substrate including logic circuits adjacent to the stack and beneath the stack in some cases that can be used to implement peripheral circuitry for the memory device. Also, the stack can be formed over a layer of conductive material such as layer in embodiments including source side conductors as shown in FIG. 56. After forming the stack, an array of holes for insulating pillars is formed through the stack by etching holes in the selected pattern (5002). Process then includes etching recesses in the sidewalls of the sacrificial layers, and lining the recesses with at least part of the data storage structure such as a layer of silicon oxide as discussed above, and with channel material (5003). This is followed by etching inside the holes using an anisotropic etch to remove the channel material outside of the recesses so that the channel material is discontinuous between the word line layers, followed by filling the holes with an insulating material (5004). Next in the flowchart an array of conductive pillars is formed through the stack arranged in a pattern that results in formation of a block including the stack of insulating layers and sacrificial layers in which plurality of series extending in a row direction of alternating insulating pillars and conductive pillars extend through the stack (5005).

Next in the flowchart, the method includes forming a sacrificial layer over the stack, separated by insulating layers above and below the sacrificial layer to be used to form pillar select transistors (5006). A plurality of holes are formed through the sacrificial layer over the stack, which are aligned with corresponding conductive pillars. The holes are lined with the gate dielectric and a semiconductor channel material on the sidewalls in a manner that results in the semiconductor channel material in contact with corresponding conductive pillars (5007). Also, contact pads can be formed on the tops of the vertical transistors, the contact pads contacting the semiconductor channel material to provide a current flow path from the corresponding conductive pillar to the contact pad.

In the embodiment of FIG. 50, a plurality of slots are etched through the stack and through the sacrificial layer over the stack. The slots are arranged at intervals in the row direction between for example, every set of eight insulating pillars and nine conductive pillars in the series, and extending in the column direction across a plurality of series, for example across four or eight series. The slots expose the sacrificial material in the stack and in the layer of sacrificial material over the stack (5008). After exposing the sacrificial material, the sacrificial material is removed through the slots, leaving voids at the locations of word lines and the pillar select lines for the memory array implemented in this block (5009). Thereafter, word line material such as tungsten is deposited in the voids left by removal of the sacrificial material. In some embodiments, the deposition of word line material is preceded by formation of a liner of a high dielectric constant insulator, or by one or more layers of the multilayer charge storage structure to be formed at the cross points of the word lines and the insulating pillars (5010). After deposition of the word line material, surplus material is removed from inside the slots, and the slots are filled with an insulator in this embodiment (5011).

Thereafter, bit line structures and other back end of line operations can be executed to complete the device (5012).

The method of FIG. 50 is based on the technique for removal of sacrificial material using slots disposed at intervals along the series of conductive pillars and insulating pillars. In other embodiments, the sacrificial material can be removed using the holes for the conductive pillars as discussed above in connection with FIG. 43.

In general, FIG. 50 illustrates another example of a method for manufacturing a vertical memory structure that includes forming a block comprising a stack of alternating layers of insulator material and word line material, and forming a plurality of distinct series of alternating conductive pillars and insulating pillars arranged in an array and penetrating through the stack. Also, the manufacturing method includes forming data storage structures disposed on the inside surfaces of the layers of word line material at cross points of the insulating pillars and the layers of word line material. The method also includes forming a semiconductor channel material between the insulating pillars and the data storage structures at cross points of the insulating pillars with layers of word line material. The semiconductor channel material can be an arcuate layer which extends around an arcuate outside surface of the insulating pillars, and contacts adjacent conductive pillars on both sides in a manner that establishes a source/drain terminals at the contacts. Also, the method results of forming a plurality of conductive strips in a pillar select layer over the stack. The plurality of conductive strips includes for each distinct subarray of the array, a corresponding conductive strip acting as a gate for a plurality of vertical channel structures for the distinct subarray. Furthermore, the method includes forming bit line conductors over the pillar select layer over the stack. In embodiments described herein, each bit line conductor has a contact to one vertical channel transistor in each of the distinct subarrays of the array in the stack.

Integrated circuit memory structures to implement memory arrays such as can be represented by the schematic diagrams in FIGS. 55 and 56 can be manufactured in a number of processes, some of such processes can be understood with reference FIGS. 51 to 54A. FIGS. 51 to 54A illustrate stages in a manufacturing process for an embodiment that results in a circuit as shown in FIG. 56, with the underlaying source side conductor. This source side conductor can be used for example in a memory operation to erase a block of memory cells by applying a voltage through the underlying conductor to the vertical conductive pillars. This manufacturing process proceeds as discussed above to a stage like that described with reference to FIGS. 5B and 13B, in which the stack is formed on top of a source line conductor 5205, such as the P-type conductive layer which can be lightly doped, or P-type conductive lines which can also be lightly doped. In the structure, the conductive pillars 604 can be n-type semiconductor, such as N+-type polysilicon, and the source line conductor 5205 can be p-type diffusion in semiconductor substrate, or other p-type semiconductor. This results in formation of a PN junction 1301 at their intersection, such as junction 6332 shown in FIG. 56.

FIG. 13B is a cross-section on the line B-B in the column direction of the structure shown in FIG. 11A, for the alternative embodiment in which a source line conductor 5205, such as a p-type conductor layer is disposed beneath the stack. In the structure, the conductive pillars 604 can be n-type or N+-type polysilicon, and the source line conductor 5205 can be p-type diffusion in semiconductor substrate, or other p-type semiconductor. This results in formation of a PN junction 1301 at their intersection, such as junction 6332 shown in FIG. 56.

Figure 52:
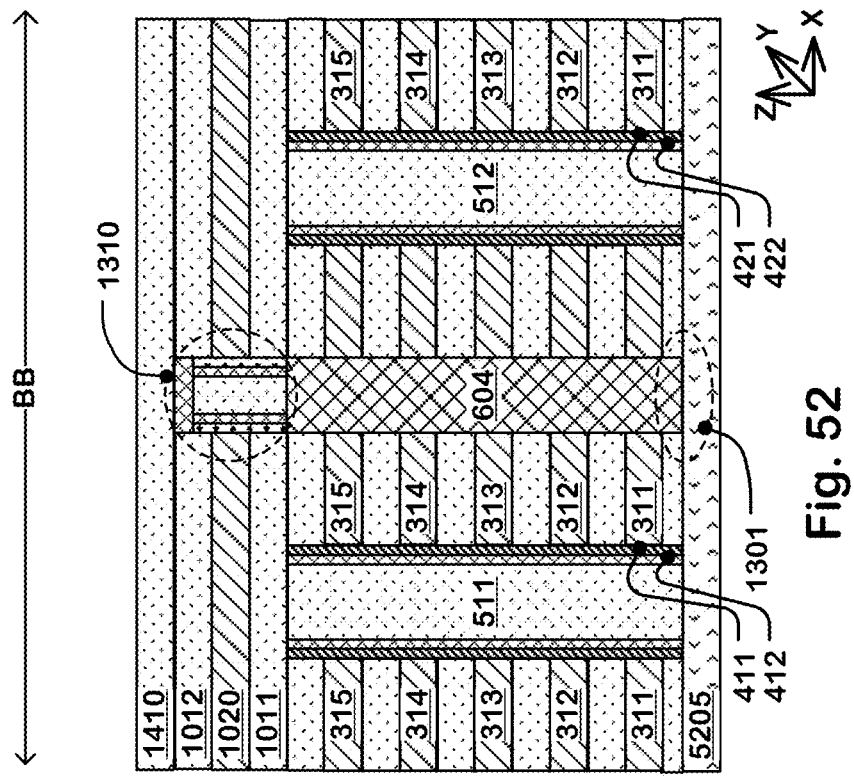
FIGS. 51 and 52 are cross-sections on line A-A and line B-B, respectively, of the structure like that of FIG. 13B after formation of an insulating cap, according to another manufacturing method.
Figure 51:
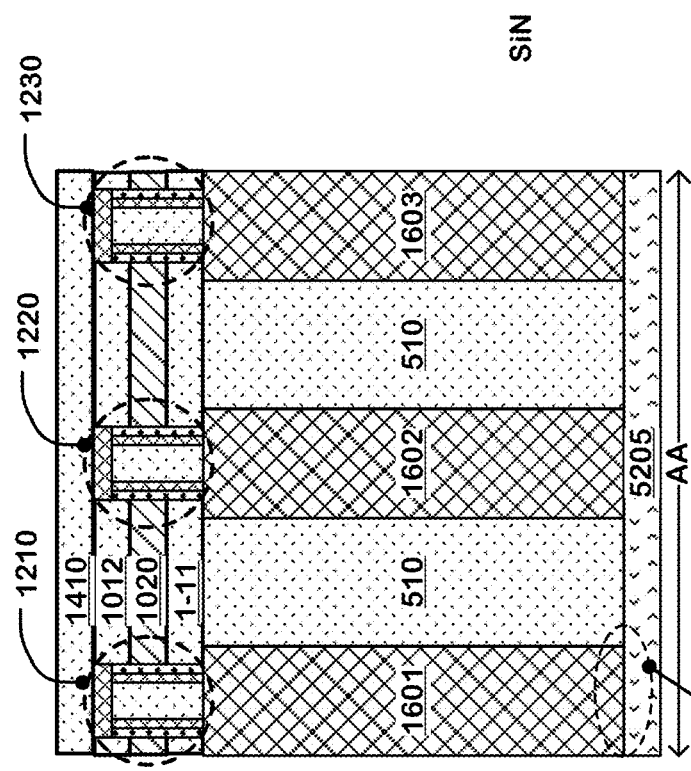

FIGS. 51 and 52 (similar to FIGS. 14 and 15) are cross-sections on the line A-A and B-B respectively, illustrating the structure of FIGS. 12 and 13B after formation of a cap layer 1410 over the contact pads 1210, 1220, 1230 and 1310. The cap layer 1410 can be a layer of silicon oxide or other material that can act as a hard mask or other type of protection for later processing steps. As mentioned above, PN junctions (e.g. 5110, 1301) are formed at the contact points of the vertical conductive pillars (e.g. 1601, 1602, 1603, 604) which can comprise n-type polysilicon, and the source line conductor 5205. In other embodiments, the PN junctions can be implemented in other ways, or can be located at other locations along the current path of the source line conductor to bias circuitry used to apply bias voltages and to float the connections of the source line conductor during memory operations.

Figure 53:
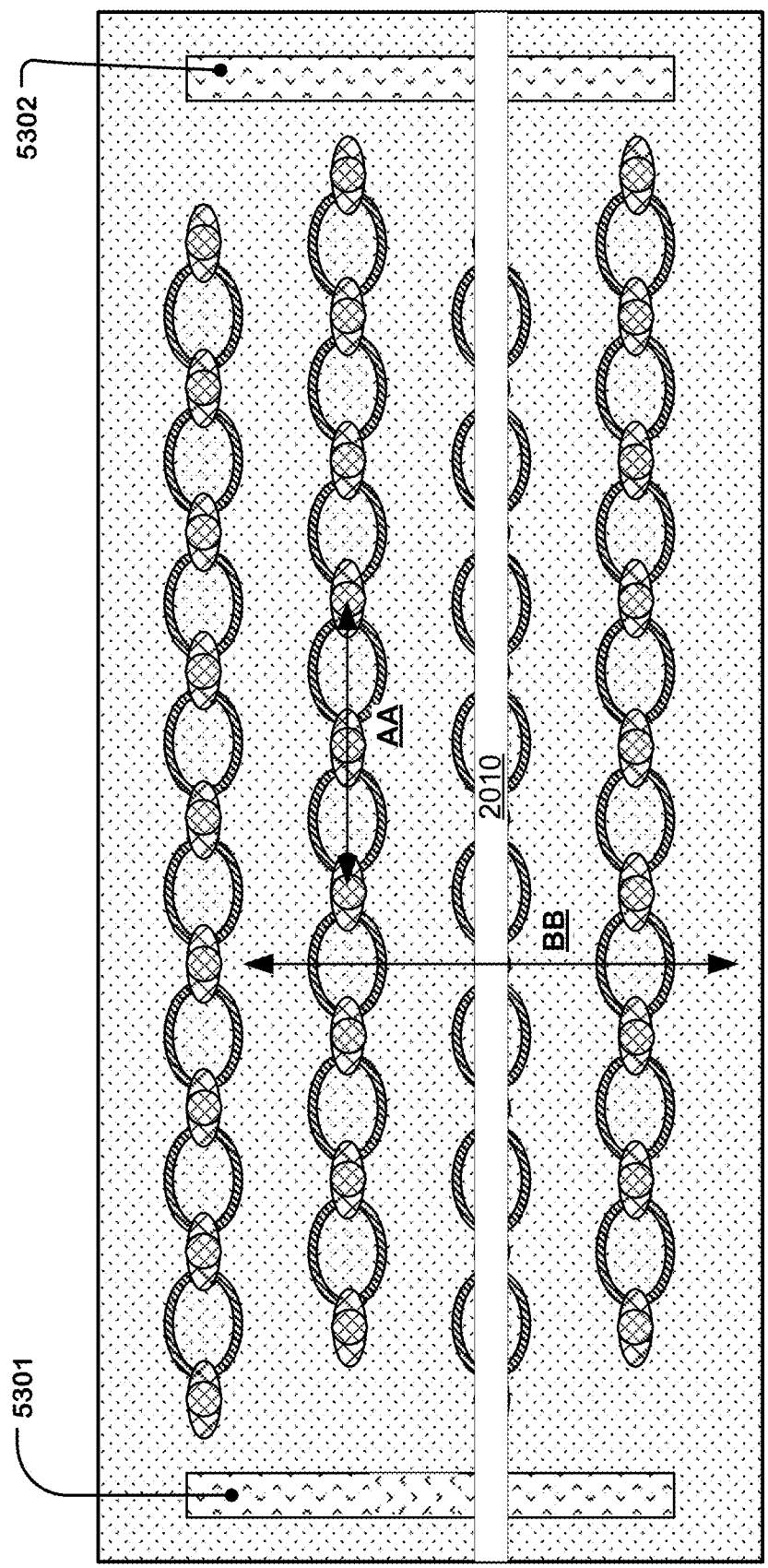
FIG. 53 is a top plan view of an embodiment of a stack having a structure of FIGS. 51 and 52 after forming the cut in the pillar select layer, and filling the slots to be used for replacement of sacrificial material with conductive material.

FIG. 53 is a top plan view (pillar select layer transparent) of an embodiment of a 3D memory block 105 in an intermediate manufacturing stage after formation of slots as discussed above through the stack to be used for the purposes of replacement of the sacrificial material with word line material. See, e.g. FIGS. 16A and FIG. 16B to FIG. 21 and the corresponding description above. In the present embodiment, the slots are filled with conductor material to form conductor filled slots 5301, 5302 which connect to the underlying source line conductor 5205 or conductors. According to the embodiment of FIG. 52, interlayer contacts are formed through the interlayer dielectrics from the conductor filled slots 5301, 5302 to the metal layer used to form the bit lines, or to another patterned conductor layer over the stack, for connection of the conductor filled slots 5301, 5302 to bias circuitry.

FIG. 54A is a top plan view of the structure after a process to form overlying bit lines (e.g. 2201, 2202, 2204, 2206), like FIG. 23A, and in addition overlying source line bias lines connected to the conductor filled slots 5301, 5302. This process can include deposition of an interlayer dielectric over the pillar select transistor contact pads, formation of bit line contact plugs and contacts to the conductor filled slots through the interlayer dielectrics, and then forming and patterning of the metal at the overlying patterned conductor layer or layers to form the bit lines and the source line conductor. The bit lines are configured so that they contact at most one vertical conductor structure in each distinct subarray. Thus, the bit line 2202 contacts a vertical conductor structure 2213 in the subarray at the top above the gap 2010, and a vertical conductor structure 2215 at the bottom, below the gap 2010.

FIG. 54B is a flowchart of a manufacturing process such as discussed above in connection with FIGS. 2 through 25, as modified by FIGS. 51 to 54A. As illustrated in the flowchart, the procedure begins with forming a stack of alternating layers of sacrificial material and insulator material on a P-type semiconductor layer, or a plurality of P-type semiconductor lines on a substrate (5401). The substrate can comprise an integrated circuit substrate including logic circuits adjacent to the stack and beneath the stack in some cases that, can be used to implement peripheral circuitry for the memory device. After forming the stack, an array of insulating pillars is formed through the stack by etching holes in the selected pattern, lining the holes with material of the data storage structure, such as one or more layers of a multilayer dielectric charge storage structure, and then lining the material of the data storage structure with semiconductor channel material (5402). Next in the flowchart an array of conductive pillars is formed through the stack arranged in a pattern that results in formation of a block including the stack of insulating layers and sacrificial layers in which plurality of series extending in a row direction of alternating insulating pillars and conductive pillars extend through the stack (5403). In this embodiment, the conductive pillars contact the underlying source line conductor or conductors at corresponding PN junctions.

Next in the flowchart, the method includes forming a sacrificial layer over the stack, separated by insulating layers above and below the sacrificial layer to be used to form pillar select transistors (5404). A plurality of holes are formed through the sacrificial layer over the stack, which are aligned with the conductive pillars. The holes are lined with the gate dielectric and a semiconductor channel material on the sidewalls in a manner that results in the semiconductor channel material in contact with corresponding conductive pillars (5405). Also, contact pads can be formed on the tops of the holes, the contact pads contacting the semiconductor channel material to provide a current flow path from the corresponding conductive pillar to the contact pad.

In the embodiment of FIG. 54B, a plurality of slots are etched through the stack and through the sacrificial layer over the stack. The slots are arranged at intervals in the row direction between for example, every set of eight insulating pillars and nine conductive pillars in the series, and extending in the column direction across a plurality of series, for example across four or eight series. The slots expose the sacrificial material in the stack and in the layer of sacrificial material over the stack (5406). After exposing the sacrificial material, the sacrificial material is removed through the slots leaving voids at the locations of word lines and the pillar select lines for the memory array implemented in this block (5407). Thereafter, word line material such as tungsten is deposited in the voids left by removal of the sacrificial material. In some embodiments, the deposition of word line material is preceded by formation of a liner of a high dielectric constant insulator, or by one or more layers of the multilayer charge storage structure to be formed at the cross point of the word lines and the insulating pillars (5408). After deposition of the word line material, surplus material is removed from inside the slots and the sidewalls of the word line material is oxidized or lined with an insulator. Then the slots are filled with a conductor such as tungsten or polysilicon in this embodiment (5409).

Thereafter, bit line structures contacting the contact pads of the vertical pillar select transistors, and source line bias line structurer contacting the conductor filled slots are formed, and other back end of line operations can be executed to complete the device (5410).

In general, FIG. 54B illustrates an example of a method for manufacturing a vertical memory structure that includes forming a block comprising a stack of alternating layers of insulator material and word line material over a source line bias conductor, and forming a plurality of distinct series of alternating conductive pillars and insulating pillars arranged in an array and penetrating through the stack. Also, the manufacturing method includes forming data storage structures disposed on the inside surfaces of the layers of word line material at cross points of the insulating pillars and the layers of word line material. The method also includes forming a semiconductor channel material between the insulating pillars and the data storage structures at cross points of the insulating pillars with layers of word line material. The semiconductor channel material can be an arcuate layer which extends around an arcuate outside surface of the insulating pillars, and contacts adjacent conductive pillars on both sides in a manner that establishes a source/drain terminals at the contacts. Also, the method results of forming a plurality of conductive strips in a pillar select layer over the stack. The plurality of conductive strips includes for each distinct subarray of the array, a corresponding conductive strip acting as a gate for a plurality of vertical channel structures for the distinct subarray. Furthermore, the method includes forming bit line conductors over the pillar select layer over the stack. In embodiments described herein, each bit line conductor has a contact to one vertical channel transistor in each of the distinct subarrays of the array in the stack.

The method of FIG. 54B is based on the technique for removal of sacrificial material using slots disposed at intervals along the series of conductive pillars and insulating pillars. In other embodiments, the sacrificial material can be removed using the holes for the conductive pillars as discussed above in connection with FIG. 43. Also, in other embodiments, the process can include procedures so that the semiconductor channel material on the outside surfaces of the insulator pillars can be confined as discussed above in connection with FIG. 50.

FIGS. 55 and 56 as described above, are circuit schematics of 3D virtual ground memory for AND-flash architecture or NOR-flash architecture memory devices which can be implemented as described herein.

FIG. 57 is a simplified block diagram of an integrated circuit, which can be implemented on a single chip, or in multichip packages, in various embodiments. The integrated circuit 5700 includes a 3D virtual ground memory array 5760 as described herein.

The memory device can include bit line decoder 5750 (and in some embodiments source line conductor decoders for block erase operations). Also, the memory device includes circuitry 5752 connected to the bit lines 5755 to apply bias voltages to the bit lines for memory operations. Also, in some embodiments, the circuitry 5752 can include circuits for applying bias voltages to the source line conductors described with reference to FIG. 54A. Circuitry 5752 can be configured to select memory cells and blocks of memory cells in the memory array for the purposes of reading, erasing and programming memory operations. Circuitry other than the memory array structures is referred to as peripheral circuitry. The peripheral circuitry can be configured for the virtual ground memory architecture, and includes circuits to operate at least some of the bit lines in the plurality of bit lines alternatively as a source side conductor and as a drain side conductor during memory operations. As mentioned above, the array 5760 can overlie some or all of the peripheral circuitry.

A bit line transistor BLT (also called pillar select transistors herein) and word line decoder 5763 is coupled to a plurality of word lines 5764 for reading, erasing and programming operations applied to memory cells in distinct subarrays as discussed above. Addresses are supplied on bus 5765 to the BLT and word line decoder 5763 and to the bit line decoder 5750. Sense amplifiers and data-in structures in block 5766 are coupled to the bit line decoder 5750 in this example via data bus 5767. Data is supplied via the data-in line 5771 from input/output ports on the integrated circuit 5700 or from other data sources internal or external to the integrated circuit 5700, to the data-in structures in block 5766.

In the illustrated embodiment, other circuitry 5774 is included on the integrated circuit, such as a general purpose processor or special purpose application circuitry, or a combination of modules providing system-on-a-chip functionality supported by the programmable resistance cell array. Data is supplied via the data-out line 5772 from the sense amplifiers in block 5766 to input/output ports on the integrated circuit 5700, or to other data destinations internal or external to the integrated circuit 5700.

A controller 5769 implemented for example using bias arrangement state machines configured for the read, erase and program memory operations controls the application of bias arrangement supply voltages generated or provided through the voltage supply or supplies in block 5768, such as program, erase and read voltages.

The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

The controller can include logic to control the read, program and erase operations, including the application of bias voltages as set out in the following tables. Table 1 includes bias voltages for 3D virtual ground arrays configured as shown in FIG. 55, discontinuous or continuous channel material in the vertical direction. Table 2 includes bias voltages for 3D virtual ground arrays configured as shown in FIG. 56, with continuous channel material in the vertical direction in the pillars.

TABLE 1

| Virtual Ground Array—FIG. 55 | select | unselect | remark |
|---|---|---|---|
| Read | | | |
| BLT | on | off | |
| WL | 2~4 V | off | |
| selected N+ drain | 1~3 V | floating | |
| selected N+ source | 0 V | floating | |
| unselected N+ | floating | floating | |
| program | | | |
| BLT | on | off | |
| WL | 8~13 V | off | hot carrier program |
| selected N+ drain | 3~7 V | floating | |
| selected N+ source | 0 V | floating | |
| unselected N+ | floating | floating | |
| erase | | | |
| BLT | on | off | |
| WL | −10 V~−15 V | negative −10 V~−15 V | -FN erase |
| selected N+ drain | 4~8 V | floating | |
| selected N+ source | floating | floating | |
| unselected N+ | floating | floating | |

TABLE 2

| Virtual Ground Array—FIG. 56 | select | unselect | remark |
|---|---|---|---|
| Read | | | |
| BLT | on | off | |
| WL | 2-4 V | off | |
| selected N+ drain | 1-3 V | floating | |
| selected N+ source | 0 V | floating | |
| unselected N+ | floating | floating | |
| P-type substrate | floating | floating | |
| program | | | |
| BLT | on | off | |
| WL | 8~13 V | off | hot carrier program |
| selected N+ drain | 3~7 V | floating | |
| selected N+ source | 0 V | floating | |
| unselected N+ | floating | floating | |
| P-type substate | floating | floating | |

TABLE 2-continued

| Virtual Ground Array—FIG. 56 | select | unselect | remark |
|---|---|---|---|
| erase | | | |
| BLT | floating | floating | |
| WL | 0 v | 0 v | |
| selected N+ drain | floating | floating | |
| selected N+ source | floating | floating | |
| unselected N+ | floating | floating | |
| P-type substate | 20 V | 20 V | substrate hole erase |

A number of flowcharts illustrating embodiments of manufacturing processes are described herein. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only some steps pertinent to an understanding of the technology, and it will be understood that numerous additional steps for accomplishing other functions can be performed before, after and between those shown.

Manufacturing methods described herein include examples of method of manufacturing a vertical memory structure, comprising:

forming block comprising a stack of alternating layers of insulator material and word line material;

forming a plurality of distinct series of alternating conductive pillars and insulating pillars through the stack, the conductive pillars in the plurality of distinct series being arranged in an array and in a plurality of distinct subarrays of the array, each distinct subarray including at least one distinct series in the plurality of series;

forming data storage structures disposed on inside surfaces of the layers of word line material at cross-points of the insulating pillars in the plurality of distinct series and the layers of word line material;

forming semiconductor channel material between the insulating pillars in the plurality of distinct series and the data storage structures at cross-points of the insulating pillars in the plurality of distinct series with the layers of word line material, the semiconductor channel material extending around outside surfaces of the insulating pillars in the plurality of distinct series and contacting adjacent conductive pillars on both sides the plurality of distinct series;

forming a plurality of conductive strips in a pillar select layer over the stack, including for each distinct subarray of the array, a corresponding conductive strip of the plurality of conductive strips, and including for each distinct subarray of the array a plurality of vertical channel structures through the corresponding conductive strip contacting respective conductive pillars in the distinct subarray; and forming a plurality of bit line conductors disposed over the pillar select layer over the stack, each bit line conductor having contacts to one vertical channel transistor in the plurality of vertical channel transistors in each of the distinct subarrays.

Examples of the methods of manufacturing are described wherein the semiconductor channel material is an arcuate layer along outside surfaces of the first insulating pillar.

Examples of the methods of manufacturing are described wherein forming the block includes forming a stack of alternating layers of sacrificial material and the insulator material, and replacing the sacrificial material with the word line material.

Examples of the methods of manufacturing are described wherein forming the block includes forming a stack of alternating layers of sacrificial material and the insulator material etching a plurality of first holes through the stack, lining the holes with material of the data storage structures, lining the material of the data storage structures with semiconductor channel material, and filling the holes with insulating material to form the insulating pillars; etching a plurality of second holes through the stack, and filling the holes with conductive material to form the conductive pillars; forming a sacrificial layer over the stack, separated by insulator material from the stack, and covered by insulator material; forming a plurality of third holes through the sacrificial layer over the stack aligned with the conductive pillars, and forming a layer of gate dielectric and a semiconductor channel structure in the plurality of third holes in current flow contact with the corresponding conductive pillars; etching slots through the stack and the sacrificial layer over the stack, the slots disposed between sets of conductive pillars having a number X members in the row direction and extending in the second direction across a number Y of rows in the plurality of rows, the slots exposing the sacrificial material in the stack; removing the sacrificial material exposed through the slots to form voids in place of the layers of sacrificial material in the stack and the layer of sacrificial material over the stack; and depositing word line material in the voids to form layers of word line material in the stack and a layer of conductive material over the stack. (use slots for gate replacement)

Examples of the methods of manufacturing are described wherein forming the block includes: forming a stack of alternating layers of sacrificial material and the insulator material; etching a plurality of first holes through the stack, lining the holes with material of the data storage structures, lining the material of the data storage structures with semiconductor channel material, and filling the holes with insulating material to form the insulating pillars; etching a plurality of second holes through the stack; removing the sacrificial material exposed through the second holes to form voids in place of the layers of sacrificial material in the stack; depositing word line material in the voids to form layers of word line material in the stack, and forming insulators on sidewalls of the layers of word line material exposed in the second holes; etching back insulating material in the second holes to expose the semiconductor channel material lining the insulating pillars in adjacent first holes; filling the re-opened second holes with conductive material to form the conductive pillars; forming a conductive layer over the stack, separated by insulating material from the stack, and covered by insulating material; forming a plurality of third holes through the conductive layer over the stack aligned with the conductive pillars, and forming a layer of gate dielectric and a semiconductor channel structure in the plurality of third holes in current flow contact with the corresponding conductive pillars; and etching the layer of conductive material over the stack to define the plurality of conductive strips.

Examples of the methods of manufacturing are described wherein forming the block includes: forming a stack of alternating layers of sacrificial material and the insulating material; etching a plurality of first holes through the stack; etching to recess exposed sidewalls of the layers of sacrificial material relative to exposed sidewalls of the layers of insulating material; and lining the recessed sidewalls in the recesses with material of the data storage structures, and lining the material of the data storage structures with semiconductor channel material, and filling the holes with insulating material to form the insulating pillars.

Examples of the methods of manufacturing are described including etching the semiconductor channel material in the holes before filling the holes, so that it is discontinuous between the layers of sacrificial material. Examples of the methods of manufacturing are described including etching a plurality of second holes through the stack, and filling the holes with conductive material to form the conductive pillars; forming a sacrificial layer over the stack, separated by insulating material from the stack, and covered by insulating material; forming a plurality of third holes through the sacrificial layer over the stack aligned with the conductive pillars, and forming a layer of gate dielectric and a semiconductor channel structure in the plurality of third holes in current flow contact with the corresponding conductive pillars; etching slots through the stack and the sacrificial layer over the stack, the slots disposed between sets of conductive pillars having a number X members in the row direction and extending in the second direction across a number Y of rows in the plurality of rows, the slots exposing the sacrificial material in the stack; removing the sacrificial material exposed through the slots to form voids in place of the layers of sacrificial material in the stack and the layer of sacrificial material over the stack; depositing word line material in the voids to form layers of word line material in the stack and a layer of conductive material over the stack; and etching the layer of conductive material over the stack to define the plurality of conductive strips.

Examples of the methods of manufacturing are described including: forming a conductive layer beneath the stack, wherein the conductive pillars in the plurality of distinct series of alternating conductive pillars and insulating pillars connect to the conductive layer through PN junctions.

Examples of the methods of manufacturing are described, including forming conductor filled slots in intervals along the plurality of series of alternating conductive pillars and insulating pillars, and extending through the stack to contact the conductive layer beneath the stack, the filled slots elongated in a direction orthogonal to the plurality of series of alternating conductive pillars and insulating pillars.

Examples of the methods of manufacturing are described wherein the conductive pillars comprise n-type semiconductor and the conductive layer beneath the stack comprises p-type semiconductor. Examples of the methods of manufacturing are described wherein the conductive pillars in the block are disposed in a plurality of rows extending in a row direction and columns extending in a column direction, the insulating pillars being disposed between adjacent conductive pillars in the rows, and the conductive strips are separated from adjacent conductive strips by etching slots in the layer of conductive material over the stack, between rows of conductive pillars to define the conductive strips. Examples of the methods of manufacturing are described, wherein the block including dummy rows of conductive pillars between the distinct subarrays, and the conductive strips are separated from adjacent conductive strips by etching slots in the layer of conductive material over the stack over the dummy rows of conductive pillars to define the conductive strips. Examples of the methods of manufacturing are described wherein the layers of word line material have side surfaces adjacent to the insulating pillars recessed relative side surfaces of adjacent layers insulating material forming recesses between the layers of insulating material, and wherein the semiconductor channel material and the data storage structures are disposed in the recesses.

Examples of the methods of manufacturing are described wherein the plurality of layers of word line material, the plurality of conductive strips and the plurality of bit lines are arranged in a virtual ground memory architecture.

Examples of the methods of manufacturing are described wherein the data storage structures comprise multilayer charge trapping structures.

Examples of the methods of manufacturing are described including forming a liner of a second insulator material on the layers of word line material in the stack, the second insulator material having a higher dielectric constant than the insulator material of the plurality of layers of insulator material in the stack.

A 3D memory structure is provided that is suitable of high density and high capacity storage. Features of embodiments of the structure include that the longitudinal axis of vertical conductor pillars used for source/drain contacts is aligned with the series of pillars, in the row direction. Embodiments include cuts between bit line select lines that are aligned over rows of dummy insulating and conductive pillars.

In embodiments of the vertical conductor pillars used for source/drain contacts are isolated from the word line material by High-K dielectric materials (dielectric constant K is greater than 7).

In embodiments, the channel is discontinuous along vertical axis, or Z-axis.

In embodiments, the width of vertical conductor pillars used for source/drain contacts in a direction orthogonal to the direction of the series, is less than the width of insulating pillars.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, where modifications and combinations will be within the spirit of the invention and the scope of the following claims.

What is claimed is:

1. A vertical memory structure, comprising:
    a stack of alternating layers of insulator material and word line material;
    a series of alternating conductive pillars and insulating pillars disposed through stack, the series including at least a first conductive pillar, a first insulating pillar adjacent to the first conductive pillar and a second conductive pillar adjacent to the first insulating pillar, wherein an outside surface of the first insulating pillar is arcuate in a plane parallel to the layers of word line material;
    data storage structures disposed on inside surfaces of the layers of word line material at cross-points of the first insulating pillar and the layers of word line material; and
    semiconductor channel material between the first insulating pillar and the data storage structures at cross-points of the first insulating pillar with the layers of word line material, the semiconductor channel material extending around an outside surface of the first insulating pillar and directly contacting the first conductive pillar and the second conductive pillar,
    wherein the series further includes:
        a second insulating pillar adjacent to the second conductive pillar and a third conductive pillar adjacent to the second insulating pillar;
        data storage structures disposed on inside surfaces of the layers of word line material at cross-points of the second insulating pillar and the layers of word line material; and
        semiconductor channel material between the second insulating pillar and the data storage structures at cross-points of the second insulating pillar with the layers of word line material, the semiconductor channel material extending around an outside surface of the second insulating pillar to directly contact the second conductive pillar and to directly contact the third conductive pillar.

2. The vertical memory structure of claim 1, wherein the inside surfaces of the layers of word line material adjacent to the first insulating pillar are recessed relative to inside surfaces of the layers insulating material adjacent to the first insulating pillar, forming recesses between the layers of insulating material, and wherein the semiconductor channel material and the data storage structures are disposed in the recesses.

3. The vertical memory structure of claim 2, wherein the semiconductor channel material disposed in the recesses is discontinuous in a vertical direction across the layers of insulating material.

4. The vertical memory structure of claim 1, including:
    a conductive strip overlying the stack;
    a plurality of vertical channel transistors through the conductive strip contacting respective conductive pillars in the series of alternating conductive pillars and insulating pillars; and
    a plurality of bit line conductors disposed in a layer over the vertical channel transistors, with contacts to respective vertical channel transistors in the plurality of vertical channel transistors.

5. The vertical memory structure of claim 1, including a plurality of series of alternating conductive pillars and insulating pillars disposed through stack, the conductive pillars in the plurality of series being arranged in an array, the plurality of series including the series.

6. The vertical memory structure of claim 5, wherein the plurality of series in the array are arranged in a plurality of distinct subarrays of the array, each distinct subarray including at least one series in the plurality of series, and further including:
    a plurality of conductive strips disposed in a pillar select layer over the stack, including for each distinct subarray of the array, a corresponding conductive strip of the plurality of conductive strips, and including for each distinct subarray of the array a plurality of vertical channel structures through the corresponding conductive strip contacting respective conductive pillars in the distinct subarrays; and
    a plurality of bit line conductors disposed over the pillar select layer over the stack, each bit line conductor having contacts to one vertical channel transistor in a plurality of vertical channel transistors in each of the distinct subarrays.

7. The vertical memory structure of claim 6, including:
    a conductive layer beneath the stack, wherein the conductive pillars in the plurality of series of alternating conductive pillars and insulating pillars connect to the conductive layer through a PN junction; and conductor filled slots disposed in intervals along the plurality of series of alternating conductive pillars and insulating pillars, and extending through the stack to contact the conductive layer beneath the stack, the filled slots elongated in a direction orthogonal to the plurality of series of alternating conductive pillars and insulating pillars.

8. The vertical memory structure of claim 7, wherein the conductive pillars comprise n-type semiconductor and the conductive layer beneath the stack comprises p-type semiconductor.

9. The vertical memory structure of claim 1, including a plurality of series of alternating conductive pillars and insulating pillars disposed through stack, the conductive pillars in the plurality of series being arranged in an array, the plurality of series including the series, wherein the plurality of series in the array are arranged in a plurality of distinct subarrays of the array, each distinct subarray including at least one series in the plurality of series, and further including:
- a plurality of conductive strips separated by gaps disposed in a pillar select layer over the stack, including for each distinct subarray of the array, a corresponding conductive strip of the plurality of conductive strips, and including for each distinct subarray of the array a plurality of vertical channel structures through the corresponding conductive strip contacting respective conductive pillars in the distinct subarrays;
- a plurality of alternating dummy conductive pillars and dummy insulating pillars disposed through the stack, arranged in lines aligned with the gaps separating the conductive strips in the plurality of conductive strips; and
- a plurality of bit line conductors disposed over the pillar select layer over the stack, each bit line conductor having contacts to one vertical channel transistor in a plurality of vertical channel transistors in each of the distinct subarrays.

10. The vertical memory structure of claim 9, wherein the plurality of alternating dummy conductive pillars and dummy insulating pillars and the plurality of series of alternating conductive pillars and insulating pillars are arranged in a regular array.

11. The vertical memory structure of claim 9, wherein the layers of word line material, the plurality of conductive strips and the plurality of bit line conductors are arranged in a virtual ground memory architecture.

12. The vertical memory structure of claim 1, wherein semiconductor channel material between the insulating pillars and the data storage structures is discontinuous between the layers of word line material in the stack.

13. A vertical memory structure, comprising:
- a stack of alternating layers of insulator material and word line material;
- a plurality of distinct series of alternating cylindrical conductive pillars and cylindrical insulating pillars disposed through the stack, the conductive pillars in the plurality of distinct series being arranged in an array and in a plurality of distinct subarrays of the array, each distinct subarray including at least one distinct series in the plurality of series, each distinct series in the plurality of distinct series including at least a first conductive pillar, a first insulating pillar adjacent to the first conductive pillar and a second conductive pillar adjacent to the first insulating pillar;
- data storage structures disposed on inside surfaces of the layers of word line material at cross-points of the insulating pillars in the plurality of distinct series and the layers of word line material;
- semiconductor channel material between the insulating pillars in the plurality of distinct series and the data storage structures at cross-points of the insulating pillars in the plurality of distinct series with the layers of word line material, the semiconductor channel material extending around outside surfaces of the insulating pillars in the plurality of distinct series and directly contacting adjacent conductive pillars on both sides the plurality of distinct series;
- a plurality of conductive strips disposed in a pillar select layer over the stack, including for each distinct subarray of the array, a corresponding conductive strip of the plurality of conductive strips, and including for each distinct subarray of the array a plurality of vertical channel structures through the corresponding conductive strip contacting respective conductive pillars in the distinct subarray; and
- a plurality of bit line conductors disposed over the pillar select layer over the stack, each bit line conductor having contacts to one vertical channel transistor in a plurality of vertical channel transistors in each of the distinct subarrays, wherein each distinct series further includes:
- a second insulating pillar adjacent to the second conductive pillar and a third conductive pillar adjacent to the second insulating pillar;
- data storage structures disposed on inside surfaces of the layers of word line material at cross-points of the second insulating pillar and the layers of word line material; and
- semiconductor channel material between the second insulating pillar and the data storage structures at cross-points of the second insulating pillar with the layers of word line material, the semiconductor channel material extending around an outside surface of the second insulating pillar to directly contact the second conductive pillar and to directly contact the third conductive pillar.

14. The vertical memory structure of claim 13, wherein the outside surfaces of the insulating pillars are arcuate in planes parallel to the layers of word line material.

15. The vertical memory structure of claim 13, wherein the inside surfaces of the layers of word line material adjacent to the insulating pillars are recessed relative to inside surfaces of the layers insulating material adjacent to the insulating pillars, forming recesses between the layers of insulating material, and wherein the semiconductor channel material and the data storage structures are disposed in the recesses.

16. The vertical memory structure of claim 15, wherein the semiconductor channel material disposed in the recesses is discontinuous in a vertical direction across the layers of insulating material.

17. The vertical memory structure of claim 13, including:
- a conductive layer beneath the stack, wherein the conductive pillars in the plurality of distinct series of alternating conductive pillars and insulating pillars connect to the conductive layer through a PN junction; and
- conductor filled slots disposed in intervals along the plurality of series of alternating conductive pillars and insulating pillars, and extending through the stack to contact the conductive layer beneath the stack, the filled slots elongated in a direction orthogonal to the plurality of series of alternating conductive pillars and insulating pillars.

18. The vertical memory structure of claim 17, wherein the conductive pillars comprise n-type semiconductor and the conductive layer beneath the stack comprises p-type semiconductor.

19. The vertical memory structure of claim 13, wherein the plurality of conductive strips are separated by gaps in the pillar select layer over the stack, and including:
 a plurality of alternating dummy conductive pillars and dummy insulating pillars disposed through the stack, arranged in lines aligned with the gaps separating the conductive strips in the plurality of conductive strips.

20. The vertical memory structure of claim 13, wherein the layers of word line material, the plurality of conductive strips and the plurality of bit line conductors are arranged in a virtual ground memory architecture, and including peripheral circuits to operate at least some bit lines in a plurality of bit lines alternatively as a source side conductor and as a drain side conductor during memory operations.

21. The vertical memory structure of claim 13, wherein semiconductor channel material between the insulating pillars and the data storage structures is discontinuous between the layers of word line material in the stack.

22. The vertical memory structure of claim 13, wherein a given distinct series in the plurality of distinct series includes a number N+1 conductive pillars, and the number N insulating pillars, whereby the given distinct series includes N stacks of memory cells.

23. The vertical memory structure of claim 1, wherein each of the first insulating pillar, the first conductive pillar and the second conductive pillar has a vertical axis that is aligned along a same horizontal direction.

\* \* \* \* \*